(12) United States Patent
Shim et al.

(10) Patent No.: US 11,189,760 B2
(45) Date of Patent: Nov. 30, 2021

(54) DISPLAY DEVICE

(71) Applicant: LG Display Co., Ltd., Seoul (KR)

(72) Inventors: Sungbin Shim, Paju-si (KR); Seogshin Kang, Paju-si (KR); Suhyeon Kim, Paju-si (KR); MoonBae Gee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 65 days.

(21) Appl. No.: 16/698,188

(22) Filed: Nov. 27, 2019

(65) Prior Publication Data
US 2020/0185573 A1    Jun. 11, 2020

(30) Foreign Application Priority Data

Dec. 7, 2018  (KR) .......... 10-2018-0157292
Dec. 7, 2018  (KR) .......... 10-2018-0157349

(51) Int. Cl.
*H01L 33/50* (2010.01)
*H01L 33/00* (2010.01)
*H01L 33/62* (2010.01)

(52) U.S. Cl.
CPC ........ *H01L 33/504* (2013.01); *H01L 33/0095* (2013.01); *H01L 33/62* (2013.01)

(58) Field of Classification Search
CPC .... H01L 33/504; H01L 33/0095; H01L 33/62
See application file for complete search history.

(56) References Cited

U.S. PATENT DOCUMENTS

| | | | |
|---|---|---|---|
| 2012/0154716 A1* | 6/2012 | Kaise | G02F 1/134336 349/85 |
| 2015/0208480 A1* | 7/2015 | Hosokawa | H01L 27/3209 315/294 |
| 2017/0352709 A1 | 12/2017 | Hack et al. | |
| 2019/0172898 A1* | 6/2019 | Choi | H01L 27/3258 |
| 2021/0005841 A1* | 1/2021 | Ohta | H01L 51/5246 |

FOREIGN PATENT DOCUMENTS

| | | |
|---|---|---|
| EP | 3 252 823 A1 | 12/2017 |
| KR | 10-2017-0137577 A | 12/2017 |
| WO | WO 2009/157496 A1 | 12/2009 |

* cited by examiner

*Primary Examiner* — Fernando L Toledo
*Assistant Examiner* — Neil R Prasad
(74) *Attorney, Agent, or Firm* — Birch, Stewart, Kolasch & Birch, LLP

(57) ABSTRACT

A display device that can reduce power consumption is provided. The display device can include a substrate provided with a first subpixel and a second subpixel, a first electrode provided on the substrate, a first light emitting layer provided on the first electrode and emitting light of a first color, a second electrode provided on the first light emitting layer, a second light emitting layer provided on the second electrode and emitting light of a second color, and a third electrode provided on the second light emitting layer. The second electrode is disconnected between the first subpixel and the second subpixel, and the second electrode of the first subpixel is electrically connected with the third electrode.

33 Claims, 48 Drawing Sheets

DISPLAY DEVICE

CROSS-REFERENCE TO RELATED APPLICATIONS

This application claims priority to Korean Patent Application No. 10-2018-0157349 filed on Dec. 7, 2018 in the Republic of Korea, and Korean Patent Application No. 10-2018-0157292 filed on Dec. 7, 2018 in the Republic of Korea, the entire contents of all these applications are hereby incorporated by reference into the present application.

BACKGROUND

Technical Field

The present disclosure relates to a display device displaying an image.

Description of the Related Art

With the advancement of the information age, a demand for a display device for displaying an image has increased with various forms. Therefore, various types of display devices such as a liquid crystal display (LCD) device, a plasma display panel (PDP), and an organic light emitting display (OLED) device have been recently used.

Recently, a head mounted display (HMD) that includes such a display device has been developed. The head mounted display (HMD) is a glasses type monitor device of virtual reality (VR) or augmented reality (AR), which forms a focal point on a close distance in front of eyes of a user who wears the HMD in glasses or helmet type.

The head mounted display has a difficulty in accurately forming and patterning a light emitting layer of different colors for each of subpixels due to a compact pixel interval of high resolution. To address this, the head mounted display forms a white light emitting layer of a plurality of stacks emitting light of different colors as a common layer, and a color filter can be arranged per subpixel to embody different colors. In this case, the head mounted display has an advantage in that it is not required to accurately manufacture a mask or perform an accurate mask alignment process but has a problem in that power consumption is increased due to the plurality of stacks.

BRIEF SUMMARY

The present disclosure has been made in view of the above problems and other limitations associated with the related art, and it is an object of the present disclosure to provide a display device that can reduce power consumption.

In accordance with an aspect of the present disclosure, the above and other objects can be accomplished by the provision of a display device comprising a substrate provided with a first subpixel and a second subpixel, a first electrode provided on the substrate, a first light emitting layer provided on the first electrode, emitting light of a first color, a second electrode provided on the first light emitting layer, a second light emitting layer provided on the second electrode, emitting light of a second color, and a third electrode provided on the second light emitting layer. The second electrode is disconnected between the first subpixel and the second subpixel, and the second electrode of the first subpixel is electrically connected with the third electrode.

According to the present disclosure, the first light emitting layer and the second light emitting layer are formed on the entire surface in the subpixels without a mask, whereby the problem according to the case that the light emitting layers different per subpixel are formed to be patterned using a mask can be solved. That is, the present disclosure does not require an accurate mask manufacturing process and or an accurate mask alignment process, and is applicable to a display device of high resolution having a compact pixel interval.

Also, in the present disclosure, although the first light emitting layer and the second light emitting layer are formed on the entire surface, any one of the first light emitting layer and the second light emitting layer can emit light in each of the subpixels. Therefore, in the present disclosure, power consumption can remarkably be reduced as compared with the case that all of the first and second light emitting layers emit light.

Also, in the present disclosure, the second electrodes are disconnected among the subpixels using the mask pattern, and the second electrode of each of the subpixels can be connected to any one of a first power line, a second power line and a second connection electrode. In the present disclosure, a separate mask is not required, and the mask pattern is formed simultaneously with the first electrode, whereby a separate process is not required additionally.

Also, in the present disclosure, the first electrode is not formed in some of the subpixels. Therefore, transmittance in the subpixel where the first electrode is not formed can be improved. Particularly, if the display device is provided in a bottom emission type, since light emitted from the light emitting layer may not pass through the first electrode, light efficiency can be improved.

Also, in the present disclosure, a bank is not formed in some of the subpixels. Therefore, the subpixel where the bank is not formed can have a large light emitting area, and an opening ratio can be maximized.

In addition to the effects of the present disclosure as mentioned above, additional objects and features of the present disclosure will be clearly understood by those skilled in the art from the following description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
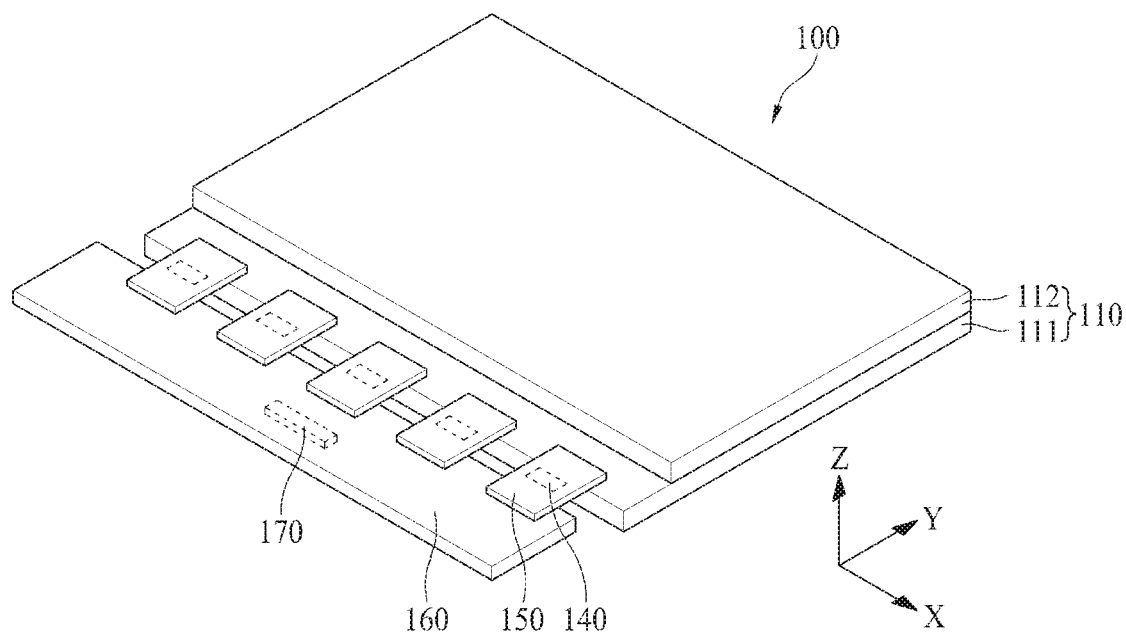
FIG. 1 is a perspective view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a position relationship, for example, when the position relationship is described as 'upon-', 'above-', 'below-', and 'next to-', one or more portions can be arranged between two other portions unless 'just' or 'direct' is used.

In describing a temporal relationship, for example, when the temporal order is described as "after," "subsequent," "next," and "before," a case which is not continuous can be included, unless "just" or "direct" is used.

It will be understood that, although the terms "first", "second", etc. can be used herein to describe various elements, these elements should not be limited by these terms. These terms are only used to partition one element from another. For example, a first element could be termed a second element, and, similarly, a second element could be termed a first element, without departing from the scope of the present disclosure.

Here, "X-axis direction", "Y-axis direction" and "Z-axis direction" should not be construed by a geometric relation only of a mutual vertical relation, and can have broader directionality within the range that elements of the present disclosure can act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, the preferred embodiments of the display device according to the present disclosure will be described in detail with reference to the accompanying drawings.

Figure 2:
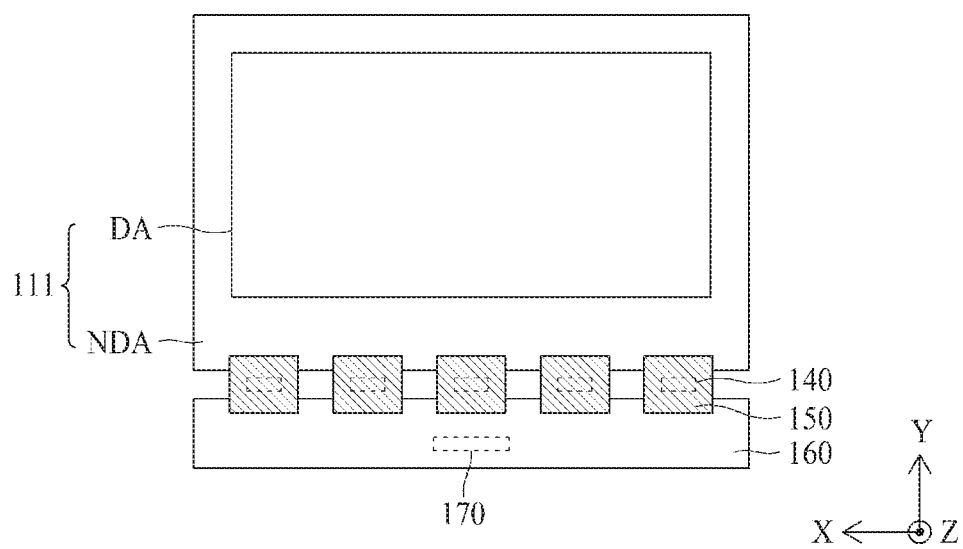
FIG. 2 is a plane view illustrating a first substrate, a source drive IC, a flexible film, a circuit board, and a timing controller of FIG. 1.

FIG. 1 is a perspective view illustrating a display device according to one embodiment of the present disclosure. FIG. 2 is a plane view illustrating a first substrate, a source drive IC, a flexible film, a circuit board, and a timing controller of FIG. 1. All the components of the display device according to all embodiments of the present disclosure are operatively coupled and configured.

Referring to FIGS. 1 and 2, a display device 100 according to one embodiment of the present disclosure includes a display panel 110, a source drive integrated circuit (source drive IC) 140, a flexible film 150, a circuit board 160, and a timing controller 170.

The display panel 110 includes a first substrate 111 and a second substrate 112. The second substrate 112 can be an encapsulation substrate. The first substrate 111 can be a plastic film, a glass substrate, or a silicon wafer substrate formed using a semiconductor process. The second substrate 112 can be a plastic film, a glass substrate, or an encapsulation film.

A plurality of gate lines, a plurality of data lines, and a plurality of subpixels are formed on one surface of the first substrate 111 facing the second substrate 112. The subpixels are provided in a plurality of areas defined by an intersection structure of the gate lines and the date lines.

Each of the subpixels can include a light emitting diode that includes a transistor, an anode electrode, a light emitting layer, and a cathode electrode. Each of the subpixels supplies a predetermined current to the light emitting diode in accordance with a data voltage of the data line if a gate signal from the gate line is s input thereto using the transistor. For this reason, a high potential voltage can be applied to the anode electrode, and a low potential voltage can be applied to the cathode electrode, whereby the light emitting layer of each of the subpixels can emit light at predetermined brightness in accordance with the predetermined current.

The display panel 110 can be divided into a display area DA where subpixels are formed to display an image, and a non-display area NDA that does not display an image. The gate lines, the data lines, and the pixels can be formed in the display area DA. A gate driver and pads can be formed in the non-display area NDA.

The gate driver sequentially supplies gate signals to the gate lines in accordance with to a gate control signal input from the timing controller 170. The gate driver can be formed in the non-display area NDA outside one side or both sides of the display area DA of the display panel 110 in a gate driver-in-panel (GIP) type. Alternatively, the gate driver can be manufactured as a driving chip, can be packaged in a flexible film, and can be attached to the non-display area NDA outside one side or both sides of the display area DA of the display panel 110 in a tape automated bonding (TAB) type.

The source drive IC 140 receives digital video data and a source control signal from the timing controller 170. The source driver IC 140 converts the digital video data into analog data voltages in accordance with the source control signal, and supplies the analog data voltages to the data lines. If the source drive IC 140 is manufactured as a driving chip, the source drive IC 140 can be packaged in the flexible film 150 in a chip-on-film (COF) type or a chip-on-plastic (COP) type.

A plurality of pads, such as data pads, can be formed in the non-display area NDA of the display panel 110. Lines connecting the pads with the source drive IC 140 and lines connecting the pads with lines of the circuit board 160 can be formed in the flexible film 150. The flexible film 150 can be attached onto the pads using an anisotropic conductive film, whereby the pads can be connected with the lines of the flexible film 150.

The circuit board 160 can be attached onto the flexible films 150. A plurality of circuits embodied as driving chips can be packaged in the circuit board 160. For example, the timing controller 170 can be packaged in the circuit board 160. The circuit board 160 can be a printed circuit board (PCB) or a flexible printed circuit board (FPCB).

The timing controller 170 receives the digital video data and a timing signal from an external system board through a cable of the circuit board 160. The timing controller 170 generates a gate control signal for controlling an operation timing of the gate driver and a source control signal for controlling the source drive ICs 140 based on the timing signal. The timing controller 170 supplies the gate control signal to the gate driver, and supplies the source control signal to the source drive ICs 140.

First Embodiment

Figure 3:
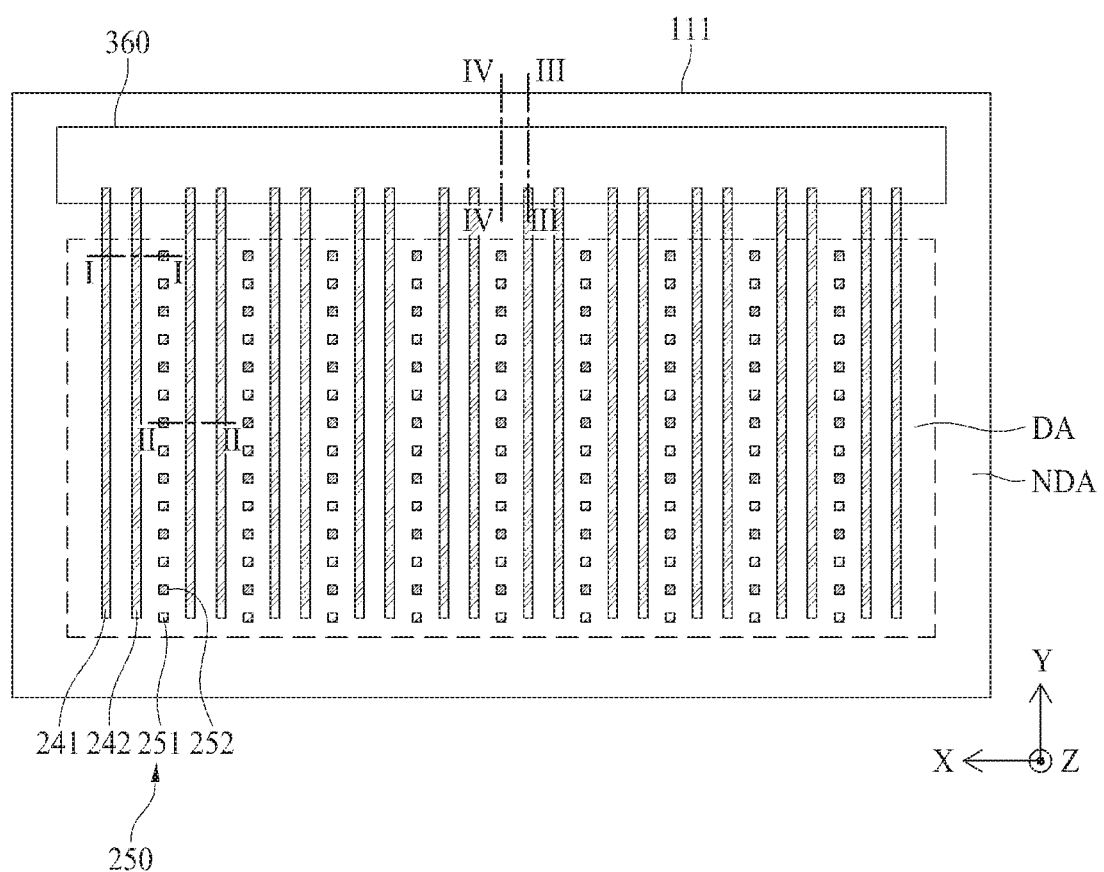
FIG. 3 is a plane view briefly illustrating a first substrate according to the first embodiment of the present disclosure.
Figure 4:
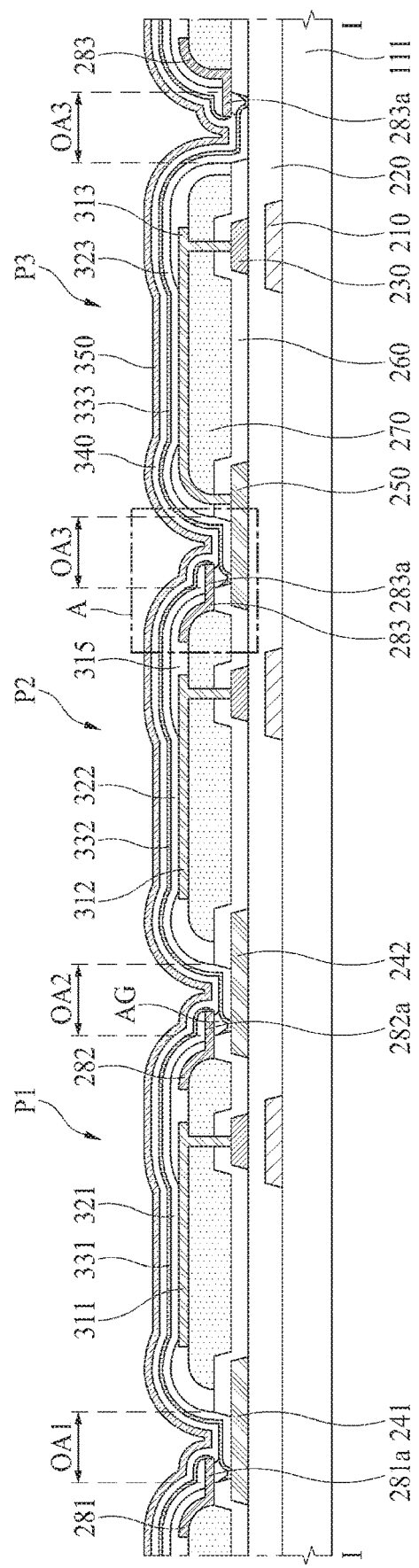
FIG. 4 is a cross-sectional view illustrating an example taken along line I-I of FIG. 3.
Figure 5:
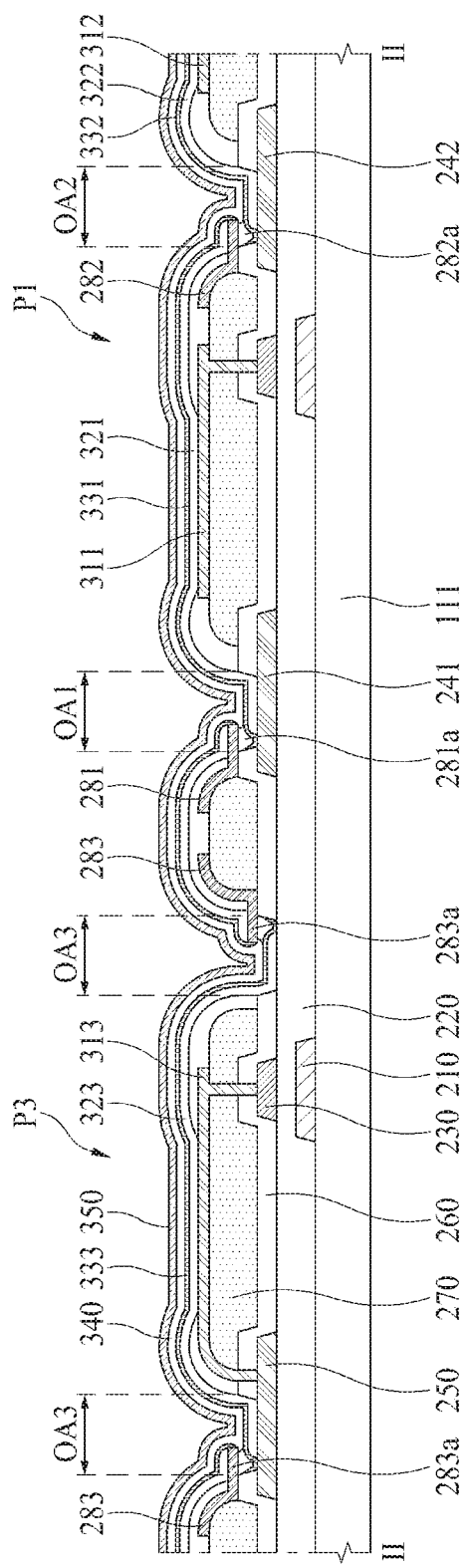
FIG. 5 is a cross-sectional view illustrating an example taken along line II-II of FIG. 3.
Figure 6:
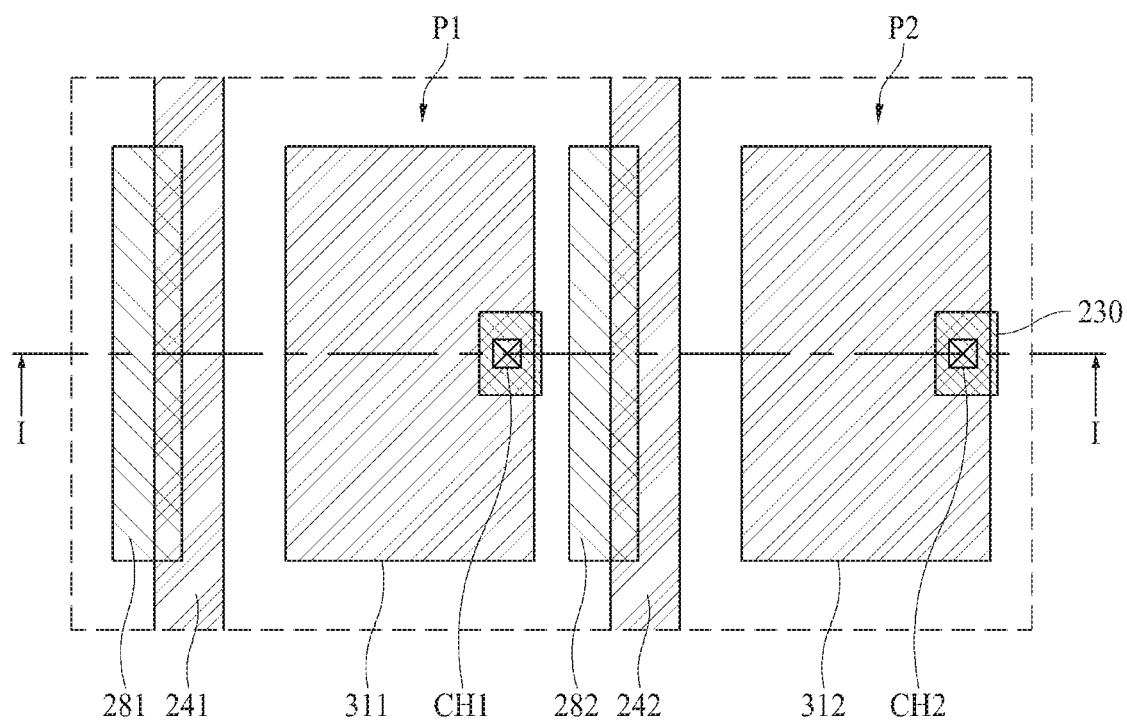
FIG. 6 is a plane view briefly illustrating an example of a first subpixel and a second subpixel.
Figure 7:
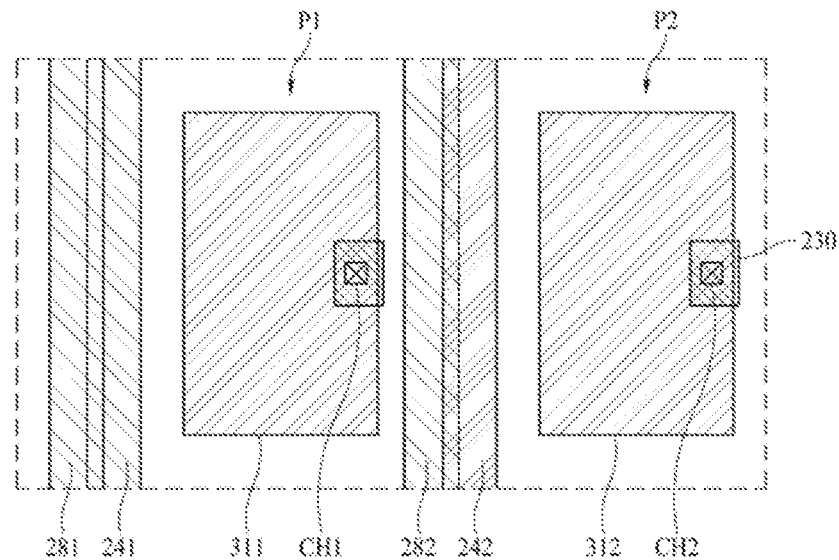
FIG. 7 is a plane view illustrating a modified example of FIG. 6.
Figure 8:
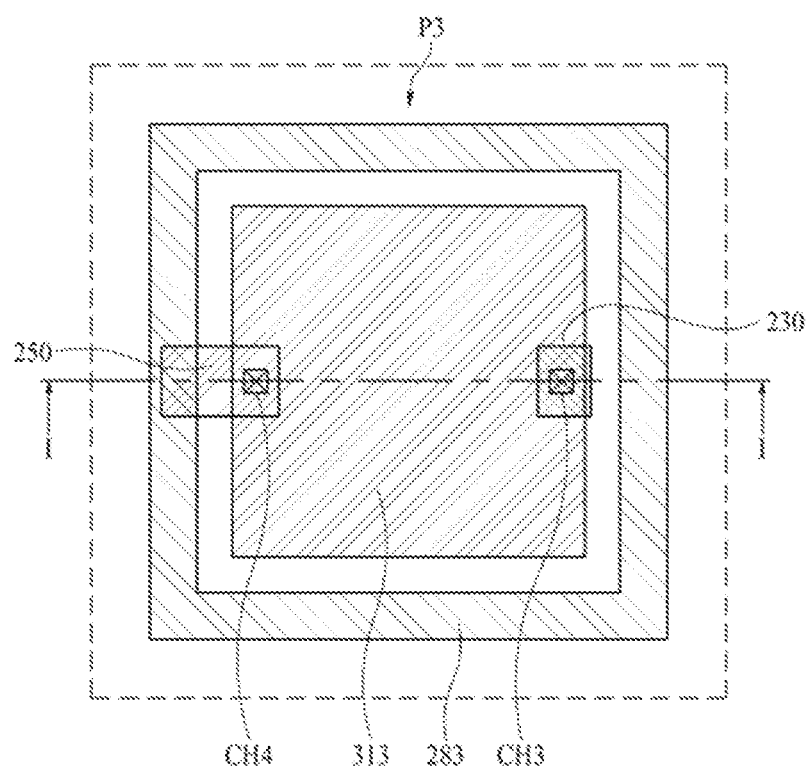
FIG. 8 is a plane view briefly illustrating an example of a third subpixel.
Figure 9:
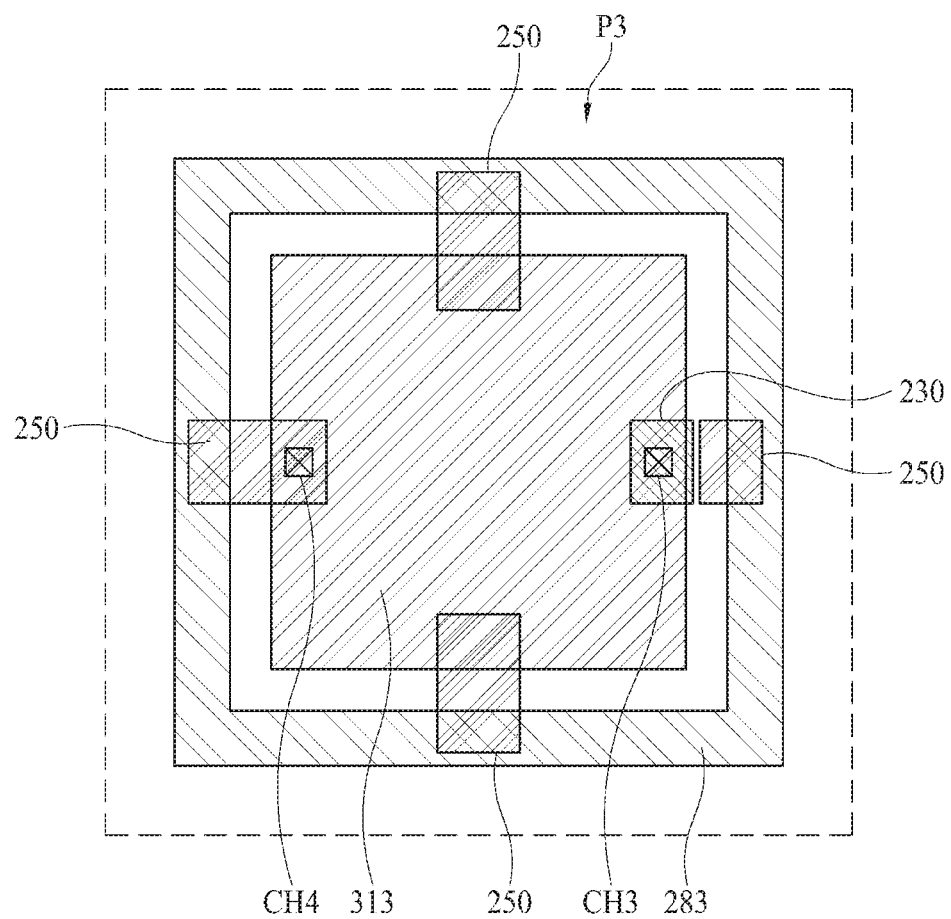
FIG. 9 is a plane view illustrating a modified example of FIG. 8.
Figure 10:
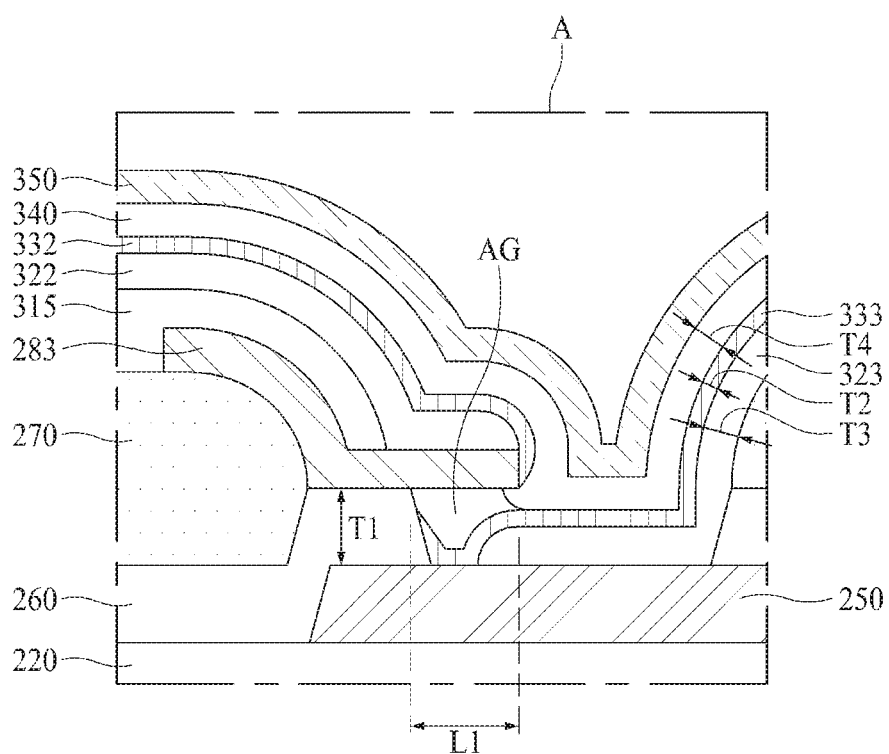
FIG. 10 is an enlarged view illustrating an example of an area A of FIG. 4.
Figure 11:
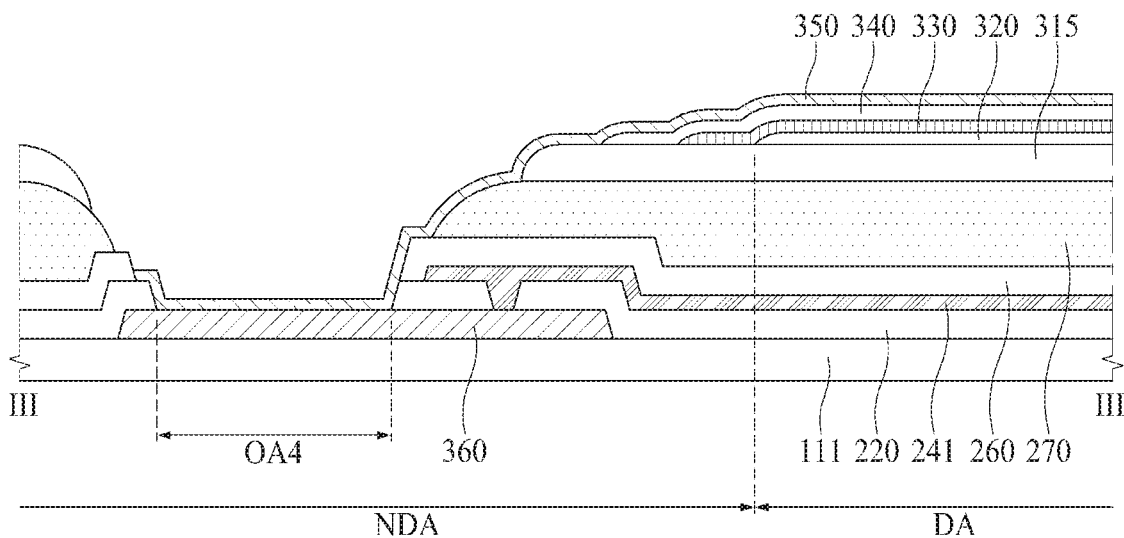
FIG. 11 is a cross-sectional view illustrating an example taken along line III-III of FIG. 3.
Figure 12:
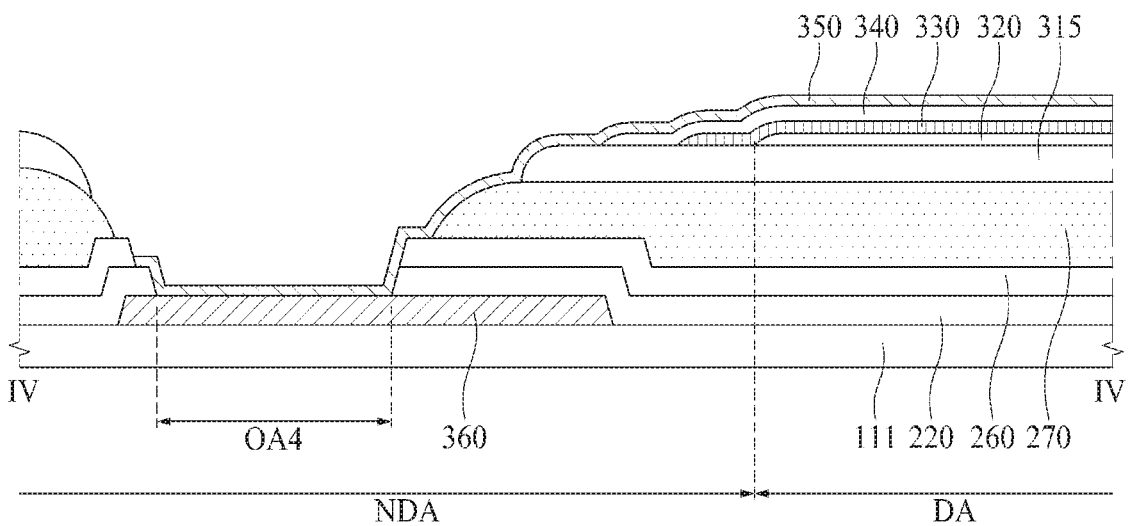
FIG. 12 is a cross-sectional view illustrating an example taken along line IV-IV of FIG. 3.

FIG. 3 is a plane view briefly illustrating a first substrate according to the first embodiment of the present disclosure, FIG. 4 is a cross-sectional view illustrating an example taken along line I-I of FIG. 3, FIG. 5 is a cross-sectional view illustrating an example taken along line II-II of FIG. 3, FIG. 6 is a plane view briefly illustrating an example of a first subpixel and a second subpixel, FIG. 7 is a plane view illustrating a modified example of FIG. 6, FIG. 8 is a plane view briefly illustrating an example of a third subpixel, FIG. 9 is a plane view illustrating a modified example of FIG. 8, FIG. 10 is an enlarged view illustrating an example of an area A of FIG. 4, FIG. 11 is a cross-sectional view illustrating an example taken along line III-III of FIG. 3, and FIG. 12 is a cross-sectional view illustrating an example taken along line IV-IV of FIG. 3.

Referring to FIGS. 3 to 12, the display panel 110 according to the first embodiment of the present disclosure comprises a first substrate 111, a light-shielding layer 210, a first insulating film 220, a driving transistor 230, first connection electrodes 241, 242 and 360, a second connection electrode 250, a second insulating film 260, a planarization film 270, mask patterns 281, 282 and 283, first electrodes 311, 312 and 313, a bank 315, first light emitting layers 321, 322 and 323, second electrodes 331, 332 and 333, a second light emitting layer 340, and a third electrode 350.

The first substrate 111 can be made of, but not limited to, glass or plastic. The first substrate 111 can be made of a semiconductor material such as silicon wafer. The first substrate 111 can be made of a transparent material or an opaque material.

The first substrate 111 is categorized into a display area DA and a non-display area NDA. A first subpixel P1, a second subpixel P2 and a third subpixel P3 can be provided on the display area DA of the first substrate 111. The first subpixel P1 can be provided to emit red light, the second subpixel P2 can be provided to emit green light, and the third subpixel P3 can be provided to emit blue light. However, these subpixels are not limited to this case. A fourth subpixel can further be provided on the display area DA of the substrate 111 to emit white (W) light. Also, an arrangement sequence of the subpixels P1, P2 and P3 can be changed in various ways.

The display device according to the first embodiment of the present disclosure can be provided in, but not limited to, a bottom emission type in which light is emitted downwardly. If the display device according to the first embodiment of the present disclosure is provided in a bottom emission type, a transparent material can be used as the first substrate 111. On the other hand, if the display device according to the first embodiment of the present disclosure is provided in a top emission type in which light is emitted upwardly, not only a transparent material but also an opaque material can be used as the first substrate 111.

A circuit diode which includes various signal lines, a driving transistor and a capacitor is provided on the first substrate 111 for each of the subpixels P1, P2 and P3. The signal lines can include a gate line, a data line, a power line, and a reference line.

The driving transistor 230 supplies a predetermined voltage to the first electrodes 311, 312 and 313 in accordance with the data voltage of the data line if the gate signal is input to the gate line. The driving transistor 230 includes an active layer, a gate electrode, a source electrode, and a drain electrode.

An active layer is provided on the first substrate 111. The active layer can be formed of a silicon based semiconductor material or an oxide based semiconductor material. A light-shielding layer 210 for shielding external light entering the active layer can be provided between the first substrate 111 and the active layer, as shown in FIG. 4. If the light-shielding layer 210 is formed of a metal material, a first insulating film 220 can be provided between the active layer and the light-shielding layer 210.

A gate insulating film can be provided on the active layer. The gate insulating film can be formed of an inorganic film, for example, a silicon oxide film, a silicon nitride film or a multi-layered film of the silicon oxide film and the silicon nitride film.

The gate electrode can be provided on the gate insulating film. The gate electrode can be formed of a single layer or multi-layer comprised of any one of Mo, Al, Cr, Au, Ti, Ni, Nd and Cu or their alloy.

An inter-layer dielectric film can be provided on the gate electrode. The inter-layer dielectric film can be formed of an inorganic film, for example, a silicon oxide film, a silicon nitride film, or a multi-layered film of the silicon oxide film and the silicon nitride film.

The source electrode and the drain electrode can be provided on the inter-layer dielectric film. Each of the source electrode and the drain electrode can be connected to the active layer through a contact hole that passes through the gate insulating film and the inter-layer dielectric film. Each of the source electrode and the drain electrode can be formed of, but not limited to, a single layer or multi-layer comprised of any one of Mo, Al, Cr, Au, Ti, Ni, Nd and Cu or their alloy.

The first connection electrodes 241, 242 and 360 and the second connection electrode 250 are provided on the first substrate 111.

The first connection electrodes 241, 242 and 360 electrically connect the second electrodes 331 and 332 and the third electrode 350 of the first subpixel P1 and the second subpixel P2 with each other. In more detail, the first connection electrodes 241, 242 and 360 can include a first power line 241, a second power line 242 and an auxiliary power line 360.

The auxiliary power line 360 is provided to be extended from the non-display area NDA to a first direction (e.g., X-axis direction). The auxiliary power line 360, as shown in FIGS. 11 and 12, can partially be exposed without being covered by the first insulating film 220, the second insulating film 260 and the planarization film 270, and can be connected with the third electrode 350 at the exposed area.

The auxiliary power line 360 can be formed of, but not limited to, the same material as that of the light-shielding layer 210 on the same layer as the light-shielding layer 210. The auxiliary power line 360 can be formed of the same material as that of any one of the active layer, the gate electrode, the source electrode and the drain electrode on the same layer as that of any one of them.

The first power line 241 is arranged at one side of the first subpixel P1 in the display area DA and then connected with the second electrode 331 of the first subpixel P1. Although the first power line 241 is arranged between the first subpixel P1 and the third subpixel P3 in FIGS. 4 to 7, the first power line 241 is not limited to the example of FIGS. 4 to 7. The first power line 241 can be arranged between the first subpixel P1 and the second subpixel P2.

The first power line 241 can be provided to be extended from the display area DA to a second direction (e.g., Y-axis direction). The plurality of first subpixels P1 can be arranged along the second direction in parallel with the first power line 241. In this case, the first power line 241 can be connected with the second electrode 331 of all of the first subpixels P1 arranged in parallel, or can be connected with the second electrode 331 of some of the first subpixels P1.

Meanwhile, the plurality of first subpixels P1 can be arranged along the second direction alternately with the plurality of second subpixels P2. In this case, the first power line 241 can be connected to the second electrode 331 of all of the plurality of first subpixels P1, or can be connected to the second electrode 331 of some of the plurality of first subpixels P1. Alternatively, the first power line 241 can be connected to the second electrodes 331 and 332 of all of the plurality of first subpixels P1 and the plurality of second subpixels P2, or can be connected to the second electrodes 331 and 332 of some of the plurality of first subpixels P1 and the plurality of second subpixels P2.

One end of the first power line 241 is connected to the auxiliary power line 360. The first power line 241 can be connected to, but not limited to, the auxiliary power line 360 through a contact hole as shown in FIG. 11.

The first power line 241 can be formed of the same material as that of any one of the active layer, the gate electrode, the source electrode and the drain electrode of the driving transistor 230 on the same layer as any one of them.

In accordance with the aforementioned description, the second electrode 331 and the third electrode 350 of the first subpixel P1 are electrically connected with each other through the first power line 241 and the auxiliary power line 360. That is, if a low potential voltage is applied to the third electrode 350, the same low potential voltage as the third electrode 350 is applied to the second electrode 331 of the first subpixel P1.

The second power line 242 is arranged at one side of the second subpixel P2 in the display area DA and then connected with the second electrode 332 of the second subpixel P2. Although the second power line 242 is arranged between the first subpixel P1 and the second subpixel P2 in FIGS. 4 to 7, the second power line 242 is not limited to the example of FIGS. 4 to 7. The second power line 242 can be arranged between the second subpixel P2 and the third subpixel P3.

The second power line 242 can be provided in the display area DA, and can be extended to the second direction (Y-axis direction). The plurality of second subpixels P2 can be arranged along the second direction in parallel with the second power line 242. In this case, the second power line 242 can be connected with the second electrode 332 of all of the second subpixels P2 arranged in parallel, or can be connected with the second electrode 332 of some of the plurality of second subpixels P2.

Meanwhile, the plurality of second subpixels P2 can be arranged along the second direction alternately with the plurality of first subpixels P1. In this case, the second power line 242 can be connected to the second electrode 332 of all of the plurality of second subpixels P2, or can be connected to the second electrode 332 of some of the plurality of second subpixels P2. Alternatively, the second power line 242 can be connected to the second electrodes 331 and 332 of all of the plurality of first subpixels P1 and the plurality of second subpixels P2, or can be connected to the second electrodes 331 and 332 of some of the plurality of first subpixels P1 and the plurality of second subpixels P2.

One end of the second power line 242 is connected to the auxiliary power line 360. The second power line 242 can be connected to, but not limited to, the auxiliary power line 360 through a contact hole as shown in FIG. 11.

The second power line 242 can be formed of the same material as that of any one of the active layer, the gate electrode, the source electrode and the drain electrode of the driving transistor 230 on the same layer as any one of them.

In accordance with the aforementioned description, the second electrode 332 and the third electrode 350 of the second subpixel P2 are electrically connected with each other through the second power line 242 and the auxiliary power line 360. That is, if a low potential voltage is applied to the third electrode 350, the same low potential voltage as the third electrode 350 is applied to the second electrode 332 of the second subpixel P2.

The second connection electrode 250 electrically connects the first electrode 313 of the third subpixel P3 with the second electrode 333 of the third subpixel P3.

The second connection electrode 250 is arranged at one side of the third subpixel P3 in the display area DA and connected with the first electrode 313 of the third subpixel P3 and the second electrode 333 of the third subpixel P3.

Although FIGS. 4, 5 and 8 illustrate that the second connection electrode 250 is arranged between the second subpixel P2 and the third subpixel P3, the second connection electrode 250 is not limited to the examples of FIGS. 4, 5 and 8. The second connection electrode 250 can be arranged between the third subpixel P3 and the first subpixel P1.

Also, although FIGS. 4, 5 and 8 illustrate that the second connection electrode 250 is only arranged at one side of the third subpixel P3, the second connection electrode 250 is not limited to the examples of FIGS. 4, 5 and 8. The second connection electrode 250 can be arranged at a plurality of sides of the third subpixel P3. For example, if the third subpixel P3 includes four sides on a plane, the second connection electrode 250 can be arranged on all of the four sides of the third subpixel P3 as shown in FIG. 9. That is, the second connection electrode 250 can be arranged on at least one of the four sides of the third subpixel P3.

The second connection electrode 250 can be patterned to correspond to each of the plurality of third subpixels P3. At this time, the second connection electrodes 250 provided to correspond to each of the plurality of third subpixels P3 are spaced apart from each other so as not to be electrically connected with each other as shown in FIG. 3. One third subpixel P3 can be connected with one second connection electrode 251, and the other one third subpixel P3 can be connected with the other one second connection electrode 252. At this time, one second connection electrode 251 and the other one second connection electrode 252 can be patterned and spaced apart from each other so as not to be electrically connected with each other.

The second connection electrode 250 can be formed of the same material as that of any one of the active layer, the gate electrode, the source electrode and the drain electrode of the driving transistor 230 on the same layer as any one of them.

In accordance with the aforementioned description, the first electrode 313 and the second electrode 333 of the third subpixel P3 are electrically connected with each other through the second connection electrode 250. That is, if a third high potential voltage is applied to the first electrode 313 of the third subpixel P3, the same high potential voltage as the first electrode 313 of the third subpixel P3 is applied to the second electrode 333 of the third subpixel P3.

The second insulating film 260 is provided on the driving transistor 230, the first connection electrodes 241, 242 and 360 and the second connection electrode 250 to protect the driving transistor 230. The second insulating film 260 covers the driving transistor 230 and at the same time partially exposes the first connection electrodes 241, 242 and 360 and the second connection electrode 250.

In more detail, the second insulating film 260 includes opening areas OA1, OA2, OA3 and OA4 that partially expose the first connection electrodes 241, 242 and 360 and the second connection electrode 250.

The second insulating film 260 can include a first opening area OA1 for partially exposing the first power line 241 as shown in FIGS. 4 and 5. The first opening area OA1 can be provided along the first power line 241. At this time, the first opening area OA1 can be provided on one first power line 241 in one or a plurality of patterns having a predetermined length on one first power line 241 along the second direction (Y-axis direction).

Also, the second insulating film 260 can include a second opening area OA2 for partially exposing the second power line 242 as shown in FIGS. 4 and 5. The second opening area OA2 can be provided along the second power line 242. At this time, the second opening area OA2 can be provided on one second power line 242 in one or a plurality of patterns having a predetermined length along the second direction (Y-axis direction).

Also, the second insulating film 260 can include a third opening area OA3 for partially exposing the second connection electrode 250 as shown in FIGS. 4 and 5. The third opening area OA3 can be provided to surround the third subpixel P3. Therefore, the third opening area OA3 partially exposes the second connection electrode 250 in an area where the second connection electrode 250 is provided, and exposes the first insulating film 220 in an area where the second connection electrode 250 is not provided.

Also, the second insulating film 260 can include a fourth opening area OA4 for partially exposing the auxiliary power line 360 as shown in FIGS. 11 and 12. The auxiliary power line 360 is partially exposed by the first insulating film 220, and the fourth opening area OA4 can be provided on the exposed auxiliary power line 360.

The second insulating film 260 can be formed of an inorganic film, for example, a silicon oxide film, a silicon nitride film or a multi-layered film of the silicon oxide film and the silicon nitride film.

The planarization film 270 is provided on the second insulating film 260 to planarize a step difference due to the driving transistor 230. At this time, the planarization film 270 is not provided on the opening areas OA1, OA2, OA3 and OA4 of the second insulating film 260. Therefore, the first connection electrodes 241, 242 and 360 and the second connection electrode 250 can partially still be exposed.

The planarization film 270 can have a formation area smaller than the second insulating film 260. Therefore, the planarization film 270 can partially expose the second insulating film 260. At this time, the second insulating film 260 can be exposed in an area adjacent to the opening areas OA1, OA2, OA3 and OA4 without being covered by the planarization film 270.

The planarization film 270 can be formed of an organic film such as acrylic resin, epoxy resin, phenolic resin, polyamide resin, and polyimide resin.

The first electrodes 311, 312 and 313 are provided to be patterned on the planarization film 270 for each of the subpixels P1, P2 and P3. One first electrode 311 is provided on the first subpixel P1, another first electrode 312 is provided on the second subpixel P2, and the other first electrode 313 is provided on the third subpixel P3.

The first electrodes 311, 312 and 313 are connected to the source electrode or the drain electrode of the driving transistor 230 through contact holes CH1, CH2 and CH3 that pass through the second insulating film 260 and the planarization film 270. The first electrode 311 of the first subpixel P1 is connected to the source electrode or the drain electrode of the driving transistor 230 through the contact hole CH1, whereby a first high potential voltage is applied to the first electrode 311 of the first subpixel P1. The first electrode 312 of the second subpixel P2 is connected to the source electrode or the drain electrode of the driving transistor 230 through the contact hole CH2, whereby a second high potential voltage is applied to the first electrode 312 of the second subpixel P2. The first electrode 313 of the third subpixel P3 is connected to the source electrode or the drain electrode of the driving transistor 230 through the contact hole CH3, whereby a third high potential voltage is applied to the first electrode 313 of the third subpixel P3.

Meanwhile, the first electrode 313 of the third subpixel P3 is connected to the second connection electrode 250 through a contact hole CH4 that passes through the second insulating film 260.

The first electrodes 311, 312 and 313 can be formed of a transparent metal material, a semi-transmissive metal material, or a metal material with high reflexibility. If the display device 100 is formed in a bottom emission type, the first electrodes 311, 312 and 313 can be formed of a transparent conductive material (TCO) such as ITO and IZO, which can transmit light, or a semi-transmissive conductive material such as Mg, Ag, or an alloy of Mg and Ag. If the display device 100 is formed in a top emission type, the first electrodes 311, 312 and 313 can be formed of a metal material with high reflexibility such as a deposited structure (Ti/Al/Ti) of Al and Ti, a deposited structure (ITO/Al/ITO) of Al and ITO, an Ag alloy, and a deposited structure (ITO/Ag alloy/ITO) of Ag alloy and ITO. The Ag alloy can be an alloy of Ag, Pd and Cu. The first electrodes 311, 312 and 313 can be anode electrodes.

The mask patterns 281, 282 and 283 are provided on the second insulating film 260 to partially cover the opening areas OA1, OA2 and OA3 of the second insulating film 260. The mask patterns 281, 282 and 283 include a first mask pattern 281, a second mask pattern 282, and a third mask pattern 283.

The first mask pattern 281 includes a protrusion 281a provided on the second insulating film 260 exposed without being covered by the planarization film 270 and protruded to partially cover the first opening area OA1 that partially exposes the first power line 241. At this time, the protrusion 281a of the first mask pattern 281 is spaced apart from the first power line 241 to form a space with the first power line 241.

The first mask pattern 281 is provided to be close to the subpixel arranged to adjoin the first subpixel P1 by interposing the first opening area OA1. The first opening area OA1 for exposing the first power line 241 can be arranged, but not limited, between the first subpixel P1 and the third subpixel P3.

If the first opening area OA1 of the second insulating film 260 is arranged between the third subpixel P3 and the first subpixel P1, the first mask pattern 281 can be protruded such that the protrusion 281a is headed for the first opening area OA1 from the third subpixel P3. Therefore, a partial area of the first opening area OA1, which is adjacent to the third subpixel P3, is covered by the first mask pattern 281, and the first power line 241 is also covered by the first mask pattern 281. The other area of the first opening area OA1, which is adjacent to the first subpixel P1, still exposes the first power line 241.

The first mask pattern 281 can be provided along the first power line 241 in the same manner as the first opening area OA1. At this time, the first mask pattern 281 can be provided on one first power line 241 in a plurality of patterns having a predetermined length along a second direction (e.g., Y-axis direction) as shown in FIG. 6. However, the first mask pattern 281 is not limited to the example of FIG. 6. The first mask pattern 281 can be provided on one first power line 241 in one line pattern extended in the second direction (Y-axis direction) as shown in FIG. 7.

Meanwhile, the first mask pattern 281 can be formed of, but not limited to, the same material as that of the first electrodes 311, 312 and 313 on the same layer as the first electrodes 311, 312 and 313.

As shown in FIGS. 4 and 5, the first mask pattern 281 can be formed of the same material as that of the first electrodes 311, 312 and 313 on the same layer as the first electrodes 311, 312 and 313. At this time, the first mask pattern 281 can be spaced apart from the first electrodes 311, 312 and 313.

If the first opening area OA1 of the second insulating film 260 is arranged between the third subpixel P3 and the first subpixel P1, the first mask pattern 281 is spaced apart from the first electrode 313 of the third subpixel P3 such that it is not electrically connected with the first electrode 313 of the third subpixel P3. The first mask pattern 281 can be provided on the planarization film 270 as well as the second insulating film 260 exposed without being covered by the planarization film 270.

In this case, in the display device 100, the first mask pattern 281 is formed of the same material as that of the first electrodes 311, 312 and 313 on the same layer as the first electrodes 311, 312 and 313. As a result, the first mask pattern 261 is formed without adding a separate process.

However, without limitation to this case, the first mask pattern 281 can be provided on a layer different from the first electrodes 311, 312 and 313. The first mask pattern 281 can be provided between the second insulating film 260 and the planarization film 270.

The second mask pattern 282 includes a protrusion 282a provided on the second insulating film 260 exposed without being covered by the planarization film 270 and protruded to partially cover the second opening area OA2 for partially exposing the second power line 242. At this time, the protrusion 282a of the second mask pattern 282 is spaced apart from the second power line 242 to form a space with the second power line 242.

The second mask pattern 282 is provided to be close to the subpixel arranged to adjoin the second subpixel P2 by interposing the second opening area OA2. The second opening area OA2 for exposing the second power line 242 can be arranged, but not limited, between the first subpixel P1 and the second subpixel P2.

If the second opening area OA2 of the second insulating film 260 is arranged between the first subpixel P1 and the second subpixel P2, the second mask pattern 282 can be protruded such that the protrusion 282a is headed for the second opening area OA2 from the first subpixel P1. Therefore, a partial area of the second opening area OA2, which is adjacent to the first subpixel P1, is covered by the second mask pattern 282, and the second power line 242 is also covered by the second mask pattern 282. The other area of the second opening area OA2, which is adjacent to the second subpixel P2, still exposes the second power line 242.

The second mask pattern 282 can be provided along the second power line 242 in the same manner as the second opening area OA2. At this time, the second mask pattern 282 can be provided on one second power line 242 in a plurality of patterns having a predetermined length along a second direction (Y-axis direction) as shown in FIG. 6. However, the second mask pattern 282 is not limited to the example of FIG. 6. The second mask pattern 282 can be provided on one second power line 242 in one line pattern extended in the second direction (Y-axis direction) as shown in FIG. 7.

Meanwhile, the second mask pattern 282 can be formed of, but not limited to, the same material as that of the first electrodes 311, 312 and 313 on the same layer as the first electrodes 311, 312 and 313.

As shown in FIGS. 4 and 5, the second mask pattern 282 can be formed of the same material as that of the first electrodes 311, 312 and 313 on the same layer as the first electrodes 311, 312 and 313. At this time, the second mask pattern 282 can be spaced apart from the first electrodes 311, 312 and 313.

If the second opening area OA2 of the second insulating film 260 is arranged between the first subpixel P1 and the second subpixel P2, the second mask pattern 282 is spaced apart from the first electrode 311 of the first subpixel P1 such that it is not electrically connected with the first electrode 311 of the first subpixel P1. The second mask pattern 282 can be provided on the planarization film 270 as well as the second insulating film 260 exposed without being covered by the planarization film 270.

In this case, in the display device 100, the second mask pattern 282 is formed of the same material as that of the first electrodes 311, 312 and 313 on the same layer as the first electrodes 311, 312 and 313. As a result, the second mask pattern 282 is formed without adding a separate process.

However, without limitation to this case, the second mask pattern 282 can be provided on a layer different from the first electrodes 311, 312 and 313. The second mask pattern 282 can be provided between the second insulating film 260 and the planarization film 270.

The third mask pattern 283 includes a protrusion 283a provided on the second insulating film 260 exposed without being covered by the planarization film 270 and protruded to partially cover the third opening area OA3 for partially exposing the second connection electrode 250. At this time, the protrusion 283a of the third mask pattern 283 is spaced apart from the second connection electrode 250 to form a space with the second connection electrode 250.

The third mask pattern 283 is provided to be close to the subpixel arranged to adjoin the third subpixel P3 by interposing the third opening area OA3. The third opening area OA3 for exposing the second connection electrode 250 mad be arranged, but not limited, between the first subpixel P1 and the third subpixel P3 and between the second subpixel P2 and the third subpixel P3.

If the third opening area OA3 of the second insulating film 260 is arranged between the first subpixel P1 and the third subpixel P3, the third mask pattern 283 can be protruded such that the protrusion 283a is headed for the third opening area OA3 from the first subpixel P1. Therefore, a partial area of the third opening area OA3, which is adjacent to the first subpixel P1, is covered by the third mask pattern 283, and the second connection electrode 250 or the first insulating film 220 is also covered by the third mask pattern 283. The other area of the third opening area OA3, which is adjacent to the third subpixel P3, still exposes the second connection electrode 250 or the first insulating film 220.

Also, if the third opening area OA3 of the second insulating film 260 is arranged between the second subpixel P2 and the third subpixel P3, the third mask pattern 283 can be protruded such that the protrusion 283a is headed for the third opening area OA3 from the second subpixel P2. Therefore, a partial area of the third opening area OA3, which is adjacent to the second subpixel P2, is covered by the third mask pattern 283, and the second connection electrode 250 or the first insulating film 220 is also covered by the third mask pattern 283. The other area of the third opening area OA3, which is adjacent to the third subpixel P3, still exposes the second connection electrode 250 or the first insulating film 220.

The third mask pattern 283 can be provided to surround the third subpixel P3 in the same manner as the third opening area OA3 as shown in FIGS. 8 and 9. The second electrode 333 of the third subpixel P3 can be disconnected from the second electrode 331 of the first subpixel P1 and the second electrode 332 of the second subpixel P2 by the third mask pattern 283. In the display device according to the first embodiment of the present disclosure, the third mask pattern 283 is provided to surround the third subpixel P3 such that the second electrode 333 of the third subpixel P3 does not electrically connect the second electrode 331 of the first subpixel P1 with the second electrode 332 of the second subpixel P2.

Meanwhile, the third mask pattern 283 can be formed of, but not limited to, the same material as that of the first electrodes 311, 312 and 313 on the same layer as the first electrodes 311, 312 and 313.

As shown in FIGS. 4 and 5, the third mask pattern 283 can be formed of the same material as that of the first electrodes 311, 312 and 313 on the same layer as the first electrodes 311, 312 and 313. At this time, the third mask pattern 283 can be spaced apart from the first electrodes 311, 312 and 313.

If the third opening area OA3 of the second insulating film 260 is arranged between the first subpixel P1 and the third subpixel P3, the third mask pattern 283 is spaced apart from the first electrode 311 of the first subpixel P1 such that it is not electrically connected with the first electrode 311 of the first subpixel P1. The third mask pattern 283 can be provided on the planarization film 270 as well as the second insulating film 260 exposed without being covered by the planarization film 270.

Also, if the third opening area OA3 of the second insulating film 260 is arranged between the second subpixel P2 and the third subpixel P3, the third mask pattern 283 is spaced apart from the second electrode 312 of the second subpixel P2 such that it is not electrically connected with the second electrode 312 of the second subpixel P2. The third mask pattern 283 can be provided on the planarization film 270 as well as the second insulating film 260 exposed without being covered by the planarization film 270.

In this case, in the display device, the third mask pattern 283 is formed of the same material as that of the first electrodes 311, 312 and 313 on the same layer as the first electrodes 311, 312 and 313. As a result, the third mask pattern 283 is formed without adding a separate process.

However, without limitation to this case, the third mask pattern 283 can be provided on a layer different from the first electrodes 311, 312 and 313. The third mask pattern 283 can be provided between the second insulating film 260 and the planarization film 270.

The bank 315 can be provided on the planarization film 270 to cover ends of the first electrodes 311, 312 and 313. Therefore, a problem that light emission efficiency is deteriorated due to a current concentrated on the ends of the first electrodes 311, 312 and 313 can be avoided.

Meanwhile, the bank 315 is not provided on the opening areas OA1, OA2, OA3 and OA4 of the second insulating film 260. Therefore, the first connection electrodes 241, 242 and 360 and the second connection electrode 250 can partially still be exposed.

Also, the bank 315 can be provided on the mask patterns 281, 282 and 283. At this time, the bank 315 can be provided such that the protrusions 281a, 282a and 283a of the mask patterns 281, 282 and 283 can be exposed without being covered.

If the bank 315 is provided to cover the protrusions 281a, 282a and 283a of the mask patterns 281, 282 and 283, the first light emitting layers 321, 322 and 323 of the subpixels P1, P2 and P3 can be connected with one another without being disconnected from one another. Also, the second electrodes 331, 332 and 333 of the subpixels P1, P2 and P3 can be connected with one another without being disconnected from one another. Therefore, problems can occur in that the second electrode 331 of the first subpixel P1 is not connected to the first power line 241, the second electrode 332 of the second subpixel P2 is not connected to the second power line 242, and the second electrode 333 of the third subpixel P3 is not connected to the second connection electrode 250.

In the display device according to the first embodiment of the present disclosure, the bank 315 should be provided to expose the protrusions 281a, 282a and 283a of the mask patterns 281, 282 and 283 without covering them so as not to cause the problems.

The bank 315 defines a light emitting area in each of the plurality of subpixels P1, P2 and P3. That is, an exposed area of each of the first electrodes 311, 312 and 313, where the bank 315 is not provided in each of the subpixels P1, P2 and P3, becomes a light emitting area. Although the bank 315 can be made of a relatively thin inorganic insulating film, the bank 315 can be made of a relatively thick organic insulating film.

The first light emitting layers 321, 322 and 323 are provided on the first electrodes 311, 312 and 313. The first light emitting layers 321, 322 and 323 can be provided on the bank 315. The first light emitting layers 321, 322 and 323 can include a hole transporting layer, a light emitting layer, and an electron transporting layer. In this case, holes and electrons of the first light emitting layers 321, 322 and 323 respectively move to the light emitting layer through the hole transporting layer and the electron transporting layer, and are combined with each other in the light emitting layer to emit light of a predetermined color.

Each of the first light emitting layers 321, 322 and 323 can be any one of, but not limited to, a red light emitting layer for emitting red light, a green light emitting layer for emitting green light, a blue light emitting layer for emitting blue light, and a yellow light emitting layer for emitting yellow light.

The first light emitting layers 321, 322 and 323 are disconnected among the first subpixel P1, the second subpixel P2 and the third subpixel P3. The mask patterns 281, 282 and 283 are provided among the first subpixel P1, the second subpixel P2 and the third subpixel P3. The first light emitting layers 321, 322 and 323 can be disconnected from one another by the mask patterns 281, 282 and 283.

In more detail, the first light emitting layers 321, 322 and 323 can be disconnected between the first subpixel SP1 and the second subpixel SP2 by the second mask pattern 282. If the first light emitting layers 321, 322 and 323 are deposited on the entire surface without a mask, the first light emitting layer 321 deposited on the first subpixel P1 can be disconnected on the protrusion 282a of the second mask pattern 282 due to a step difference between the protrusion 282a of the second mask pattern 282 and the second power line 242 as shown in FIGS. 4 and 10. The first light emitting layer 322 deposited on the second subpixel P2 can enter a space between the protrusion 282a of the second mask pattern 282 and the second power line 242 and then can be provided below the protrusion 282a of the second mask pattern 282 as shown in FIGS. 4 and 10.

In the display device according to the first embodiment of the present disclosure, it is preferable that the first light emitting layer 321 of the first subpixel P1 and the first light emitting layer 322 of the second subpixel P2 are disconnected from each other without being in contact with each other. For this reason, if the second electrodes 331, 332 and 333 are entirely deposited on the first light emitting layers 321, 322 and 323, it is possible to make sure of a space where the second electrode 332 deposited on the second subpixel P2 can enter between the protrusion 282a of the second mask pattern 282 and the first light emitting layer 322 of the second subpixel P2.

Also, the first light emitting layers 321, 322 and 323 can be disconnected between the second subpixel P2 and the third subpixel P3 by the third mask pattern 283. If the first light emitting layers 321, 322 and 323 are deposited on the entire surface without a mask, the first light emitting layer 322 deposited on the second subpixel P2 can be disconnected on the protrusion 283a of the third mask pattern 283 due to a step difference between the protrusion 283a of the third mask pattern 283 and the second connection electrode 250 as shown in FIGS. 4 and 10. The first light emitting layer 323 deposited on the third subpixel P3 can enter a space between the protrusion 283a of the third mask pattern 283 and the second connection electrode 250 and then can be provided below the protrusion 283a of the third mask pattern 283 as shown in FIGS. 4 and 10.

In the display device according to the first embodiment of the present disclosure, it is preferable that the first light emitting layer 322 of the second subpixel P2 and the first light emitting layer 323 of the third subpixel P3 are disconnected from each other without being in contact with each other. For this reason, if the second electrodes 331, 332 and 333 are entirely deposited on the first light emitting layers 321, 322 and 323, it is possible to make sure of a space where the second electrode 333 deposited on the third subpixel P3 can enter between the protrusion 283a of the third mask pattern 283 and the first light emitting layer 323 of the third subpixel P3.

Also, the first light emitting layers 321, 322 and 323 can be disconnected between the first subpixel P1 and the third subpixel P3 by the third mask pattern 283 and the first mask pattern 281. The third mask pattern 283 and the first mask pattern 281 can be provided to be spaced apart from each other between the first subpixel P1 and the third subpixel P3 as shown in FIG. 5. At this time, the first mask pattern 281 includes a protrusion 281a protruded from the third subpixel P3 in a direction of the first subpixel P1, covering a portion of the first opening area OA1. The third mask pattern 283 includes a protrusion 283a protruded from the first subpixel P1 in a direction of the third subpixel P3, covering a portion of the third opening area OA3.

If the first light emitting layers 321, 322 and 323 are deposited on the entire surface without a mask, the first light emitting layer 323 deposited on the third subpixel P3 can enter a space between the protrusion 283a of the third mask pattern 283 and the first insulating film 220 and then can be provided below the protrusion 283a of the third mask pattern 283 as shown in FIGS. 5 and 10. The first light emitting layer 321 deposited on the first subpixel P1 can enter a space between the protrusion 281a of the first mask pattern 281 and the first power line 241 and then can be provided below the protrusion 281a of the first mask pattern 281 as shown in FIGS. 5 and 10.

The second electrodes 331, 332 and 333 are provided on the first light emitting layers 321, 322 and 323. The second electrodes 331, 332 and 333 are disconnected among the first subpixel P1, the second subpixel P2 and the third subpixel P3. The mask patterns 281, 282 and 283 are provided among the first subpixel P1, the second subpixel P2 and the third subpixel P3. The first light emitting layers 321, 322 and 323 can be disconnected from one another by the mask patterns 281, 282 and 283.

In more detail, the second electrodes 331, 332 and 333 can be disconnected between the first subpixel SP1 and the second subpixel SP2 by the second mask pattern 282. If the second electrodes 331, 332 and 333 are deposited on the entire surface, the second electrode 331 deposited on the first subpixel P1 can be disconnected on the protrusion 282a of the second mask pattern 282 due to a step difference between the protrusion 282a of the second mask pattern 282 and the second power line 242 as shown in FIGS. 4 and 10.

The second electrode 332 deposited on the second subpixel P2 can enter a space between the protrusion 282a of the second mask pattern 282 and the first light emitting layer 322 and then can be provided below the protrusion 282a of the second mask pattern 282 as shown in FIGS. 4 and 10. At this time, the second electrode 332 of the second subpixel P2 can be deposited below the protrusion 282a of the second mask pattern 282 at an area wider than the first light emitting layer 322. Therefore, the second electrode 332 of the second subpixel P2 can be connected to the second power line 242.

Since the second electrode 332 of the second subpixel P2 is connected to the second power line 242, the second electrode 332 and the third electrode 350 can electrically be connected with each other through the second power line 242 and the auxiliary power line 360. For this reason, if a low potential voltage is applied to the third electrode 350, the same low potential voltage as the third electrode 350 can be applied to the second electrode 332 of the second subpixel P2. At this time, the second electrode 332 of the second subpixel P2 can be a cathode electrode.

Although FIGS. 4 and 10 illustrate that the second electrode 331 of the first subpixel P1 and the second electrode 332 of the second subpixel P2 are disconnected from each other without being in contact with each other, the present disclosure is not limited to the examples of FIGS. 4 and 10. The second electrodes 331 and 332 of the first subpixel P1 and the second subpixel P2 are all cathode electrodes, and a common voltage can be applied thereto. The second electrodes 331 and 332 of the first subpixel P1 and the second subpixel P2 can be provided to be in contact with each other and then electrically be connected with each other.

Also, the second electrodes 331, 332 and 333 can be disconnected between the second subpixel P2 and the third subpixel P3 by the third mask pattern 283. If the second electrodes 331, 332 and 333 are deposited on the entire surface, the second electrode 332 deposited on the second subpixel P2 can be disconnected on the protrusion 283a of the third mask pattern 283 due to a step difference between the protrusion 283a of the third mask pattern 283 and the first light emitting layer 323 as shown in FIGS. 4 and 10.

The second electrode 333 deposited on the third subpixel P3 can enter a space between the protrusion 283a of the third mask pattern 283 and the first light emitting layer 323 and then can be provided below the protrusion 283a of the third mask pattern 283 as shown in FIGS. 4 and 10. At this time, the second electrode 333 of the third subpixel P3 can be deposited below the protrusion 283a of the third mask pattern 283 at an area wider than the first light emitting layer 323. Therefore, the second electrode 333 of the third subpixel P3 can be connected to the second connection electrode 250.

Since the second electrode 333 of the third subpixel P3 is connected to the second connection electrode 250, the second electrode 333 and the first electrode 313 can electrically be connected with each other through the second connection electrode 250. For this reason, if a third high potential voltage is applied to the first electrode 313, the same third high potential voltage as the first electrode 313 can be applied to the second electrode 333 of the third subpixel P3. At this time, the second electrode 333 of the third subpixel P3 can be an anode electrode.

In the display device according to the first embodiment of the present disclosure, it is preferable that the second electrode 332 of the second subpixel P2 and the second electrode 333 of the third subpixel P3 are disconnected from each other without being in contact with each other. As described above, the second electrode 332 of the second subpixel P2 is a cathode electrode, and the second electrode 333 of the third subpixel P3 is an anode electrode. In this case, if the second electrode 332 of the second subpixel P2 and the second electrode 333 of the third subpixel P3 are in contact with each other, short occurs between the second electrode 332 of the second subpixel P2 and the second electrode 333 of the third subpixel P3, whereby the display device is not driven normally.

Also, the second electrodes 331, 332 and 333 can be disconnected between the first subpixel P1 and the third subpixel P3 by the third mask pattern 283 and the first mask pattern 281.

If the second electrodes 331, 332 and 333 are deposited on the entire surface, the second electrode 333 can enter a space between the protrusion 283a of the third mask pattern 283 and the first light emitting layer 323 and then can be provided below the protrusion 283a of the third mask pattern 283 as shown in FIGS. 5 and 10.

At this time, the second electrode 333 of the third subpixel P3 can be deposited below the protrusion 283a of the third mask pattern 283 at an area wider than the first light emitting layer 323. Although FIG. 5 illustrates that the second connection electrode 250 is not provided between the first subpixel P1 and the third subpixel P3, the present disclosure is not limited to the example of FIG. 5. The second connection electrode 250 can be provided between the first subpixel P1 and the third subpixel P3 as shown in FIG. 9. In this case, the second electrode 333 of the third subpixel P3 can be connected to the second connection electrode 250 between the first subpixel P1 and the third subpixel P3.

The second electrode 331 deposited on the first subpixel P1 can enter a space between the protrusion 281a of the first mask pattern 281 and the first light emitting layer 321 and then can be provided below the protrusion 281a of the first mask pattern 281 as shown in FIGS. 5 and 10.

At this time, the second electrode 331 of the first subpixel P1 can be deposited below the protrusion 281*a* of the first mask pattern 281 at an area wider than the first light emitting layer 321. Therefore, the second electrode 331 of the first subpixel P1 can be connected to the first power line 241.

Since the second electrode 331 of the first subpixel P1 is connected to the first power line 241, the second electrode 331 and the third electrode 350 can electrically be connected with each other through the first power line 241 and the auxiliary power line 360. For this reason, if a low potential voltage is applied to the third electrode 350, the same low potential voltage as the third electrode 350 can be applied to the second electrode 331 of the first subpixel P1. At this time, the second electrode 331 of the first subpixel P1 can be a cathode electrode.

The second electrodes 331, 332 and 333 can be formed of a transparent conductive material (TCO) such as ITO and IZO, which can transmit light, or a semi-transmissive conductive material such as Mg, Ag, or an alloy of Mg and Ag.

The second light emitting layer 340 is provided on the second electrodes 331, 332 and 333. The second light emitting layer 340 can include a hole transporting layer, a light emitting layer, and an electron transporting layer. In this case, holes and electrons of the second light emitting layer 340 respectively move to the light emitting layer through the hole transporting layer and the electron transporting layer, and are combined with each other in the light emitting layer to emit light of a predetermined color.

The second light emitting layer 340 can be any one of, but not limited to, a red light emitting layer for emitting red light, a green light emitting layer for emitting green light, a blue light emitting layer for emitting blue light, and a yellow light emitting layer for emitting yellow light.

However, the second light emitting layer 340 can emit light of a color different from those of the first light emitting layers 321, 322 and 323. If the first light emitting layers 321, 322 and 323 are light emitting layers for emitting light of a first color, the second light emitting layer 340 can be a light emitting layer for emitting light of a second color different from the first color. For example, the first light emitting layers 321, 322 and 323 can be yellow light emitting layers for emitting yellow light, and the second light emitting layer 340 can be a blue light emitting layer for emitting blue light.

Unlike the first light emitting layers 321, 322 and 323, the second light emitting layer 340 is connected among the first subpixel P1, the second subpixel P2 and the third subpixel P3. The second light emitting layer 340 can be formed to partially fill the spaces between the mask patterns 281, 282 and 283 and the second electrodes 331, 332 and 333. At this time, an air gap AG can be formed in a space where the second light emitting layer 340 is not filled between the mask patterns 281, 282 and 283 and the second electrodes 331, 332 and 333.

The third electrode 350 is provided on the second light emitting layer 340. The third electrode 350 can be formed of a transparent metal material, a semi-transmissive metal material, or a metal material with high reflexibility. If the display device 100 is formed in a bottom emission type, the third electrode 350 can be formed of a metal material with high reflexibility such as a deposited structure (Ti/Al/Ti) of Al and Ti, a deposited structure (ITO/Al/ITO) of Al and ITO, an Ag alloy, and a deposited structure (ITO/Ag alloy/ITO) of Ag alloy and ITO. The Ag alloy can be an alloy of Ag, Pd and Cu. If the display device 100 is formed in a top emission type, the third electrode 350 can be formed of a transparent conductive material (TCO) such as ITO and IZO, which can transmit light, or a semi-transmissive conductive material such as Mg, Ag, or an alloy of Mg and Ag. The third electrode 350 can be a cathode electrode.

The display device according to the first embodiment of the present disclosure is characterized in that one of the first light emitting layers 321, 322 and 323 and the second light emitting layer 340 from each of the first subpixels P1, P2 and P3 emits light.

In more detail, the first light emitting layer 321 of the first subpixel P1 emits light. Since the second electrode 331 of the first subpixel P1 is connected to the first power line 241, the second electrode 331 and the second electrode 350 are electrically connected with each other through the first power line 241 and the auxiliary power line 360. If a low potential voltage is applied to the third electrode 350, the same low potential voltage as the third electrode 350 is applied to the second electrode 331 of the first subpixel P1. Therefore, the second light emitting layer 340 provided between the second electrode 331 and the third electrode 350 of the first subpixel P1 does not emit light.

Meanwhile, in the first subpixel P1, if a first high potential voltage is applied to the first electrode 311 and a low potential voltage is applied to the second electrode 331, the first light emitting layer 321 provided between the first electrode 311 and the second electrode 331 emits light with predetermined brightness in accordance with a predetermined current.

In the second subpixel P2, the first light emitting layer 322 emits light. Since the second electrode 332 of the second subpixel P2 is connected to the second power line 242, the second electrode 332 and the third electrode 350 are electrically connected with each other through the second power line 242 and the auxiliary power line 360. If the low potential voltage is applied to the third electrode 350, the same low potential voltage as the second electrode 350 is applied to the second electrode 332 of the second subpixel P2. Therefore, the second light emitting layer 340 provided between the second electrode 332 and the third electrode 350 of the second subpixel P2 does not emit light.

Meanwhile, in the second subpixel P2, if a second high potential voltage is applied to the first electrode 312 and a low potential voltage is applied to the second electrode 332, the first light emitting layer 322 provided between the first electrode 312 and the second electrode 332 emits light with predetermined brightness in accordance with a predetermined current.

That is, in the first subpixel P1 and the second subpixel P2, the first light emitting layers 321 and 322 emit light of the same color. The display device according to the first embodiment of the present disclosure can further comprise a color filter to emit light of different colors from the first subpixel P1 and the second subpixel P2.

The color filter can include a first color filter arranged to correspond to the first subpixel P1 and a second color filter arranged to correspond to the second subpixel P2. The first color filter and the second color filter can transmit light of different colors.

For example, the first light emitting layers 321, 322 and 323 can be yellow light emitting layers for emitting yellow light. The first color filter can be a red color filter for transmitting red light, and the second color filter can be a green color filter for transmitting green light. Therefore, the first subpixel P1 can emit red light, and the second subpixel P2 can emit green light.

The color filter can be arranged below the first electrodes 311, 312 and 313 or on the third electrode 350 in accordance with a light emission type of the display device 100. If the display device 100 is a bottom emission type, the color filter can be provided below the first electrodes 311, 312 and 313. If the display device 100 is a top emission type, the color filter can be provided on the third electrode 350.

In the third subpixel P3, the second light emitting layer 340 emits light. Since the second electrode 333 of the third subpixel P3 is connected to the second connection electrode 250, the first electrode 313 and the second electrode 333 are electrically connected with each other through the second connection electrode 250. If a third high potential voltage is applied to the first electrode 313, the same third high potential voltage as the first electrode 313 is applied to the second electrode 333 of the third subpixel P3. Therefore, the first light emitting layer 323 provided between the first electrode 313 and the second electrode 333 of the third subpixel P3 does not emit light.

Meanwhile, in the third subpixel P3, if a third high potential voltage is applied to the second electrode 333 and a low potential voltage is applied to the third electrode 350, the second light emitting layer 340 provided between the second electrode 333 and the third electrode 350 emits light with predetermined brightness in accordance with a predetermined current.

For example, the third subpixel P3 can be a blue light emitting layer for emitting blue light. In this case, the display device 100 can embody a blue subpixel without providing a separate color filter in a position corresponding to the third subpixel P3.

As described above, in the display device 100 according to the first embodiment of the present disclosure, only the first light emitting layers 321, 322 and 323 emit light in the first subpixel P1 and the second subpixel P2, and only the second light emitting layer 340 can emit in the third subpixel P3. For this reason, in the display device 100 according to the first embodiment of the present disclosure, power consumption can remarkably be reduced as compared with the case that all of the first light emitting layers 321, 322 and 323 and the second light emitting layer 340 emit light in all the subpixels.

Also, in the display device 100 according to the first embodiment of the present disclosure, the first light emitting layers 321, 322 and 323 and the second light emitting layer 340 are provided on the entire surface of the subpixels P1, P2 and P3 without a mask. Therefore, in the display device 100 according to the first embodiment of the present disclosure, a problem according to the case that different light emitting layers are provided to be patterned for each of the subpixels P1, P2 and P3 using a mask can be solved.

Also, in the display device 100 according to the first embodiment of the present disclosure, the second electrodes 331, 332 and 333 can be disconnected among the subpixels P1, P2 and P3 by the mask patterns 281, 282 and 283. In the display device 100 according to the first embodiment of the present disclosure, the mask patterns 281, 282 and 283 are provided, and the first light emitting layers 321, 322 and 323 and the second electrodes 331, 332 and 333 are provided on the entire surface of the first substrate 111, on which the mask patterns 281, 282 and 283 are provided, without a mask. The first light emitting layers 321, 322 and 323 and the second electrodes 331, 332 and 333 are disconnected among the subpixels P1, P2 and P3 by the mask patterns 281, 282 and 283. Particularly, the second electrodes 331, 332 and 333 are connected to any one of the first power line 241, the second power line 242 and the second connection electrode 250 below the protrusions 281a, 282a and 283a of the mask patterns 281, 282 and 283.

Referring to FIG. 10, in the display device 100 according to the first embodiment of the present disclosure, a thickness T1 of the second insulating film 260 can be designed such that the second electrodes 331, 332 and 333 are disconnected among the subpixels P1, P2 and P3 and the second light emitting layer 340 is connected without being disconnected among the subpixels P1, P2 and P3. At this time, the thickness T1 of the second insulating film 260 can correspond to a spaced distance between the protrusions 281a, 282a and 283a of the mask patterns 281, 282 and 283 and any one of the first power line 241, the second power line 242 and the second connection electrode 250.

The thickness T1 of the second insulating film 260 can be designed to be greater than a sum of a thickness T3 of the first light emitting layers 321, 322 and 323 and a thickness T2 of the second electrodes 331, 332 and 333. Therefore, in the display device 100 according to the first embodiment of the present disclosure, the second electrodes 331, 332 and 333 can be prevented from being connected with one another among the subpixels P1, P2 and P3.

The thickness T1 of the second insulating film 260 can be designed to be smaller than a sum of the thickness T3 of the second electrodes 331, 332 and 333 and a thickness T3 of the second light emitting layer 340. Therefore, in the display device 100 according to the first embodiment of the present disclosure, the second light emitting layer 340 can be prevented from being disconnected among the subpixels P1, P2 and P3.

Meanwhile, in the display device 100 according to the first embodiment of the present disclosure, a length L1 of the protrusions 281a, 282a and 283a of the mask patterns 281, 282 and 283 can properly be designed. If the length L1 of the protrusions 281a, 282a and 283a of the mask patterns 281, 282 and 283 becomes too long, the protrusions 281a, 282a and 283a of the mask patterns 281, 282 and 283 can sag down due to a weight. In this case, a space enough to form the first light emitting layers 321, 322 and 323 and the second electrodes 331, 332 and 333 below the protrusions 281a, 282a and 283a of the mask patterns 281, 282 and 283 may not be ensured.

Meanwhile, in the display device 100 according to the first embodiment of the present disclosure, if the length L1 of the protrusions 281a, 282a and 283a of the mask patterns 281, 282 and 283 becomes too short, a contact area between the second electrodes 331, 332 and 333 and any one of the first power line 241, the second power line 242 and the second connection electrode 250 can be reduced. In this case, resistance between the second electrodes 331, 332 and 333 and any one of the first power line 241, the second power line 242 and the second connection electrode 250 can be increased.

Second Embodiment

Figure 13:
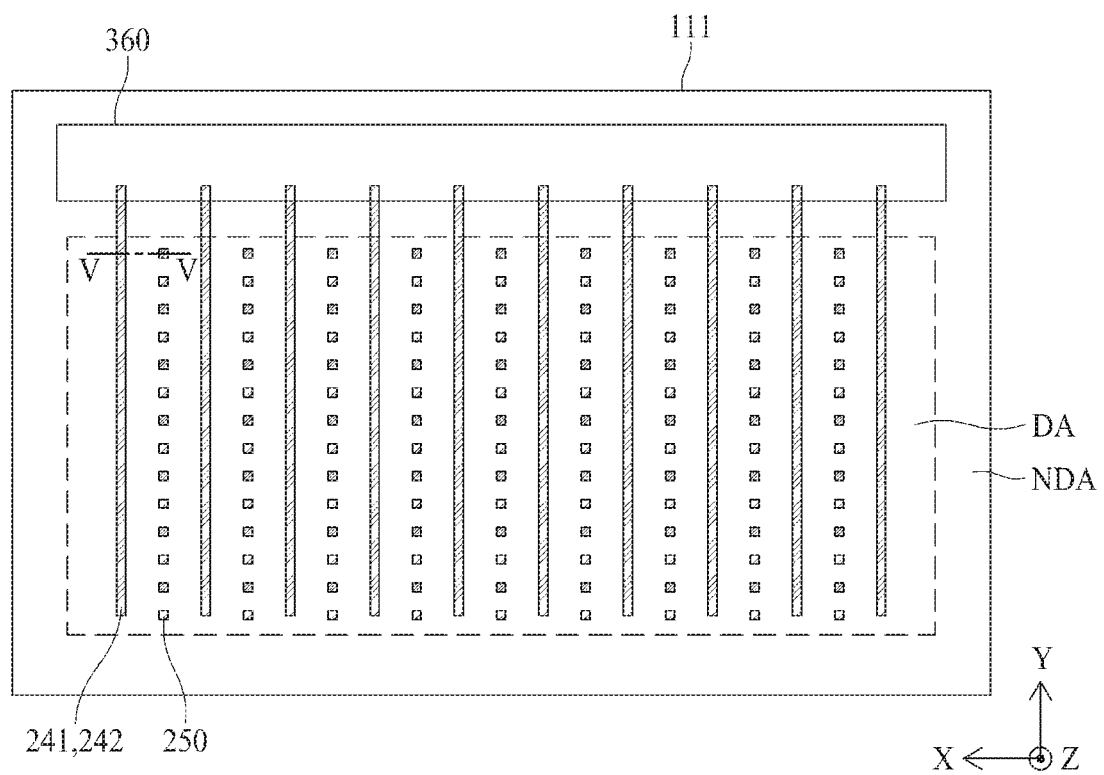
FIG. 13 is a plane view briefly illustrating a first substrate according to the second embodiment of the present disclosure.
Figure 14:
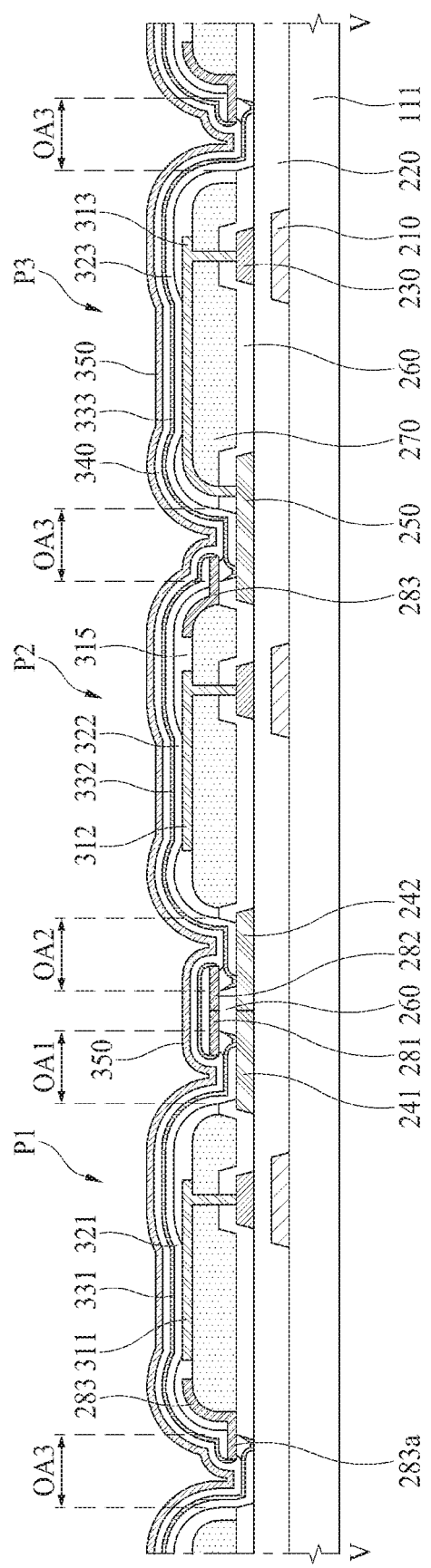
FIG. 14 is a cross-sectional view illustrating an example taken along line V-V of FIG. 13.
Figure 15:
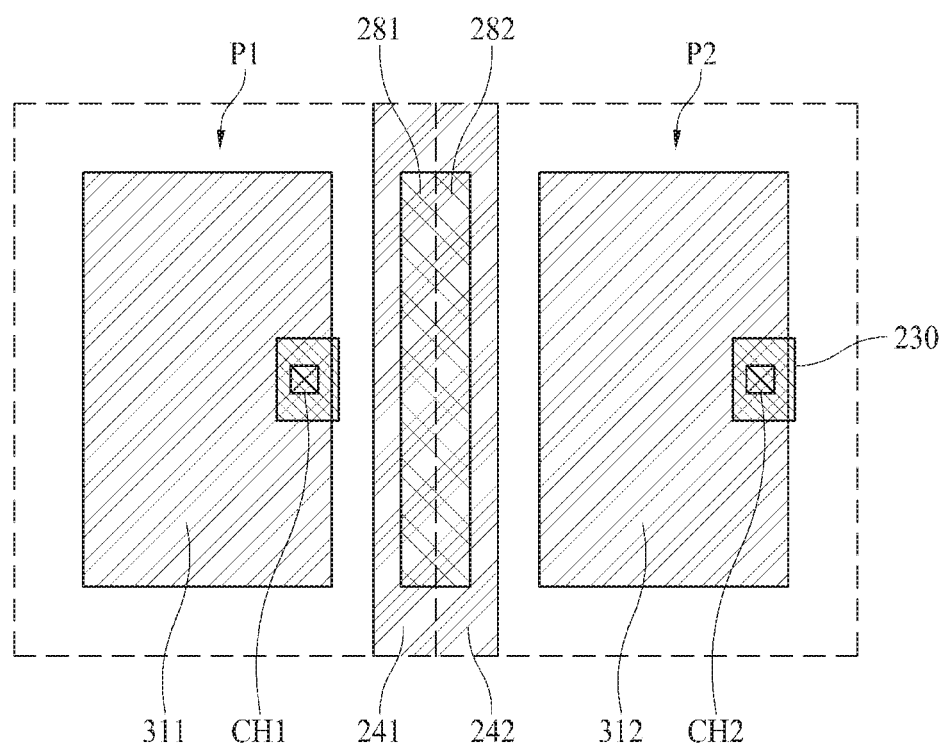
FIG. 15 is a plane view briefly illustrating an example of a first subpixel and a second subpixel.

FIG. 13 is a plane view briefly illustrating a first substrate according to the second embodiment of the present disclosure, FIG. 14 is a cross-sectional view illustrating an example taken along line V-V of FIG. 13, and FIG. 15 is a plane view briefly illustrating an example of a first subpixel and a second subpixel.

Referring to FIGS. 13 to 15, the display panel 110 according to the second embodiment of the present disclosure comprises a first substrate 111, a light-shielding layer 210, a first insulating film 220, a driving transistor 230, first connection electrodes 241, 242 and 360, a second connection electrode 250, a second insulating film 260, a planarization film 270, mask patterns 281, 282 and 283, first electrodes 311, 312 and 313, a bank 315, first light emitting layers 321, 322 and 323, second electrodes 331, 332 and 333, a second light emitting layer 340, and a third electrode 350.

The display panel 110 according to the second embodiment of the present disclosure is different from the display panel 110 according to the first embodiment of the present disclosure shown in FIGS. 3 to 12 in that the first power line 241 and the second power line 242 of the first connection electrode are formed in a single body. Therefore, elements except the first connection electrodes 241, 242 and 360 and the mask patterns 281, 282 and 283 of the display panel 110 according to the second embodiment of the present disclosure are substantially the same as the elements of the display panel 110 according to the first embodiment of the present disclosure. Hereinafter, a detailed description of the first substrate 111, the light-shielding layer 210, the first insulating film 220, the driving transistor 230, the second insulating film 260, the planarization film 270, the first electrodes 311, 312 and 313, the bank 315, the first light emitting layers 321, 322 and 323, the second electrodes 331, 332 and 333, the second light emitting layer 340, and the third electrode 350 of the display panel 110 according to the second embodiment of the present disclosure will be omitted.

The first connection electrodes 241, 242 and 360 and the second connection electrode 250 are provided on the first substrate 111.

The first connection electrodes 241, 242 and 360 electrically connect the second electrodes 331 and 332 and the third electrode 350 of the first subpixel P1 and the second subpixel P2 with each other. In more detail, the first connection electrodes 241, 242 and 360 can include a first power line 241, a second power line 242 and an auxiliary power line 360.

The auxiliary power line 360 is provided to be extended from the non-display area NDA to a first direction (e.g., X-axis direction). The auxiliary power line 360 can partially be exposed without being covered by the first insulating film 220, the second insulating film 260 and the planarization film 270, and can be connected with the third electrode 350 at the exposed area.

The first power line 241 is arranged between the first subpixel P1 and the second subpixel P2 in the display area DA and then connected with the second electrode 331 of the first subpixel P1. The second power line 242 is arranged between the first subpixel P1 and the second subpixel P2 in the display area DA and then connected with the second electrode 332 of the second subpixel P2. At this time, in the display device 100 according to the second embodiment of the present disclosure, the first power line 241 and the second power line 242 are formed in a single body.

The first power line 241 and the second power line 242 can be provided to be extended from the display area DA to a second direction (e.g., Y-axis direction). One ends of the first power line 241 and the second power line 242 are connected to the auxiliary power line 360. At this time, the first power line 241 and the second power line 242 can be connected to, but not limited to, the auxiliary power line 360 through a contact hole.

Each of the first power line 241 and the second power line 242 can be formed of the same material as that of any one of the active layer, the gate electrode, the source electrode and the drain electrode of the driving transistor 230 on the same layer as any one of them.

In accordance with the aforementioned description, the second electrode 331 and the third electrode 350 of the first subpixel P1 are electrically connected with each other through the first power line 241, the second power line 242 and the auxiliary power line 360. That is, if a low potential voltage is applied to the third electrode 350, the same low potential voltage as the third electrode 350 is applied to the second electrode 331 of the first subpixel P1.

The second electrode 332 and the third electrode 350 of the second subpixel P2 are electrically connected with each other through the first power line 241, the second power line 242 and the auxiliary power line 360. That is, if a low potential voltage is applied to the third electrode 350, the same low potential voltage as the third electrode 350 is applied to the second electrode 332 of the second subpixel P2.

The mask patterns 281, 282 and 283 are provided on the second insulating film 260 to partially cover the opening areas OA1, OA2 and OA3 of the second insulating film 260. The mask patterns 281, 282 and 283 include a first mask pattern 281, a second mask pattern 282, and a third mask pattern 283.

The first mask pattern 281 is provided between the first subpixel P1 and the second subpixel P2. Particularly, the first mask pattern 281 is provided on the second insulating film 260 provided between the first opening area OA1 for partially exposing the first power line 241 and the second opening area OA2 for partially exposing the second power line 242.

The first mask pattern 281 includes a protrusion 281a protruded to partially cover the first opening area OA1. At this time, the protrusion 281a of the first mask pattern 281 is spaced apart from the first power line 241 to form a space with the first power line 241.

The first mask pattern 281 can be protruded such that the protrusion 281a is headed for the first subpixel P1 from the second subpixel P2. Therefore, a partial area of the first opening area OA1, which is adjacent to the second subpixel P2, is covered by the first mask pattern 281, and the first power line 241 is also covered by the first mask pattern 281. The other area of the first opening area OA1, which is adjacent to the first subpixel P1, still exposes the first power line 241.

The first mask pattern 281 can be provided along the first power line 241 in the same manner as the first opening area OA1. At this time, the first mask pattern 281 can be provided on the first power line 241 in a plurality of patterns having a predetermined length along a second direction (e.g., Y-axis direction). However, without limitation to this example, the first mask pattern 281 can be provided on one first power line 241 in one line pattern extended in the second direction (Y-axis direction).

Meanwhile, the first mask pattern 281 can be formed of, but not limited to, the same material as that of the first electrodes 311, 312 and 313 on the same layer as the first electrodes 311, 312 and 313.

The second mask pattern 282 is provided between the first subpixel P1 and the second subpixel P2. Particularly, the second mask pattern 282 is provided on the second insulating film 260 provided between the first opening area OA1 for partially exposing the first power line 241 and the second opening area OA2 for partially exposing the second power line 242. At this time, in the display device 100 according to the second embodiment of the present disclosure, the first mask pattern 281 and the second mask pattern 282 can be formed in a single body.

The second mask pattern 282 includes a protrusion 282a protruded to partially cover the second opening area OA2. At this time, the protrusion 282a of the second mask pattern 282 is spaced apart from the second power line 242 to form a space with the second power line 242.

The second mask pattern 282 can be protruded such that the protrusion 282a is headed for the second subpixel P2 from the first subpixel P1. Therefore, a partial area of the second opening area OA2, which is adjacent to the first subpixel P1, is covered by the second mask pattern 282, and the second power line 242 is also covered by the second mask pattern 282. The other area of the second opening area OA2, which is adjacent to the second subpixel P2, still exposes the second power line 242.

The second mask pattern 282 can be provided along the second power line 242 in the same manner as the second opening area OA2. At this time, the second mask pattern 282 can be provided on the second power line 242 in a plurality of patterns having a predetermined length along a second direction (e.g., Y-axis direction). However, without limitation to this example, the second mask pattern 282 can be provided on one second power line 242 in one line pattern extended in the second direction (Y-axis direction).

Meanwhile, the second mask pattern 282 can be formed of, but not limited to, the same material as that of the first electrodes 311, 312 and 313 on the same layer as the first electrodes 311, 312 and 313.

Third Embodiment

Figure 16:
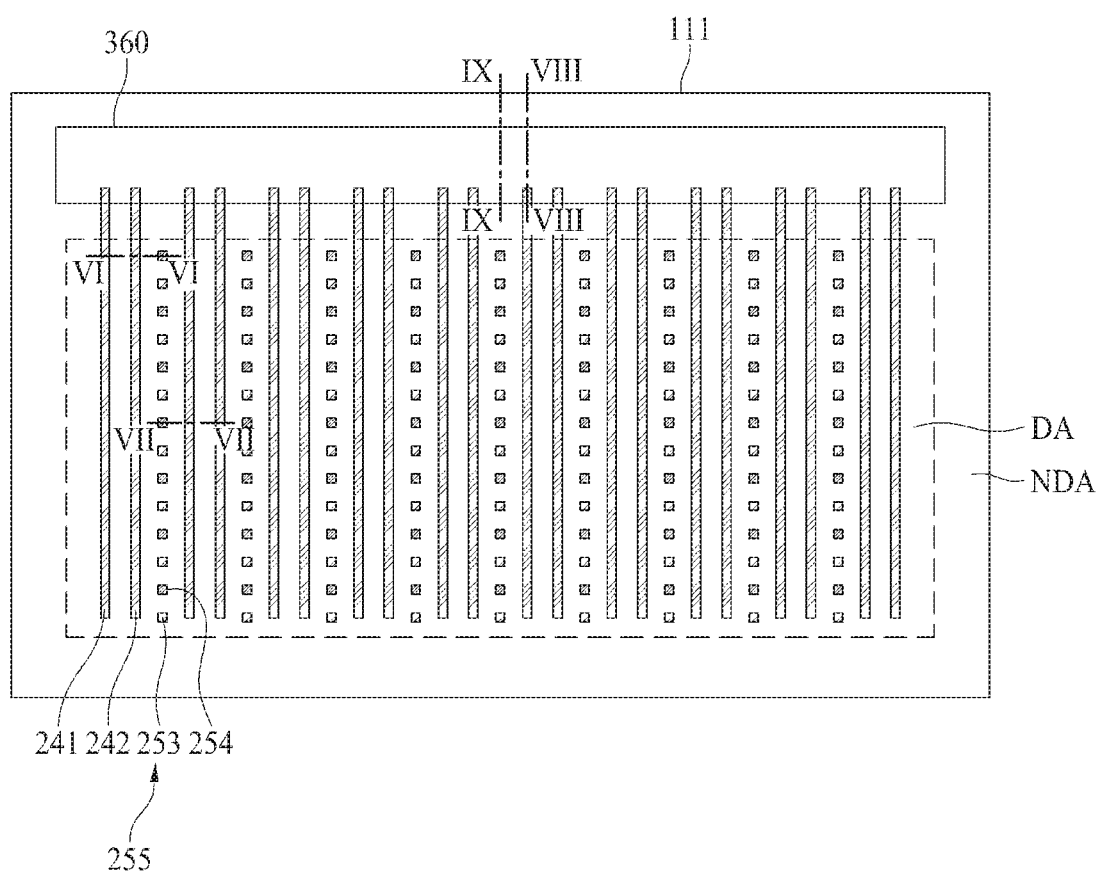
FIG. 16 is a plane view briefly illustrating a first substrate according to the third embodiment of the present disclosure.
Figure 17:
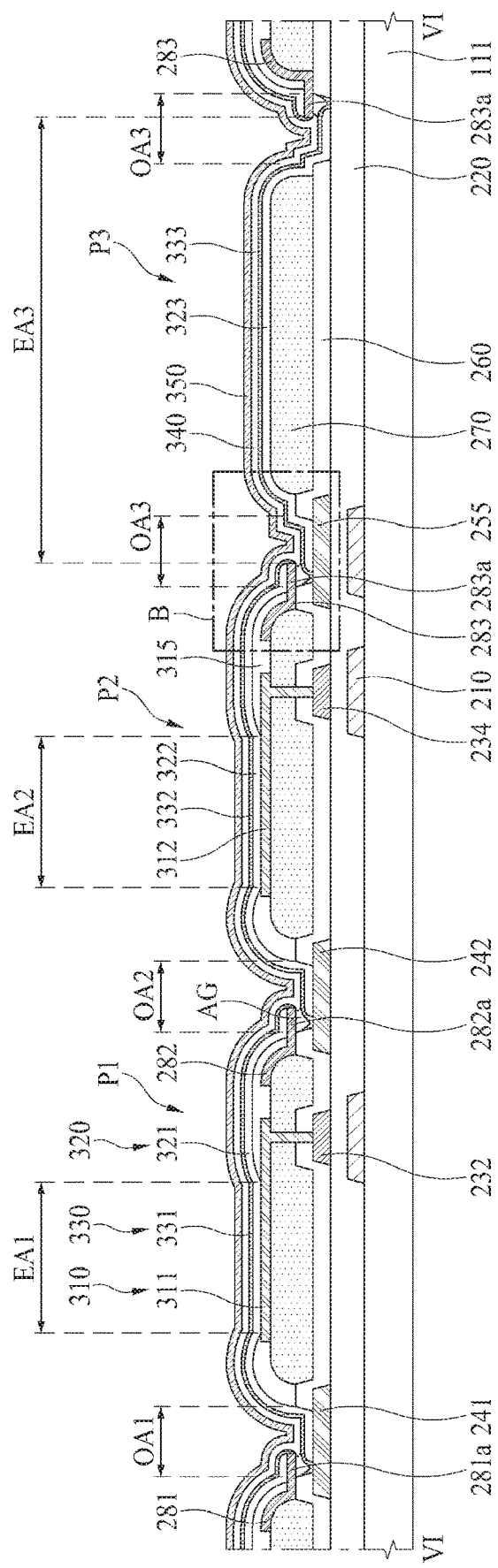
FIG. 17 is a cross-sectional view illustrating an example taken along line VI-VI of FIG. 16.
Figure 18:
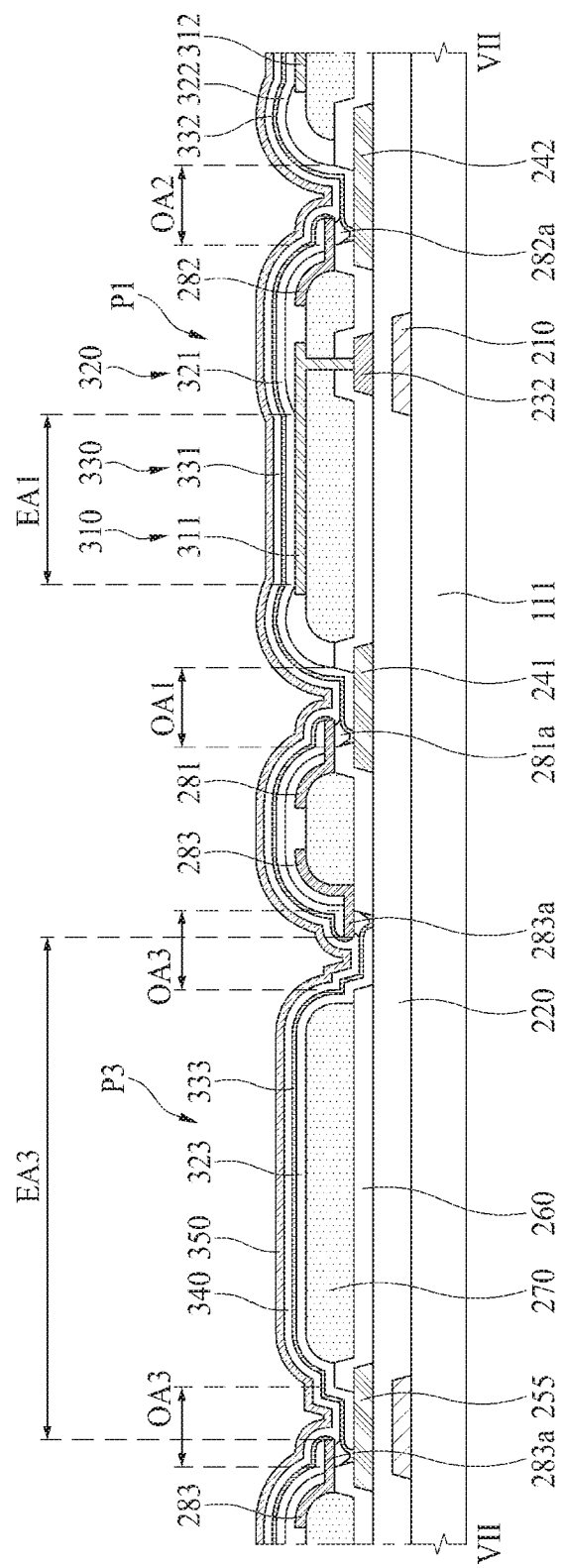
FIG. 18 is a cross-sectional view illustrating an example taken along line VII-VII of FIG. 16.
Figure 19:
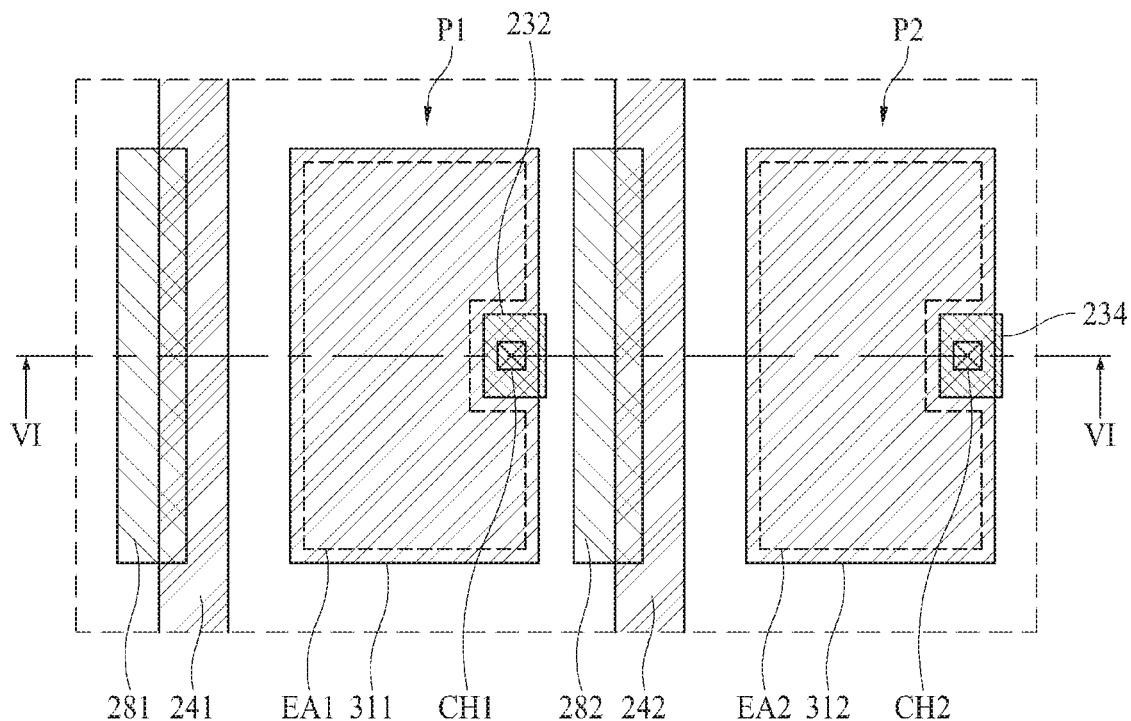
FIG. 19 is a plane view briefly illustrating an example of a first subpixel and a second subpixel.
Figure 20:
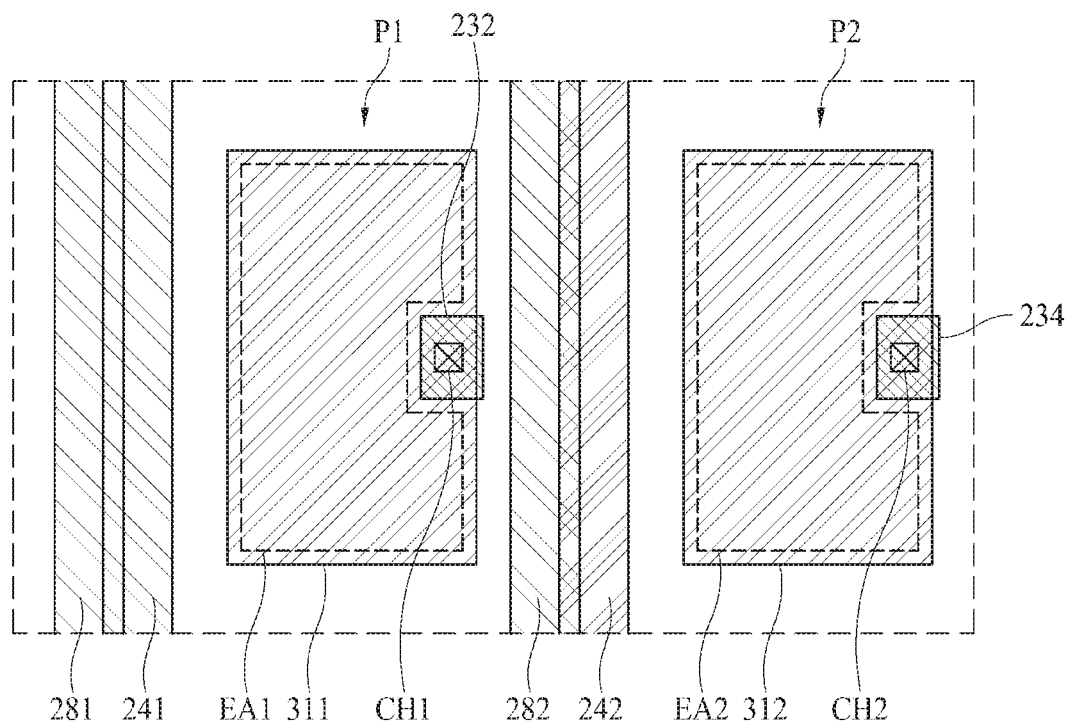
FIG. 20 is a plane view illustrating a modified example of FIG. 19.
Figure 21:
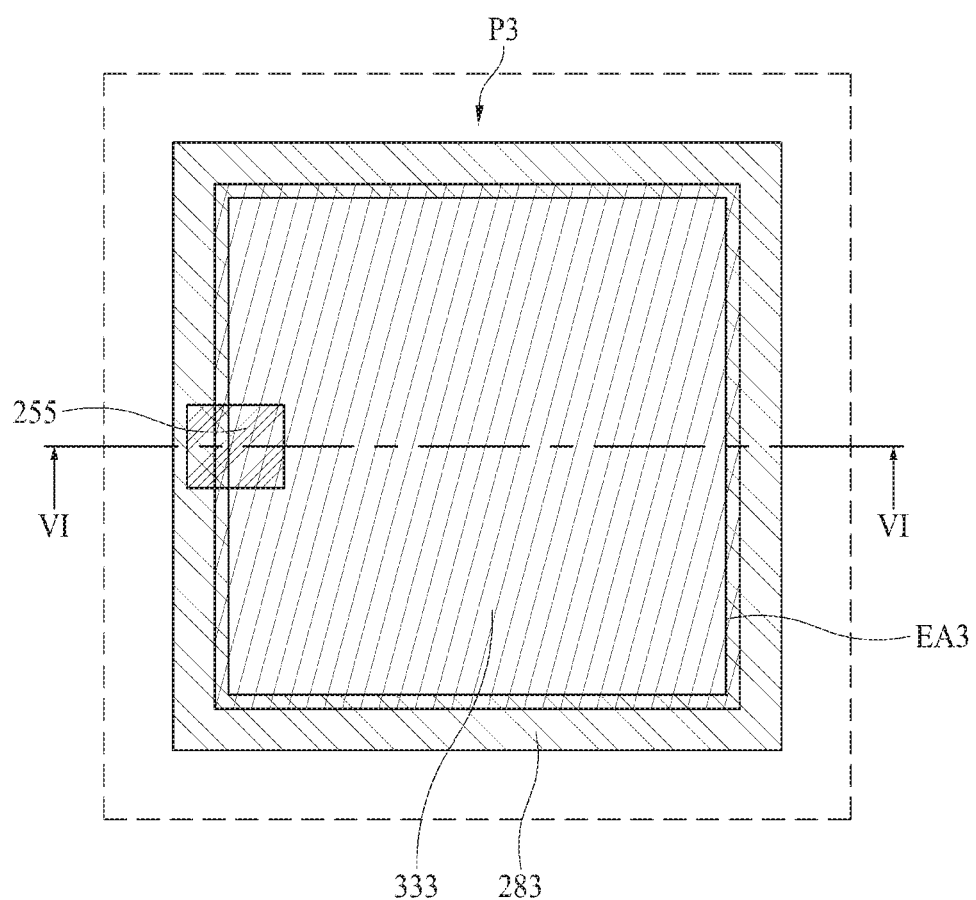
FIG. 21 is a plane view briefly illustrating an example of a third subpixel.
Figure 22:
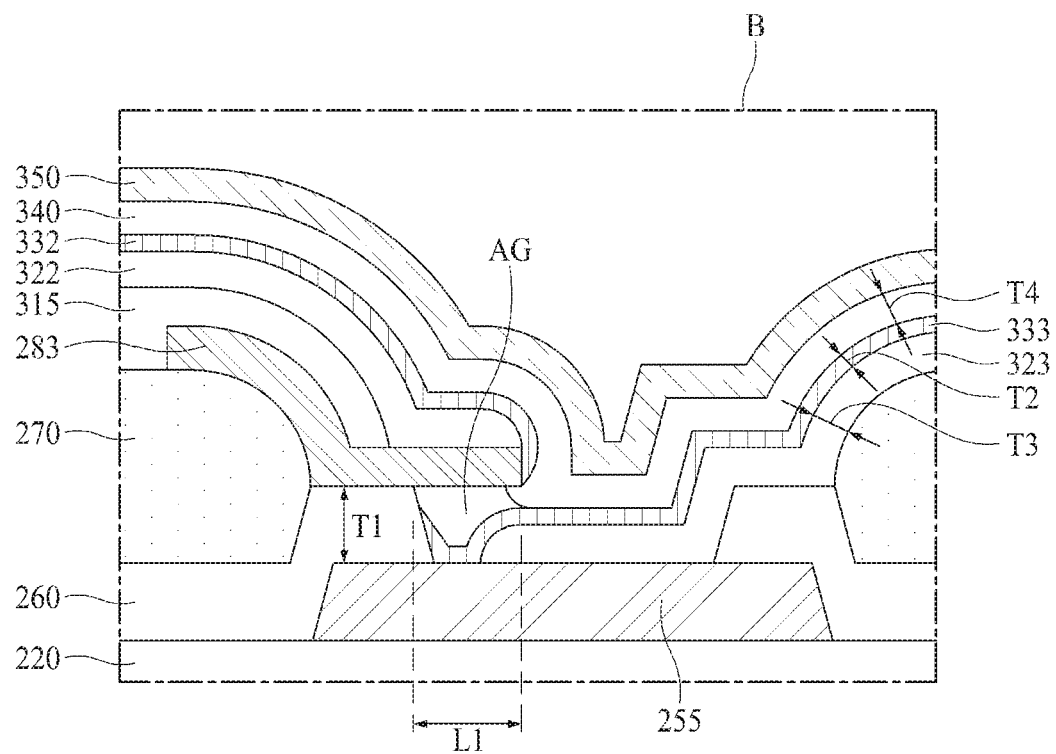
FIG. 22 is an enlarged view illustrating an example of an area B of FIG. 17.
Figure 23:
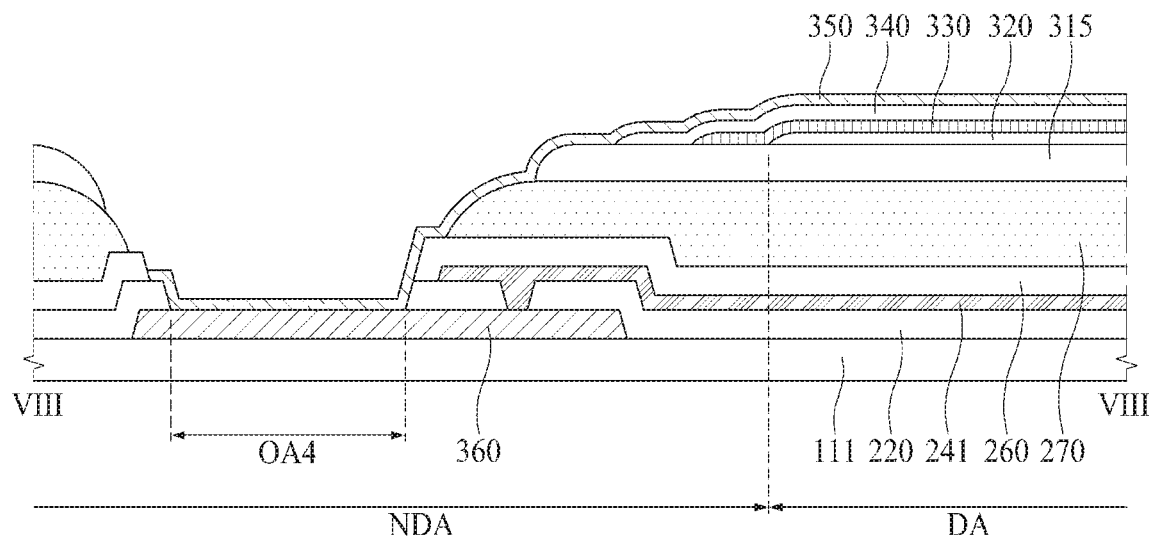
FIG. 23 is a cross-sectional view illustrating an example taken along line VIII-VIII of FIG. 16.
Figure 24:
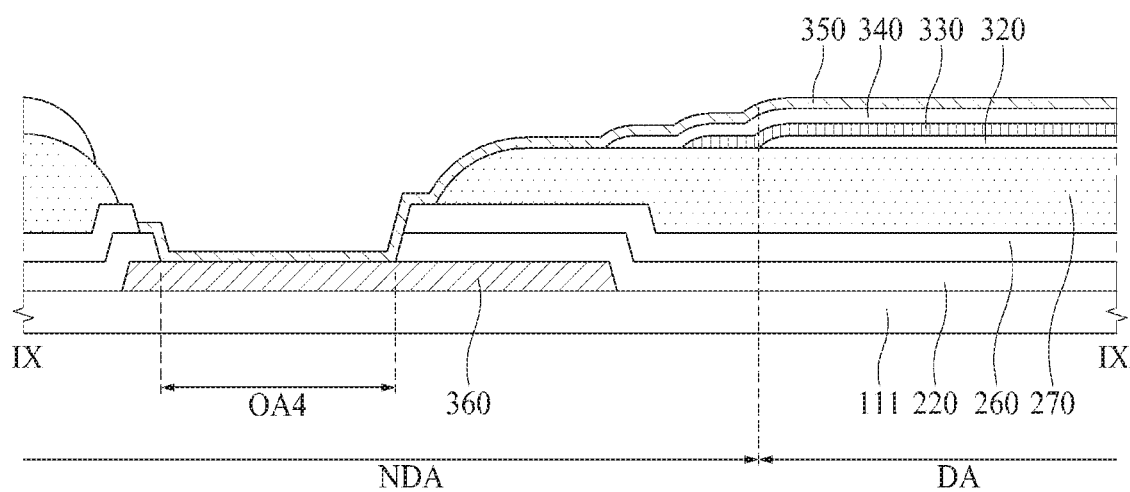
FIG. 24 is a cross-sectional view illustrating an example taken along line IX-IX of FIG. 16.
Figure 25:
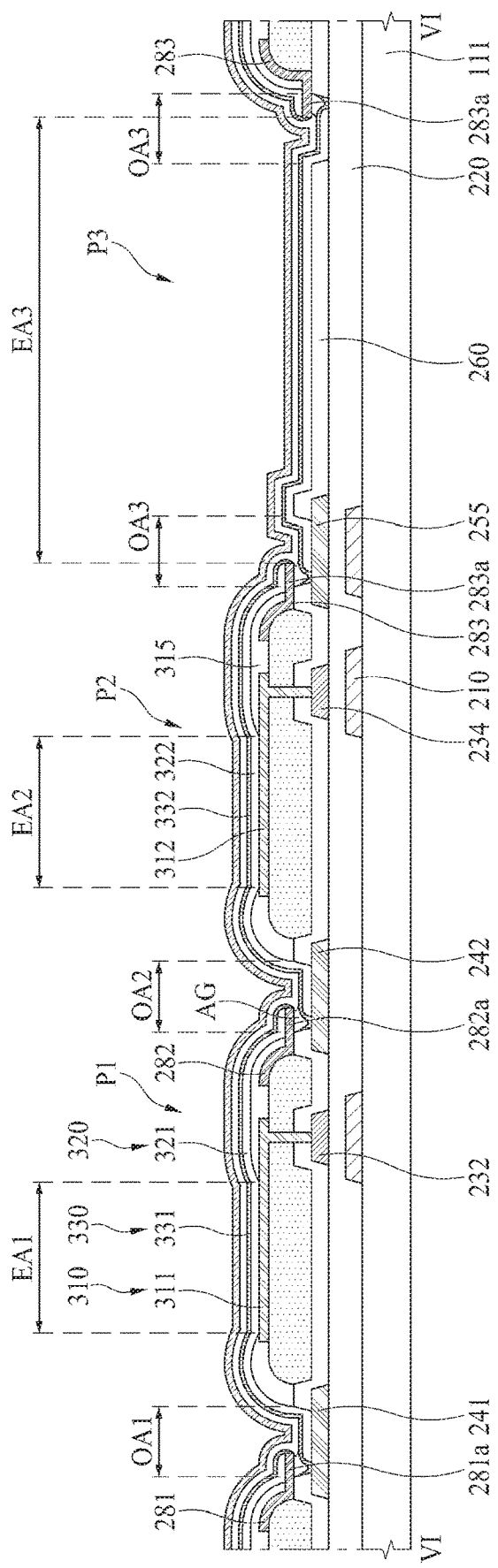
FIG. 25 is a plane view illustrating a modified example of FIG. 17.
Figure 26:
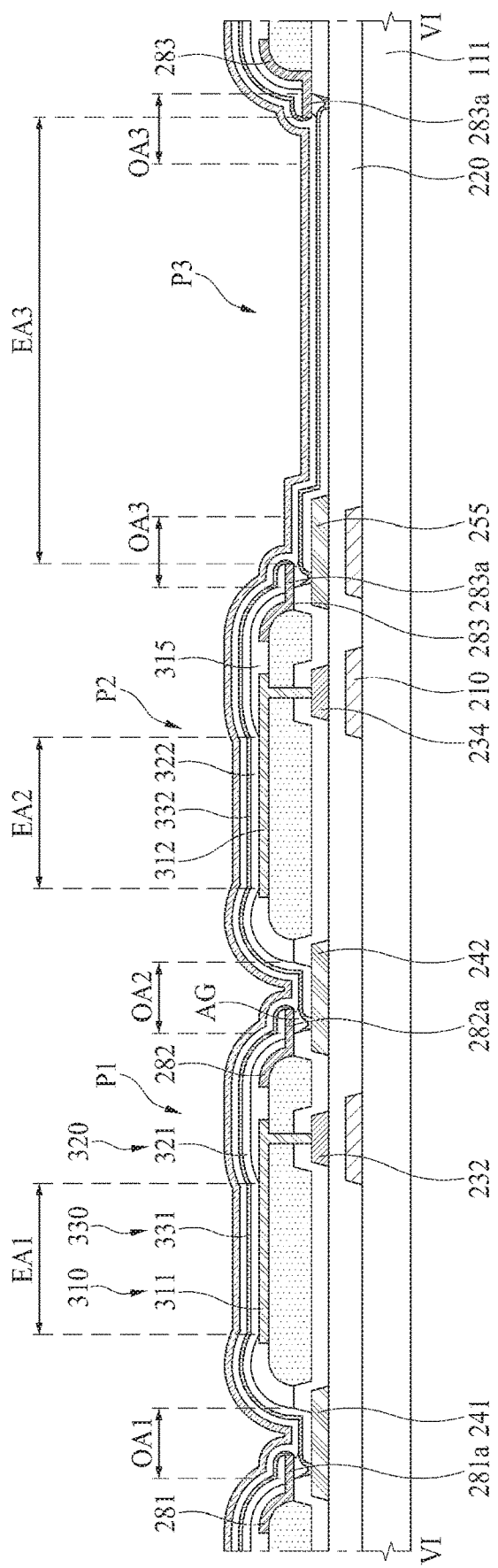
FIG. 26 is a plane view illustrating another modified example of FIG. 17.

FIG. 16 is a plane view briefly illustrating a first substrate according to the third embodiment of the present disclosure, FIG. 17 is a cross-sectional view illustrating an example taken along line VI-VI of FIG. 16, FIG. 18 is a cross-sectional view illustrating an example taken along line VII-VII of FIG. 16, FIG. 19 is a plane view briefly illustrating an example of a first subpixel and a second subpixel, FIG. 20 is a plane view illustrating a modified example of FIG. 19, FIG. 21 is a plane view briefly illustrating an example of a third subpixel, FIG. 22 is an enlarged view illustrating an example of an area B of FIG. 17, FIG. 23 is a cross-sectional view illustrating an example taken along line VIII-VIII of FIG. 16, FIG. 24 is a cross-sectional view illustrating an example taken along line IX-IX of FIG. 16, FIG. 25 is a plane view illustrating a modified example of FIG. 17, and FIG. 26 is a plane view illustrating another modified example of FIG. 17.

Referring to FIGS. 16 to 26, the display panel 110 according to the third embodiment of the present disclosure comprises a first substrate 111, a light-shielding layer 210, a first insulating film 220, a driving transistor 230, first connection electrodes 241, 242 and 360, a third connection electrode 255, a second insulating film 260, a planarization film 270, mask patterns 281, 282 and 283, first electrodes 311 and 312, a bank 315, first light emitting layers 321, 322 and 323, second electrodes 331, 332 and 333, a second light emitting layer 340, and a third electrode 350.

Hereinafter, for convenience of description, a detailed description of elements substantially the same as those of the display panel 110 according to the first embodiment of the present disclosure shown in FIGS. 3 to 12 will be omitted.

The first substrate 111 can be made of, but not limited to, glass or plastic. The first substrate 111 can be made of a semiconductor material such as silicon wafer. The first substrate 111 can be made of a transparent material or an opaque material.

The first substrate 111 is categorized into a display area DA and a non-display area NDA. A first subpixel P1, a second subpixel P2 and a third subpixel P3 can be provided on the display area DA of the first substrate 111. The first subpixel P1 can be provided to emit red light, the second subpixel P2 can be provided to emit green light, and the third subpixel P3 can be provided to emit blue light. However, these subpixels are not limited to this case. A fourth subpixel can further be provided on the display area DA of the substrate 111 to emit white (W) light. Also, an arrangement sequence of the subpixels P1, P2 and P3 can be changed in various ways.

A circuit diode which includes various signal lines, a driving transistor 230 and a capacitor is provided on the first substrate 111 for each of the subpixels P1, P2 and P3. The signal lines can include a gate line, a data line, a power line, and a reference line.

The driving transistor 230 is provided for each of the subpixels P1, P2 and P3. One first transistor 232 is provided in the first subpixel P1, another one second transistor 234 is provided in the second subpixel P2, and other one third transistor can be provided in the third subpixel P3.

The driving transistor 230 supplies a predetermined voltage to the first electrodes 311 and 312 in accordance with the data voltage of the data line if the gate signal is input to the gate line. The driving transistor 230 includes an active layer, a gate electrode, a source electrode, and a drain electrode.

The first connection electrodes 241, 242 and 360 and the third connection electrode 255 are provided on the first substrate 111.

The first connection electrodes 241, 242 and 360 electrically connect the second electrodes 331 and 332 and the third electrode 350 of the first subpixel P1 and the second subpixel P2 with each other. In more detail, the first connection electrodes 241, 242 and 360 can include a first power line 241, a second power line 242 and an auxiliary power line 360.

The auxiliary power line 360 is provided to be extended from the non-display area NDA to a first direction (e.g., X-axis direction). The auxiliary power line 360, as shown in FIGS. 23 and 24, can partially be exposed without being covered by the first insulating film 220, the second insulating film 260 and the planarization film 270, and can be connected with the third electrode 350 at the exposed area.

The auxiliary power line 360 can be formed of, but not limited to, the same material as that of the light-shielding layer 210 on the same layer as the light-shielding layer 210. The auxiliary power line 360 can be formed of the same material as that of any one of the active layer, the gate electrode, the source electrode and the drain electrode on the same layer as that of any one of them.

The first power line 241 is arranged at one side of the first subpixel P1 in the display area DA and then connected with the second electrode 331 of the first subpixel P1. Although the first power line 241 is arranged between the first subpixel P1 and the third subpixel P3 in FIGS. 17 to 20, the first power line 241 is not limited to the example of FIGS. 17 to 20. The first power line 241 can be arranged between the first subpixel P1 and the second subpixel P2.

The first power line 241 can be provided to be extended from the display area DA to a second direction (e.g., Y-axis direction). The plurality of first subpixels P1 can be arranged along the second direction in parallel with the first power line 241. In this case, the first power line 241 can be connected with the second electrode 331 of all of the first subpixels P1 arranged in parallel, or can be connected with the second electrode 331 of some of the first subpixels P1.

Meanwhile, the plurality of first subpixels P1 can be arranged along the second direction alternately with the plurality of second subpixels P2. In this case, the first power line 241 can be connected to the second electrode 331 of all of the plurality of first subpixels P1, or can be connected to the second electrode 331 of some of the plurality of first subpixels P1. Alternatively, the first power line 241 can be connected to the second electrodes 331 and 332 of all of the plurality of first subpixels P1 and the plurality of second subpixels P2, or can be connected to the second electrodes 331 and 332 of some of the plurality of first subpixels P1 and the plurality of second subpixels P2.

One end of the first power line 241 is connected to the auxiliary power line 360. The first power line 241 can be connected to, but not limited to, the auxiliary power line 360 through a contact hole as shown in FIG. 23.

The first power line 241 can be formed of the same material as that of any one of the active layer, the gate electrode, the source electrode and the drain electrode of the first driving transistor 232 on the same layer as any one of them.

In accordance with the aforementioned description, the second electrode 331 and the third electrode 350 of the first subpixel P1 are electrically connected with each other through the first power line 241 and the auxiliary power line 360. That is, if a low potential voltage is applied to the third electrode 350, the same low potential voltage as the third electrode 350 is applied to the second electrode 331 of the first subpixel P1.

The second power line 242 is arranged at one side of the second subpixel P2 in the display area DA and then connected with the second electrode 332 of the second subpixel P2. Although the second power line 242 is arranged between the first subpixel P1 and the second subpixel P2 in FIGS. 17 to 20, the second power line 242 is not limited to the example of FIGS. 17 to 20. The second power line 242 can be arranged between the second subpixel P2 and the third subpixel P3.

The second power line 242 can be provided in the display area DA, and can be extended to the second direction (Y-axis direction). The plurality of second subpixels P2 can be arranged along the second direction in parallel with the second power line 242. In this case, the second power line 242 can be connected with the second electrode 332 of all of the second subpixels P2 arranged in parallel, or can be connected with the second electrode 332 of some of the plurality of second subpixels P2.

Meanwhile, the plurality of second subpixels P2 can be arranged along the second direction alternately with the plurality of first subpixels P1. In this case, the second power line 242 can be connected to the second electrode 332 of all of the plurality of second subpixels P2, or can be connected to the second electrode 332 of some of the plurality of second subpixels P2. Alternatively, the second power line 242 can be connected to the second electrodes 331 and 332 of all of the plurality of first subpixels P1 and the plurality of second subpixels P2, or can be connected to the second electrodes 331 and 332 of some of the plurality of first subpixels P1 and the plurality of second subpixels P2.

One end of the second power line 242 is connected to the auxiliary power line 360. The second power line 242 can be connected to, but not limited to, the auxiliary power line 360 through a contact hole as shown in FIG. 23.

The second power line 242 can be formed of the same material as that of any one of the active layer, the gate electrode, the source electrode and the drain electrode of the second transistor 234 on the same layer as any one of them.

In accordance with the aforementioned description, the second electrode 332 and the third electrode 350 of the second subpixel P2 are electrically connected with each other through the second power line 242 and the auxiliary power line 360. That is, if a low potential voltage is applied to the third electrode 350, the same low potential voltage as the third electrode 350 is applied to the second electrode 332 of the second subpixel P2.

The third connection electrode 255 is electrically connected to the second electrode 333 of the third subpixel P3.

The third connection electrode 255 is arranged at one side of the third subpixel P3 in the display area DA and connected with the second electrode 333 of the third subpixel P3.

Although FIGS. 17, 18 and 21 illustrate that the third connection electrode 255 is arranged between the second subpixel P2 and the third subpixel P3, the third connection electrode 255 is not limited to the examples of FIGS. 17, 18 and 21. The third connection electrode 255 can be arranged between the third subpixel P3 and the first subpixel P1.

The third connection electrode 255 can be patterned to correspond to each of the plurality of third subpixels P3. At this time, the third connection electrodes 255 provided to correspond to each of the plurality of third subpixels P3 are spaced apart from each other so as not to be electrically connected with each other as shown in FIG. 16. One third subpixel P3 can be connected with one third connection electrode 253, and the other one third subpixel P3 can be connected with the other one third connection electrode 254. At this time, one third connection electrode 253 and the other one third connection electrode 254 can be patterned and spaced apart from each other so as not to be electrically connected with each other.

The third connection electrode 255 can be any one of a source electrode and a drain electrode of the third transistor.

The second insulating film 260 is provided on the first and second transistors 232 and 234, the first connection electrodes 241, 242 and 360 and the third connection electrode 255. The second insulating film 260 covers the first and second transistors 232 and 234 to protect the first and second transistors 232 and 234 and at the same time partially exposes the first connection electrodes 241, 242 and 360 and the third connection electrode 255.

In more detail, the second insulating film 260 includes opening areas OA1, OA2, OA3 and OA4 that partially expose the first connection electrodes 241, 242 and 360 and the third connection electrode 255.

The second insulating film 260 can include a first opening area OA1 for partially exposing the first power line 241 as shown in FIGS. 17 and 18. The first opening area OA1 can be provided along the first power line 241. At this time, the first opening area OA1 can be provided on first power line 241 in one or a plurality of patterns having a predetermined length along the second direction (Y-axis direction).

Also, the second insulating film 260 can include a second opening area OA2 for partially exposing the second power line 242 as shown in FIGS. 17 and 18. The second opening area OA2 can be provided along the second power line 242. At this time, the second opening area OA2 can be provided on one second power line 242 in one or a plurality of patterns having a predetermined length along the second direction (Y-axis direction).

Also, the second insulating film 260 can include a third opening area OA3 for partially exposing the third connection electrode 255 as shown in FIGS. 17 and 18. The third opening area OA3 can be provided to surround the third subpixel P3. Therefore, the third opening area OA3 partially exposes the third connection electrode 255 in an area where the third connection electrode 255 is provided, and exposes the first insulating film 220 in an area where the third connection electrode 255 is not provided.

Also, the second insulating film 260 can include a fourth opening area OA4 for partially exposing the auxiliary power line 360 as shown in FIGS. 23 and 24. The auxiliary power line 360 is partially exposed by the first insulating film 220, and the fourth opening area OA4 can be provided on the exposed auxiliary power line 360.

The second insulating film 260 can be formed of an inorganic film, for example, a silicon oxide film, a silicon nitride film or a multi-layered film of the silicon oxide film and the silicon nitride film.

The planarization film 270 is provided on the second insulating film 260 to planarize a step difference due to the driving transistor 230. At this time, the planarization film 270 is not provided on the opening areas OA1, OA2, OA3 and OA4 of the second insulating film 260. Therefore, the first connection electrodes 241, 242 and 360 and the third connection electrode 255 can partially still be exposed.

The planarization film 270 can have a formation area smaller than the second insulating film 260. Therefore, the planarization film 270 can partially expose the second insulating film 260. At this time, the second insulating film 260 can be exposed in an area adjacent to the opening areas OA1, OA2, OA3 and OA4 without being covered by the planarization film 270.

The planarization film 270 can be formed of an organic film such as acrylic resin, epoxy resin, phenolic resin, polyamide resin, and polyimide resin.

The first electrodes 311 and 312 are provided to be patterned on the planarization film 270 for each of the subpixels P1, P2 and P3. One first electrode 311 is provided on the first subpixel P1, and the other first electrode 312 is provided on the second subpixel P2.

The display device 100 according to the third embodiment of the present disclosure is characterized in that the first electrodes 311 and 312 are not provided on the third subpixel P3. Therefore, in the display device 100 according to the third embodiment of the present disclosure, transmittance in the third subpixel P3 can be improved. Particularly, if the display device 100 is provided in a bottom emission type, since light emitted from the second light emitting layer 340 of the third subpixel P3 may not pass through the first electrodes 311 and 312, light efficiency can be improved.

The first electrodes 311 and 312 are connected to the source electrode or the drain electrode of each of the first and second transistors 232 and 234 through contact holes CH1 and CH2 that pass through the second insulating film 260 and the planarization film 270. The first electrode 311 of the first subpixel P1 is connected to the source electrode or the drain electrode of the first transistor 232 through the contact hole CH1, whereby a first high potential voltage is applied to the first electrode 311 of the first subpixel P1. The first electrode 312 of the second subpixel P2 is connected to the source electrode or the drain electrode of the second transistor 234 through the contact hole CH2, whereby a second high potential voltage is applied to the first electrode 312 of the second subpixel P2.

The first electrodes 311 and 312 can be formed of a transparent metal material, a semi-transmissive metal material, or a metal material with high reflexibility. If the display device 100 is formed in a bottom emission type, the first electrodes 311 and 312 can be formed of a transparent conductive material (TCO) such as ITO and IZO, which can transmit light, or a semi-transmissive conductive material such as Mg, Ag, or an alloy of Mg and Ag. If the display device 100 is formed in a top emission type, the first electrodes 311 and 312 can be formed of a metal material with high reflexibility such as a deposited structure (Ti/Al/Ti) of Al and Ti, a deposited structure (ITO/Al/ITO) of Al and ITO, an Ag alloy, and a deposited structure (ITO/Ag alloy/ITO) of Ag alloy and ITO. The Ag alloy can be an alloy of Ag, Pd and Cu. The first electrodes 311 and 312 can be anode electrodes.

The mask patterns 281, 282 and 283 are provided on the second insulating film 260 to partially cover the opening areas OA1, OA2 and OA3 of the second insulating film 260. The mask patterns 281, 282 and 283 include a first mask pattern 281, a second mask pattern 282, and a third mask pattern 283.

The first mask pattern 281 includes a protrusion 281a provided on the second insulating film 260 exposed without being covered by the planarization film 270 and protruded to partially cover the first opening area OA1 that partially exposes the first power line 241. At this time, the protrusion 281a of the first mask pattern 281 is spaced apart from the first power line 241 to form a space with the first power line 241.

The first mask pattern 281 is provided to be close to the subpixel arranged to adjoin the first subpixel P1 by interposing the first opening area OA1. The first opening area OA1 for exposing the first power line 241 can be arranged, but not limited, between the first subpixel P1 and the third subpixel P3.

If the first opening area OA1 of the second insulating film 260 is arranged between the third subpixel P3 and the first subpixel P1, the first mask pattern 281 can be protruded such that the protrusion 281a is headed for the first opening area OA1 from the third subpixel P3. Therefore, a partial area of the first opening area OA1, which is adjacent to the third subpixel P3, is covered by the first mask pattern 281, and the first power line 241 is also covered by the first mask pattern 281. The other area of the first opening area OA1, which is adjacent to the first subpixel P1, still exposes the first power line 241.

The first mask pattern 281 can be provided along the first power line 241 in the same manner as the first opening area OA1. At this time, the first mask pattern 281 can be provided on one first power line 241 in a plurality of patterns having a predetermined length along a second direction (Y-axis direction) as shown in FIG. 19. However, the first mask pattern 281 is not limited to the example of FIG. 19. The first mask pattern 281 can be provided on one first power line 241 in one line pattern extended along the second direction (Y-axis direction) as shown in FIG. 20.

Meanwhile, the first mask pattern 281 can be formed of, but not limited to, the same material as that of the first electrodes 311 and 312 on the same layer as the first electrodes 311 and 312.

As shown in FIGS. 17 and 18, the first mask pattern 281 can be formed of the same material as that of the first electrodes 311 and 312 on the same layer as the first electrodes 311 and 312. At this time, the first mask pattern 281 can be spaced apart from the first electrodes 311 and 312.

In this case, in the display device, the first mask pattern 281 is formed of the same material as that of the first electrodes 311 and 312 on the same layer as the first electrodes 311 and 312. As a result, the first mask pattern 261 is formed without adding a separate process.

However, without limitation to this case, the first mask pattern 281 can be provided on a layer different from the first electrodes 311 and 312. The first mask pattern 281 can be provided between the second insulating film 260 and the planarization film 270.

The second mask pattern 282 includes a protrusion 282a provided on the second insulating film 260 exposed without being covered by the planarization film 270 and protruded to partially cover the second opening area OA2 for partially exposing the second power line 242. At this time, the protrusion 282a of the second mask pattern 282 is spaced apart from the second power line 242 to form a space with the second power line 242.

The second mask pattern 282 is provided to be close to the subpixel arranged to adjoin the second subpixel P2 by interposing the second opening area OA2. The second opening area OA2 for exposing the second power line 242 can be arranged, but not limited, between the first subpixel P1 and the second subpixel P2.

If the second opening area OA2 of the second insulating film 260 is arranged between the first subpixel P1 and the second subpixel P2, the second mask pattern 282 can be protruded such that the protrusion 282a is headed for the second opening area OA2 from the first subpixel P1. Therefore, a partial area of the second opening area OA2, which is adjacent to the first subpixel P1, is covered by the second mask pattern 282, and the second power line 242 is also covered by the second mask pattern 282. The other area of the second opening area OA2, which is adjacent to the second subpixel P2, still exposes the second power line 242.

The second mask pattern 282 can be provided along the second power line 242 in the same manner as the second opening area OA2. At this time, the second mask pattern 282 can be provided on one second power line 242 in a plurality of patterns having a predetermined length along a second direction (Y-axis direction) as shown in FIG. 19. However, the second mask pattern 282 is not limited to the example of FIG. 19. The second mask pattern 282 can be provided on one second power line 242 in one line pattern extended along the second direction (Y-axis direction) as shown in FIG. 20.

Meanwhile, the second mask pattern 282 can be formed of, but not limited to, the same material as that of the first electrodes 311 and 312 on the same layer as the first electrodes 311 and 312.

As shown in FIGS. 17 and 18, the second mask pattern 282 can be formed of the same material as that of the first electrodes 311 and 312 on the same layer as the first electrodes 311 and 312. At this time, the second mask pattern 282 can be spaced apart from the first electrodes 311 and 312.

If the second opening area OA2 of the second insulating film 260 is arranged between the first subpixel P1 and the second subpixel P2, the second mask pattern 282 is spaced apart from the first electrode 311 of the first subpixel P1 such that it is not electrically connected with the first electrode 311 of the first subpixel P1. The second mask pattern 282 can be provided on the planarization film 270 as well as the second insulating film 260 exposed without being covered by the planarization film 270.

In this case, in the display device 100, the second mask pattern 282 is formed of the same material as that of the first electrodes 311 and 312 on the same layer as the first electrodes 311 and 312. As a result, the second mask pattern 282 is formed without adding a separate process.

However, without limitation to this case, the second mask pattern 282 can be provided on a layer different from the first electrodes 311 and 312. The second mask pattern 282 can be provided between the second insulating film 260 and the planarization film 270.

The third mask pattern 283 includes a protrusion 283a provided on the second insulating film 260 exposed without being covered by the planarization film 270 and protruded to partially cover the third opening area OA3 for partially exposing the third connection electrode 255. At this time, the protrusion 283a of the third mask pattern 283 is spaced apart from the third connection electrode 255 to form a space with the third connection electrode 255.

The third mask pattern 283 is provided to be close to the subpixel arranged to adjoin the third subpixel P3 by interposing the third opening area OA3. The third opening area OA3 for exposing the third connection electrode 255 mad be arranged, but not limited, between the first subpixel P1 and the third subpixel P3 and between the second subpixel P2 and the third subpixel P3.

If the third opening area OA3 of the second insulating film 260 is arranged between the first subpixel P1 and the third subpixel P3, the third mask pattern 283 can be protruded such that the protrusion 283a is headed for the third opening area OA3 from the first subpixel P1. Therefore, a partial area of the third opening area OA3, which is adjacent to the first subpixel P1, is covered by the third mask pattern 283, and the third connection electrode 255 or the first insulating film 220 is also covered by the third mask pattern 283. The other area of the third opening area OA3, which is adjacent to the third subpixel P3, still exposes the third connection electrode 255 or the first insulating film 220.

Also, if the third opening area OA3 of the second insulating film 260 is arranged between the second subpixel P2 and the third subpixel P3, the third mask pattern 283 can be protruded such that the protrusion 283a is headed for the third opening area OA3 from the second subpixel P2. Therefore, a partial area of the third opening area OA3, which is adjacent to the second subpixel P2, is covered by the third mask pattern 283, and the third connection electrode 255 or the first insulating film 220 is also covered by the third mask pattern 283. The other area of the third opening area OA3, which is adjacent to the third subpixel P3, still exposes the third connection electrode 255 or the first insulating film 220.

The third mask pattern 283 can be provided to surround the third subpixel P3 in the same manner as the third opening area OA3 as shown in FIG. 8. The second electrode 333 of the third subpixel P3 can be disconnected from the second electrode 331 of the first subpixel P1 and the second electrode 332 of the second subpixel P2 by the third mask pattern 283. In the display device according to the third embodiment of the present disclosure, the third mask pattern 283 is provided to surround the third subpixel P3 such that the second electrode 333 of the third subpixel P3 does not electrically connect the second electrode 331 of the first subpixel P1 with the second electrode 332 of the second subpixel P2.

Meanwhile, the third mask pattern 283 can be formed of, but not limited to, the same material as that of the first electrodes 311 and 312 on the same layer as the first electrodes 311 and 312.

As shown in FIGS. 17 and 18, the third mask pattern 283 can be formed of the same material as that of the first electrodes 311 and 312 on the same layer as the first electrodes 311 and 312. At this time, the third mask pattern 283 can be spaced apart from the first electrodes 311 and 312.

If the third opening area OA3 of the second insulating film 260 is arranged between the first subpixel P1 and the third subpixel P3, the third mask pattern 283 is spaced apart from the first electrode 311 of the first subpixel P1 such that it is not electrically connected with the first electrode 311 of the first subpixel P1. The third mask pattern 283 can be provided on the planarization film 270 as well as the second insulating film 260 exposed without being covered by the planarization film 270.

Also, if the third opening area OA3 of the second insulating film 260 is arranged between the second subpixel P2 and the third subpixel P3, the third mask pattern 283 is spaced apart from the second electrode 312 of the second subpixel P2 such that it is not electrically connected with the second electrode 312 of the second subpixel P2. The third mask pattern 283 can be provided on the planarization film 270 as well as the second insulating film 260 exposed without being covered by the planarization film 270.

In this case, in the display device, the third mask pattern 283 is formed of the same material as that of the first electrodes 311 and 312 on the same layer as the first electrodes 311 and 312. As a result, the third mask pattern 283 is formed without adding a separate process.

However, without limitation to this case, the third mask pattern 283 can be provided on a layer different from the first electrodes 311 and 312. The third mask pattern 283 can be provided between the second insulating film 260 and the planarization film 270.

The bank 315 can be provided on the planarization film 270 to cover ends of the first electrodes 311 and 312. Therefore, a problem that light emission efficiency is deteriorated due to a current concentrated on the ends of the first electrodes 311 and 312 can be avoided.

Meanwhile, the bank 315 is not provided on the opening areas OA1, OA2, OA3 and OA4 of the second insulating film 260. Therefore, the first connection electrodes 241, 242 and 360 and the third connection electrode 255 can partially still be exposed.

Also, the bank 315 can be provided on the mask patterns 281, 282 and 283. At this time, the bank 315 can be provided such that the protrusions 281a, 282a and 283a of the mask patterns 281, 282 and 283 can be exposed without being covered.

If the bank 315 is provided to cover the protrusions 281a, 282a and 283a of the mask patterns 281, 282 and 283, the first light emitting layers 321, 322 and 323 of the subpixels P1, P2 and P3 can be connected with one another without being disconnected from one another. Also, the second electrodes 331, 332 and 333 of the subpixels P1, P2 and P3 can be connected with one another without being disconnected from one another. Therefore, problems can occur in that the second electrode 331 of the first subpixel P1 is not connected to the first power line 241, the second electrode 332 of the second subpixel P2 is not connected to the second power line 242, and the second electrode 333 of the third subpixel P3 is not connected to the third connection electrode 255.

In the display device according to the third embodiment of the present disclosure, the bank 315 should be provided to expose the protrusions 281a, 282a and 283a of the mask patterns 281, 282 and 283 without covering them so as not to cause the problems.

The bank 315 respectively defines light emitting areas EA1 and EA2 in the first subpixel P1 and the second subpixel P2. That is, exposed areas of the first electrodes 311 and 312, where the bank 315 is not provided in each of the first subpixel P1 and the second subpixel P2, become the light emitting areas EA1 and EA2.

Meanwhile, the display device 100 according to the third embodiment of the present disclosure is characterized in that the bank 315 is not provided in the third subpixel P3. Since the first electrode 310 is not provided in the third subpixel P3, the bank 315 covering the ends of the first electrode 310 may not be provided. Therefore, in the display device 100 according to the third embodiment of the present disclosure, a light emitting area EA3 of the third subpixel P3 is greater than the light emitting area EA1 of the first subpixel P1 and the light emitting area EA2 of the second subpixel P2. That is, the third subpixel P3 can have a light emitting area and an opening ratio, which are greater than those of the first subpixel P1 and the second subpixel P2.

The light emitting area EA3 of the third subpixel P3 can be defined by the third mark pattern 283 arranged to adjoin the third subpixel P3. An exposed area of the second electrode 333, which is exposed in the third subpixel P3 without being covered by the third mask pattern 283, can become the light emitting area EA3.

Although the bank 315 can be made of a relatively thin inorganic insulating film, the bank 315 can be made of a relatively thick organic insulating film.

The first light emitting layer 320 is provided on the first electrode 310. In detail, the first light emitting layers 321 and 322 are provided on the first electrodes 311 and 312 in the first and second subpixels P1 and P2. The first light emitting layers 321 and 322 can be provided on the bank 315. The first light emitting layer 323 is provided on the planarization film 270 in the third subpixel P3.

The first light emitting layers 321, 322 and 323 can include a hole transporting layer, a light emitting layer, and an electron transporting layer. In this case, holes and electrons of the first light emitting layers 321, 322 and 323 respectively move to the light emitting layer through the hole transporting layer and the electron transporting layer, and are combined with each other in the light emitting layer to emit light of a predetermined color.

Each of the first light emitting layers 321, 322 and 323 can be any one of, but not limited to, a red light emitting layer for emitting red light, a green light emitting layer for emitting green light, a blue light emitting layer for emitting blue light, and a yellow light emitting layer for emitting yellow light.

The first light emitting layers 321, 322 and 323 are disconnected among the first subpixel P1, the second subpixel P2 and the third subpixel P3. The mask patterns 281, 282 and 283 are provided among the first subpixel P1, the second subpixel P2 and the third subpixel P3. The first light emitting layers 321, 322 and 323 can be disconnected from one another by the mask patterns 281, 282 and 283.

In more detail, the first light emitting layers 321, 322 and 323 can be disconnected between the first subpixel SP1 and the second subpixel SP2 by the second mask pattern 282. If the first light emitting layers 321, 322 and 323 are deposited on the entire surface without a mask, the first light emitting layer 321 deposited on the first subpixel P1 can be disconnected on the protrusion 282a of the second mask pattern 282 due to a step difference between the protrusion 282a of the second mask pattern 282 and the second power line 242 as shown in FIGS. 17 and 22. The first light emitting layer 322 deposited on the second subpixel P2 can enter a space between the protrusion 282a of the second mask pattern 282 and the second power line 242 and then can be provided below the protrusion 282a of the second mask pattern 282 as shown in FIGS. 17 and 22.

In the display device according to the third embodiment of the present disclosure, it is preferable that the first light emitting layer 321 of the first subpixel P1 and the first light emitting layer 322 of the second subpixel P2 are disconnected from each other without being in contact with each other. For this reason, if the second electrodes 331, 332 and 333 are entirely deposited on the first light emitting layers 321, 322 and 323, it is possible to make sure of a space where the second electrode 332 deposited on the second subpixel P2 can enter between the protrusion 282a of the second mask pattern 282 and the first light emitting layer 322 of the second subpixel P2.

Also, the first light emitting layers 321, 322 and 323 can be disconnected between the second subpixel P2 and the third subpixel P3 by the third mask pattern 283. If the first light emitting layers 321, 322 and 323 are deposited on the entire surface without a mask, the first light emitting layer 322 deposited on the second subpixel P2 can be disconnected on the protrusion 283a of the third mask pattern 283 due to a step difference between the protrusion 283a of the third mask pattern 283 and the third connection electrode 255 as shown in FIGS. 17 and 22. The first light emitting layer 323 deposited on the third subpixel P3 can enter a space between the protrusion 283a of the third mask pattern 283 and the second connection electrode 250 and then can be provided below the protrusion 283a of the third mask pattern 283 as shown in FIGS. 17 and 22.

In the display device according to the third embodiment of the present disclosure, it is preferable that the first light emitting layer 322 of the second subpixel P2 and the first light emitting layer 323 of the third subpixel P3 are disconnected from each other without being in contact with each other. For this reason, if the second electrodes 331, 332 and 333 are entirely deposited on the first light emitting layers 321, 322 and 323, it is possible to make sure of a space where the second electrode 333 deposited on the third subpixel P3 can enter between the protrusion 283a of the third mask pattern 283 and the first light emitting layer 323 of the third subpixel P3.

Also, the first light emitting layers 321, 322 and 323 can be disconnected between the first subpixel P1 and the third subpixel P3 by the third mask pattern 283 and the first mask pattern 281. The third mask pattern 283 and the first mask pattern 281 can be provided to be spaced apart from each other between the first subpixel P1 and the third subpixel P3 as shown in FIG. 18. At this time, the first mask pattern 281 includes a protrusion 281a protruded from the third subpixel P3 in a direction of the first subpixel P1, covering a portion of the first opening area OA1. The third mask pattern 283 includes a protrusion 283a protruded from the first subpixel P1 in a direction of the third subpixel P3, covering a portion of the third opening area OA3.

If the first light emitting layers 321, 322 and 323 are deposited on the entire surface without a mask, the first light emitting layer 323 deposited on the third subpixel P3 can enter a space between the protrusion 283a of the third mask pattern 283 and the first insulating film 220 and then can be provided below the protrusion 283a of the third mask pattern 283 as shown in FIGS. 18 and 22. The first light emitting layer 321 deposited on the first subpixel P1 can enter a space between the protrusion 281a of the first mask pattern 281 and the first power line 241 and then can be provided below the protrusion 281a of the first mask pattern 281 as shown in FIGS. 18 and 22.

The second electrodes 331, 332 and 333 are provided on the first light emitting layers 321, 322 and 323. The second electrodes 331, 332 and 333 are disconnected among the first subpixel P1, the second subpixel P2 and the third subpixel P3. The mask patterns 281, 282 and 283 are provided among the first subpixel P1, the second subpixel P2 and the third subpixel P3. The first light emitting layers 321, 322 and 323 can be disconnected from one another by the mask patterns 281, 282 and 283.

In more detail, the second electrodes 331, 332 and 333 can be disconnected between the first subpixel SP1 and the second subpixel SP2 by the second mask pattern 282. If the second electrodes 331, 332 and 333 are deposited on the entire surface, the second electrode 331 deposited on the first subpixel P1 can be disconnected on the protrusion 282a of the second mask pattern 282 due to a step difference between the protrusion 282a of the second mask pattern 282 and the second power line 242 as shown in FIGS. 17 and 22.

The second electrode 332 deposited on the second subpixel P2 can enter a space between the protrusion 282a of the second mask pattern 282 and the first light emitting layer 322 and then can be provided below the protrusion 282a of the second mask pattern 282 as shown in FIGS. 17 and 22. At this time, the second electrode 332 of the second subpixel P2 can be deposited below the protrusion 282a of the second mask pattern 282 at an area wider than the first light emitting layer 322. Therefore, the second electrode 332 of the second subpixel P2 can be connected to the second power line 242.

Since the second electrode 332 of the second subpixel P2 is connected to the second power line 242, the second electrode 332 and the third electrode 350 can electrically be connected with each other through the second power line 242 and the auxiliary power line 360. For this reason, if a low potential voltage is applied to the third electrode 350, the same low potential voltage as the third electrode 350 can be applied to the second electrode 332 of the second subpixel P2. At this time, the second electrode 332 of the second subpixel P2 can be a cathode electrode.

Although FIGS. 17 and 22 illustrate that the second electrode 331 of the first subpixel P1 and the second electrode 332 of the second subpixel P2 are disconnected from each other without being in contact with each other, the present disclosure is not limited to the examples of FIGS. 17 and 22. The second electrodes 331 and 332 of the first subpixel P1 and the second subpixel P2 are all cathode electrodes, and a common voltage can be applied thereto. The second electrodes 331 and 332 of the first subpixel P1 and the second subpixel P2 can be provided to be in contact with each other and then electrically be connected with each other.

Also, the second electrodes 331, 332 and 333 can be disconnected between the second subpixel P2 and the third subpixel P3 by the third mask pattern 283. If the second electrodes 331, 332 and 333 are deposited on the entire surface, the second electrode 332 deposited on the second subpixel P2 can be disconnected on the protrusion 283a of the third mask pattern 283 due to a step difference between the protrusion 283a of the third mask pattern 283 and the first light emitting layer 323 as shown in FIGS. 17 and 22.

The second electrode 333 deposited on the third subpixel P3 can enter a space between the protrusion 283a of the third mask pattern 283 and the first light emitting layer 323 and then can be provided below the protrusion 283a of the third mask pattern 283 as shown in FIGS. 17 and 22. At this time, the second electrode 333 of the third subpixel P3 can be deposited below the protrusion 283a of the third mask pattern 283 at an area wider than the first light emitting layer 323. Therefore, the second electrode 333 of the third subpixel P3 can be connected to the second connection electrode 250.

The second electrode 333 of the third subpixel P3 is connected to the third connection electrode 255. The third connection electrode 255 can be a source electrode or a drain electrode of the third transistor. In this case, the second electrode 333 of the third pixel P3 is directly connected to the third connection electrode 255, whereby a third high potential voltage is applied to the second electrode 333 of the third subpixel P3. At this time, the second electrode 333 of the third subpixel P3 can be an anode electrode.

In the display device according to the third embodiment of the present disclosure, it is preferable that the second electrode 332 of the second subpixel P2 and the second electrode 333 of the third subpixel P3 are disconnected from each other without being in contact with each other. As described above, the second electrode 332 of the second subpixel P2 is a cathode electrode, and the second electrode 333 of the third subpixel P3 is an anode electrode. In this case, if the second electrode 332 of the second subpixel P2 and the second electrode 333 of the third subpixel P3 are in contact with each other, short occurs between the second electrode 332 of the second subpixel P2 and the second electrode 333 of the third subpixel P3, whereby the display device 100 is not driven normally.

Also, the second electrodes 331, 332 and 333 can be disconnected between the first subpixel P1 and the third subpixel P3 by the third mask pattern 283 and the first mask pattern 281.

If the second electrodes 331, 332 and 333 are deposited on the entire surface, the second electrode 333 can enter a space between the protrusion 283a of the third mask pattern 283 and the first light emitting layer 323 and then can be provided below the protrusion 283a of the third mask pattern 283 as shown in FIGS. 18 and 22.

At this time, the second electrode 333 of the third subpixel P3 can be deposited below the protrusion 283a of the third mask pattern 283 at an area wider than the first light emitting layer 323. The second electrode 331 deposited on the first subpixel P1 can enter a space between the protrusion 2831 of the first mask pattern 281 and the first light emitting layer 321 and then can be provided below the protrusion 2831 of the first mask pattern 281 as shown in FIGS. 18 and 23.

At this time, the second electrode 331 of the first subpixel P1 can be deposited below the protrusion 281a of the first mask pattern 281 at an area wider than the first light emitting layer 321. Therefore, the second electrode 331 of the first subpixel P1 can be connected to the first power line 241.

Since the second electrode 331 of the first subpixel P1 is connected to the first power line 241, the second electrode 331 and the third electrode 350 can electrically be connected with each other through the first power line 241 and the auxiliary power line 360. For this reason, if a low potential voltage is applied to the third electrode 350, the same low potential voltage as the third electrode 350 can be applied to the second electrode 331 of the first subpixel P1. At this time, the second electrode 331 of the first subpixel P1 can be a cathode electrode.

The second electrodes 331, 332 and 333 can be formed of a transparent conductive material (TCO) such as ITO and IZO, which can transmit light, or a semi-transmissive conductive material such as Mg, Ag, or an alloy of Mg and Ag.

The second light emitting layer 340 is provided on the second electrodes 331, 332 and 333. The second light emitting layer 340 can include a hole transporting layer, a light emitting layer, and an electron transporting layer. In this case, holes and electrons of the second light emitting layer 340 respectively move to the light emitting layer through the hole transporting layer and the electron transporting layer, and are combined with each other in the light emitting layer to emit light of a predetermined color.

The second light emitting layer 340 can be any one of, but not limited to, a red light emitting layer for emitting red light, a green light emitting layer for emitting green light, a blue light emitting layer for emitting blue light, and a yellow light emitting layer for emitting yellow light.

However, the second light emitting layer 340 can emit light of a color different from those of the first light emitting layers 321, 322 and 323. If the first light emitting layers 321, 322 and 323 are light emitting layers for emitting light of a first color, the second light emitting layer 340 can be a light emitting layer for emitting light of a second color different from the first color. For example, the first light emitting layers 321, 322 and 323 can be yellow light emitting layers for emitting yellow light, and the second light emitting layer 340 can be a blue light emitting layer for emitting blue light.

Unlike the first light emitting layers 321, 322 and 323, the second light emitting layer 340 is connected among the first subpixel P1, the second subpixel P2 and the third subpixel P3. The second light emitting layer 340 can be formed to partially fill the spaces between the mask patterns 281, 282 and 283 and the second electrodes 331, 332 and 333. At this time, an air gap AG can be formed in a space where the second light emitting layer 340 is not filled between the mask patterns 281, 282 and 283 and the second electrodes 331, 332 and 333.

The third electrode 350 is provided on the second light emitting layer 340. The third electrode 350 can be formed of a transparent metal material, a semi-transmissive metal material, or a metal material with high reflexibility. If the display device 100 is formed in a bottom emission type, the third electrode 350 can be formed of a metal material with high reflexibility such as a deposited structure (Ti/Al/Ti) of Al and Ti, a deposited structure (ITO/Al/ITO) of Al and ITO, an Ag alloy, and a deposited structure (ITO/Ag alloy/ITO) of Ag alloy and ITO. The Ag alloy can be an alloy of Ag, Pd and Cu. If the display device 100 is formed in a top emission type, the third electrode 350 can be formed of a transparent conductive material (TCO) such as ITO and IZO, which can transmit light, or a semi-transmissive conductive material such as Mg, Ag, or an alloy of Mg and Ag. The third electrode 350 can be a cathode electrode.

The display device 100 according to the third embodiment of the present disclosure is characterized in that one of the first light emitting layers 321, 322 and 323 and the second light emitting layer 340 emits light in each of the first subpixels P1, P2 and P3.

In more detail, the first light emitting layer 321 of the first subpixel P1 emits light. Since the second electrode 331 of the first subpixel P1 is connected to the first power line 241, the second electrode 331 and the second electrode 350 are electrically connected with each other through the first power line 241 and the auxiliary power line 360. If a low potential voltage is applied to the third electrode 350, the same low potential voltage as the third electrode 350 is applied to the second electrode 331 of the first subpixel P1. Therefore, the second light emitting layer 340 provided between the second electrode 331 and the third electrode 350 of the first subpixel P1 does not emit light.

Meanwhile, in the first subpixel P1, if a first high potential voltage is applied to the first electrode 311 and a low potential voltage is applied to the second electrode 331, the first light emitting layer 321 provided between the first electrode 311 and the second electrode 331 emits light with predetermined brightness in accordance with a predetermined current.

In the second subpixel P2, the first light emitting layer 322 emits light. Since the second electrode 332 of the second subpixel P2 is connected to the second power line 242, the second electrode 332 and the third electrode 350 are electrically connected with each other through the second power line 242 and the auxiliary power line 360. If the low potential voltage is applied to the third electrode 350, the same low potential voltage as the second electrode 350 is applied to the second electrode 332 of the second subpixel P2. Therefore, the second light emitting layer 340 provided between the second electrode 332 and the third electrode 350 of the second subpixel P2 does not emit light.

Meanwhile, in the second subpixel P2, if a second high potential voltage is applied to the first electrode 312 and a low potential voltage is applied to the second electrode 332, the first light emitting layer 322 provided between the first electrode 312 and the second electrode 332 emits light with predetermined brightness in accordance with a predetermined current.

That is, in the first subpixel P1 and the second subpixel P2, the first light emitting layers 321 and 322 emit light of the same color. The display device according to the third embodiment of the present disclosure can further comprise a color filter to emit light of different colors from the first subpixel P1 and the second subpixel P2.

The color filter can include a first color filter arranged to correspond to the first subpixel P1 and a second color filter arranged to correspond to the second subpixel P2. The first color filter and the second color filter can transmit light of different colors.

For example, the first light emitting layers 321, 322 and 323 can be yellow light emitting layers for emitting yellow light. The first color filter can be a red color filter for transmitting red light, and the second color filter can be a green color filter for transmitting green light. Therefore, the first subpixel P1 can emit red light, and the second subpixel P2 can emit green light.

The color filter can be arranged below the first electrodes 311 and 312 or on the third electrode 350 in accordance with a light emission type of the display device 100. If the display device 100 is a bottom emission type, the color filter can be provided below the first electrodes 311 and 312. If the display device 100 is a top emission type, the color filter can be provided on the third electrode 350.

In the third subpixel P3, the second light emitting layer 340 emits light. Since the first electrode 310 is not provided in the third subpixel P3, the first light emitting layer 323 does not emit light.

Meanwhile, in the third subpixel P3, the second electrode 333 is connected to the third connection electrode 255, whereby a third high potential voltage is applied to the second electrode 333. If a low potential voltage is applied to the third electrode 350, the second light emitting layer 340 provided between the second electrode 333 and the third electrode 350 emits light with predetermined brightness in accordance with a predetermined current.

For example, the third subpixel P3 can be a blue light emitting layer for emitting blue light. In this case, the display device 100 can embody a blue subpixel without providing a separate color filter in a position corresponding to the third subpixel P3.

As described above, in the display device 100 according to the third embodiment of the present disclosure, only the first light emitting layers 321, 322 and 323 emit light in the first subpixel P1 and the second subpixel P2, and only the second light emitting layer 340 can emit in the third subpixel P3. For this reason, in the display device 100 according to the third embodiment of the present disclosure, power consumption can remarkably be reduced as compared with the case that all of the first light emitting layers 321, 322 and 323 and the second light emitting layer 340 emit light in all the subpixels.

Also, in the display device 100 according to the third embodiment of the present disclosure, the first light emitting layers 321, 322 and 323 and the second light emitting layer 340 are provided on the entire surface of the subpixels P1, P2 and P3 without a mask. Therefore, in the display device 100 according to the third embodiment of the present disclosure, a problem according to the case that different light emitting layers are provided to be patterned for each of the subpixels P1, P2 and P3 using a mask can be solved.

Also, in the display device 100 according to the third embodiment of the present disclosure, the second electrodes 331, 332 and 333 can be disconnected among the subpixels P1, P2 and P3 by the mask patterns 281, 282 and 283. In the display device 100 according to the third embodiment of the present disclosure, the mask patterns 281, 282 and 283 are provided, and the first light emitting layers 321, 322 and 323 and the second electrodes 331, 332 and 333 are provided on the entire surface of the first substrate 111, on which the mask patterns 281, 282 and 283 are provided, without a mask. The first light emitting layers 321, 322 and 323 and the second electrodes 331, 332 and 333 are disconnected among the subpixels P1, P2 and P3 by the mask patterns 281, 282 and 283. Particularly, the second electrodes 331, 332 and 333 are connected to any one of the first power line 241, the second power line 242 and the third connection electrode 255 below the protrusions 281a, 282a and 283a of the mask patterns 281, 282 and 283.

Referring to FIG. 22, in the display device 100 according to the third embodiment of the present disclosure, a thickness T1 of the second insulating film 260 can be designed such that the second electrodes 331, 332 and 333 are disconnected among the subpixels P1, P2 and P3 and the second light emitting layer 340 is connected without being disconnected among the subpixels P1, P2 and P3. At this time, the thickness T1 of the second insulating film 260 can correspond to a spaced distance between the protrusions 281a, 282a and 283a of the mask patterns 281, 282 and 283 and any one of the first power line 241, the second power line 242 and the third connection electrode 255.

The thickness T1 of the second insulating film 260 can be designed to be greater than a sum of a thickness T3 of the first light emitting layers 321, 322 and 323 and a thickness T2 of the second electrodes 331, 332 and 333. Therefore, in the display device 100 according to the third embodiment of the present disclosure, the second electrodes 331, 332 and 333 can be prevented from being connected with one another among the subpixels P1, P2 and P3.

The thickness T1 of the second insulating film 260 can be designed to be smaller than a sum of the thickness T3 of the second electrodes 331, 332 and 333, a thickness T2 of the second electrodes 331, 332 and 333 and a thickness T3 of the second light emitting layer 340. Therefore, in the display device 100 according to the third embodiment of the present disclosure, the second light emitting layer 340 can be prevented from being disconnected among the subpixels P1, P2 and P3.

Meanwhile, in the display device 100 according to the third embodiment of the present disclosure, a length L1 of the protrusions 281a, 282a and 283a of the mask patterns 281, 282 and 283 can properly be designed. If the length L1 of the protrusions 281a, 282a and 283a of the mask patterns 281, 282 and 283 becomes too long, the protrusions 281a, 282a and 283a of the mask patterns 281, 282 and 283 can sag down due to a weight. In this case, a space enough to form the first light emitting layers 321, 322 and 323 and the second electrodes 331, 332 and 333 below the protrusions 281a, 282a and 283a of the mask patterns 281, 282 and 283 may not be ensured.

Meanwhile, if the length L1 of the protrusions 281a, 282a and 283a of the mask patterns 281, 282 and 283 becomes too short, a contact area between the second electrodes 331, 332 and 333 and any one of the first power line 241, the second power line 242 and the third connection electrode 255 can be reduced. In this case, resistance between the second electrodes 331, 332 and 333 and any one of the first power line 241, the second power line 242 and the third connection electrode 255 can be increased.

Also, in the display device 100 according to the third embodiment of the present disclosure, the first electrode 310 is not provided on the third subpixel P3. Therefore, in the display device 100 according to the third embodiment of the present disclosure, transmittance in the third subpixel P3 can be improved. Particularly, if the display device 100 is provided in a bottom emission type, since light emitted from the second light emitting layer 340 of the third subpixel P3 may not pass through the first electrodes 311 and 312, light efficiency can be improved.

Meanwhile, although FIG. 17 illustrates that the planarization film 270 is provided in all of the first to third subpixels P1, P2 and P3, the planarization film 270 is not limited to the example of FIG. 17. In another embodiment, the planarization film 270 can be provided in only the first and second subpixels P1 and P2 as shown in FIG. 25. That is, in the display device 100 according to the modified embodiment of the present disclosure, the planarization film 270 may not be provided in the third subpixel P3. Therefore, in the display device 100 according to the modified embodiment of the present disclosure, transmittance in the third subpixel P3 can be more improved. Particularly, if the display device 100 is provided in a bottom emission type, since light emitted from the second light emitting layer 340 of the third subpixel P3 may not pass through the first electrodes 311 and 312 and the planarization film 270, light loss can be reduced and light efficiency can be more improved.

Moreover, although FIG. 17 illustrates that the second insulating film 260 is provided in all of the first to third subpixels P1, P2 and P3, the second insulating film 260 is not limited to the example of FIG. 17. In another embodiment, the second insulating film 260 and the planarization film 270 can be provided in only the first and second subpixels P1 and P2 as shown in FIG. 26. That is, in the display device 100 according to another modified embodiment of the present disclosure, the second insulating film 260 and the planarization film 270 may not be provided in the third subpixel P3. Therefore, in the display device 100 according to another modified embodiment of the present disclosure, transmittance in the third subpixel P3 can be maximized. If the display device 100 is provided in a bottom emission type, since light emitted from the second light emitting layer 340 of the third subpixel P3 may not pass through the first electrodes 311 and 312, the second insulating film 260 and the planarization film 270, light loss can be minimized and light efficiency can be maximized.

Also, in the display device 100 according to the third embodiment of the present disclosure, the bank 315 is not provided in the third subpixel P3. Since the first electrode 310 is not provided in the third subpixel P3, the bank 315 covering the ends of the first electrode 310 may not be provided. Therefore, in the display device 100 according to the third embodiment of the present disclosure, a light emitting area EA of the third subpixel P3 can be greater than those of the first subpixel P1 and the second subpixel P2. That is, the third subpixel P3 can have a light emitting area and an opening ratio, which are greater than those of the first subpixel P1 and the second subpixel P2.

Fourth Embodiment

Figure 27:
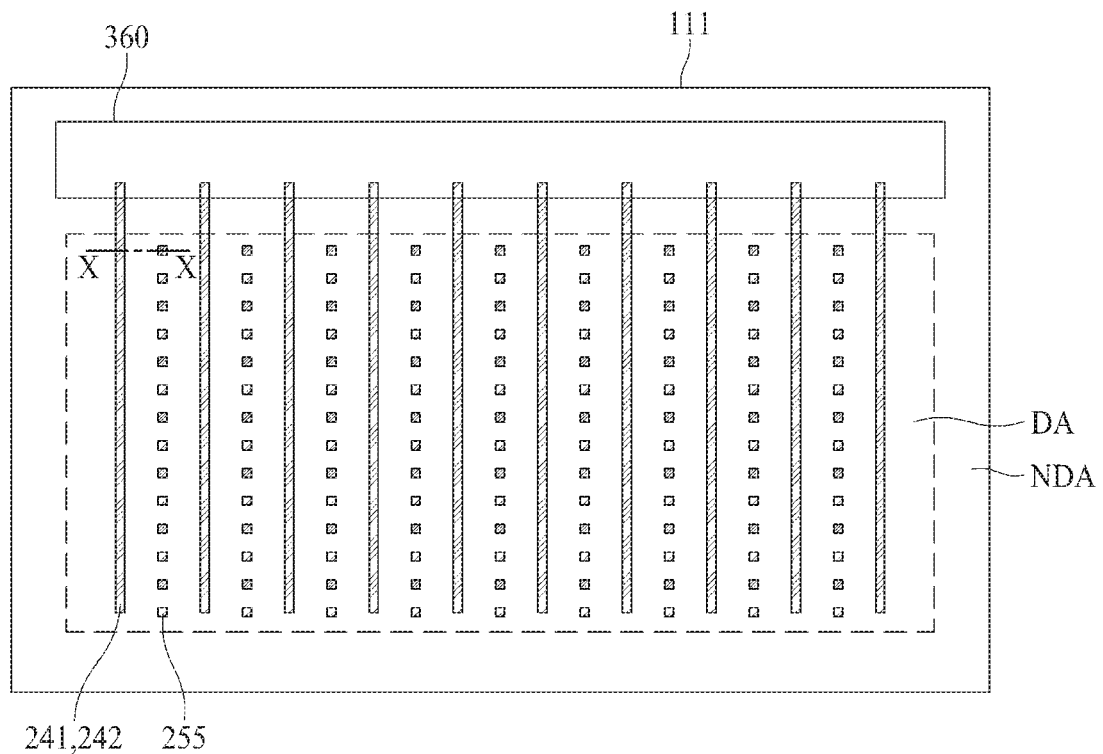
FIG. 27 is a plane view briefly illustrating a first substrate of a display panel according to the fourth embodiment of the present disclosure.
Figure 28:
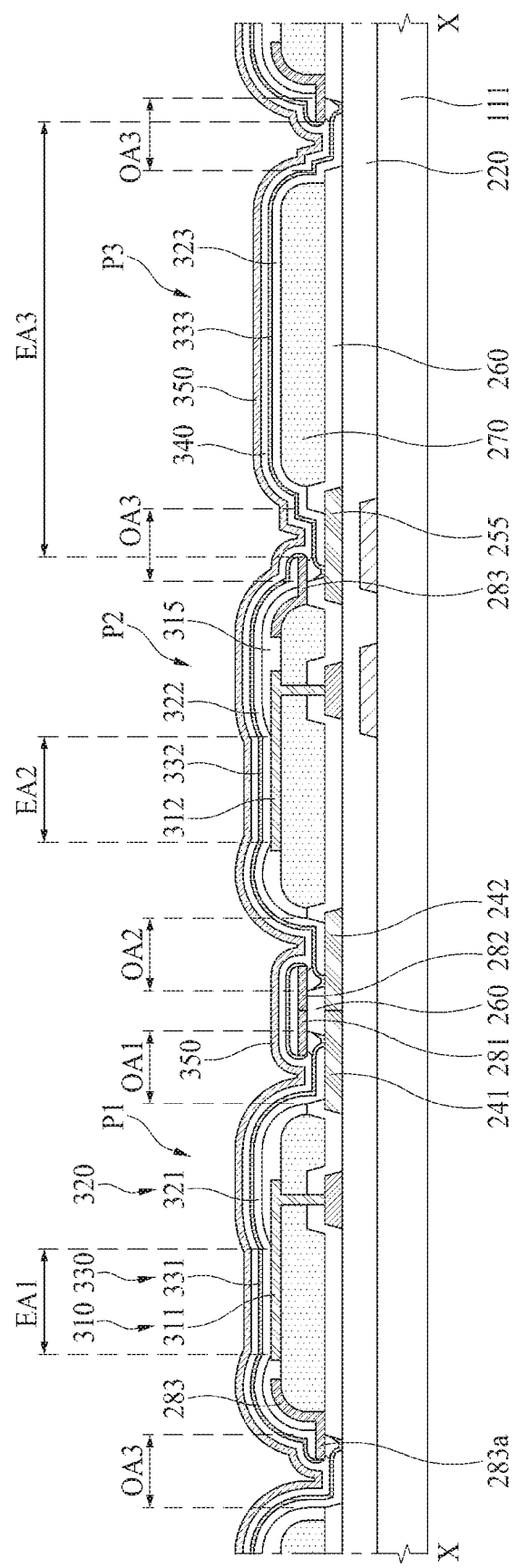
FIG. 28 is a cross-sectional view illustrating an example taken along line X-X of FIG. 27.
Figure 29:
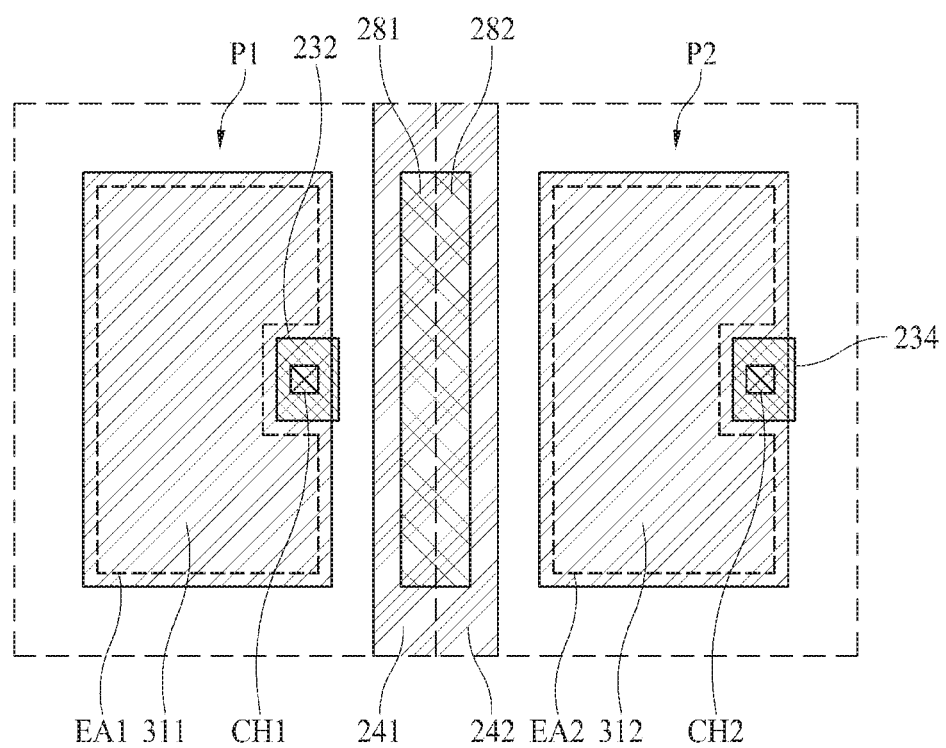
FIG. 29 is a plane view briefly illustrating an example of a first subpixel and a second subpixel.

FIG. 27 is a plane view briefly illustrating a first substrate of a display panel according to the fourth embodiment of the present disclosure, FIG. 28 is a cross-sectional view illustrating an example taken along line X-X of FIG. 27, and FIG. 29 is a plane view briefly illustrating an example of a first subpixel and a second subpixel.

Referring to FIGS. 27 to 29, the display panel 110 according to the fourth embodiment of the present disclosure comprises a first substrate 111, a light-shielding layer 210, a first insulating film 220, a driving transistor 230, first connection electrodes 241, 242 and 360, a third connection electrode 255, a second insulating film 260, a planarization film 270, mask patterns 281, 282 and 283, first electrodes 311 and 312, a bank 315, first light emitting layers 321, 322 and 323, second electrodes 331, 332 and 333, a second light emitting layer 340, and a third electrode 350.

The display panel 110 according to the fourth embodiment of the present disclosure is different from the display panel 110 according to the third embodiment of the present disclosure shown in FIGS. 16 to 24 in that the first power line 241 and the second power line 242 of the first connection electrode are formed in a single body. Therefore, elements except the first connection electrodes 241, 242 and 360 and the mask patterns 281, 282 and 283 of the display panel 110 according to the fourth embodiment of the present disclosure are substantially the same as the elements of the display panel 110 according to the third embodiment of the present disclosure. Hereinafter, a detailed description of the first substrate 111, the light-shielding layer 210, the first insulating film 220, the driving transistor 230, the second insulating film 260, the planarization film 270, the third connection electrode 255, the first electrodes 311 and 312, the bank 315, the first light emitting layers 321, 322 and 323, the second electrodes 331, 332 and 333, the second light emitting layer 340, and the third electrode 350 of the display panel 110 according to the fourth embodiment of the present disclosure will be omitted.

The first connection electrodes 241, 242 and 360 are provided on the first substrate 111.

The first connection electrodes 241, 242 and 360 electrically connect the second electrodes 331 and 332 and the third electrode 350 of the first subpixel P1 and the second subpixel P2 with each other. In more detail, the first connection electrodes 241, 242 and 360 can include a first power line 241, a second power line 242 and an auxiliary power line 360.

The auxiliary power line 360 is provided to be extended from the non-display area NDA to a first direction (e.g., X-axis direction). The auxiliary power line 360 can partially be exposed without being covered by the first insulating film 220, the second insulating film 260 and the planarization film 270, and can be connected with the third electrode 350 at the exposed area.

The first power line 241 is arranged between the first subpixel P1 and the second subpixel P2 in the display area DA and then connected with the second electrode 331 of the first subpixel P1. The second power line 242 is arranged between the first subpixel P1 and the second subpixel P2 in the display area DA and then connected with the second electrode 332 of the second subpixel P2. At this time, in the display device 100 according to the fourth embodiment of the present disclosure, the first power line 241 and the second power line 242 are formed in a single body.

The first power line 241 and the second power line 242 can be provided to be extended from the display area DA to a second direction (Y-axis direction). One ends of the first power line 241 and the second power line 242 are connected to the auxiliary power line 360. At this time, the first power line 241 and the second power line 242 can be connected to, but not limited to, the auxiliary power line 360 through a contact hole.

Each of the first power line 241 and the second power line 242 can be formed of the same material as that of any one of the active layer, the gate electrode, the source electrode and the drain electrode of the driving transistor 230 on the same layer as any one of them.

In accordance with the aforementioned description, the second electrode 331 and the third electrode 350 of the first subpixel P1 are electrically connected with each other through the first power line 241, the second power line 242 and the auxiliary power line 360. That is, if a low potential voltage is applied to the third electrode 350, the same low potential voltage as the third electrode 350 is applied to the second electrode 331 of the first subpixel P1.

The second electrode 332 and the third electrode 350 of the second subpixel P2 are electrically connected with each other through the first power line 241, the second power line 242 and the auxiliary power line 360. That is, if a low potential voltage is applied to the third electrode 350, the same low potential voltage as the third electrode 350 is applied to the second electrode 332 of the second subpixel P2.

The mask patterns 281, 282 and 283 are provided on the second insulating film 260 to partially cover the opening areas OA1, OA2 and OA3 of the second insulating film 260. The mask patterns 281, 282 and 283 include a first mask pattern 281, a second mask pattern 282, and a third mask pattern 283. Since the third mask pattern 283 is substantially the same as the third mask pattern 283 of the display panel 110 according to the third embodiment of the present disclosure shown in FIGS. 16 to 24, its detailed description will be omitted.

The first mask pattern 281 is provided between the first subpixel P1 and the second subpixel P2. Particularly, the first mask pattern 281 is provided on the second insulating film 260 provided between the first opening area OA1 for partially exposing the first power line 241 and the second opening area OA2 for partially exposing the second power line 242.

The first mask pattern 281 includes a protrusion 281a protruded to partially cover the first opening area OA1. At this time, the protrusion 281a of the first mask pattern 281 is spaced apart from the first power line 241 to form a space with the first power line 241.

The first mask pattern 281 can be protruded such that the protrusion 281a is headed for the first subpixel P1 from the second subpixel P2. Therefore, a partial area of the first opening area OA1, which is adjacent to the second subpixel P2, is covered by the first mask pattern 281, and the first power line 241 is also covered by the first mask pattern 281. The other area of the first opening area OA1, which is adjacent to the first subpixel P1, still exposes the first power line 241.

The first mask pattern 281 can be provided along the first power line 241 in the same manner as the first opening area OA1. At this time, the first mask pattern 281 can be provided on the first power line 241 in a plurality of patterns having a predetermined length along a second direction (Y-axis direction). However, without limitation to this example, the first mask pattern 281 can be provided on one first power line 241 in one line pattern extended in the second direction (Y-axis direction).

Meanwhile, the first mask pattern 281 can be formed of, but not limited to, the same material as that of the first electrodes 311, 312 and 313 on the same layer as the first electrodes 311, 312 and 313.

The second mask pattern 282 is provided between the first subpixel P1 and the second subpixel P2. Particularly, the second mask pattern 282 is provided on the second insulating film 260 provided between the first opening area OA1 for partially exposing the first power line 241 and the second opening area OA2 for partially exposing the second power line 242. At this time, in the display device 100 according to the fourth embodiment of the present disclosure, the first mask pattern 281 and the second mask pattern 282 can be formed in a single body.

The second mask pattern 282 includes a protrusion 282a protruded to partially cover the second opening area OA2. At this time, the protrusion 282a of the second mask pattern 282 is spaced apart from the second power line 242 to form a space with the second power line 242.

The second mask pattern 282 can be protruded such that the protrusion 282a is headed for the second subpixel P2 from the first subpixel P1. Therefore, a partial area of the second opening area OA2, which is adjacent to the first subpixel P1, is covered by the second mask pattern 282, and the second power line 242 is also covered by the second mask pattern 282. The other area of the second opening area OA2, which is adjacent to the second subpixel P2, still exposes the second power line 242.

The second mask pattern 282 can be provided along the second power line 242 in the same manner as the second opening area OA2. At this time, the second mask pattern 282 can be provided on the second power line 242 in a plurality of patterns having a predetermined length along a second direction (Y-axis direction). However, without limitation to this example, the second mask pattern 282 can be provided on one second power line 242 in one line pattern extended in the second direction (Y-axis direction).

Meanwhile, the second mask pattern 282 can be formed of, but not limited to, the same material as that of the first electrodes 311 and 312 on the same layer as the first electrodes 311 and 312.

Figure 30:
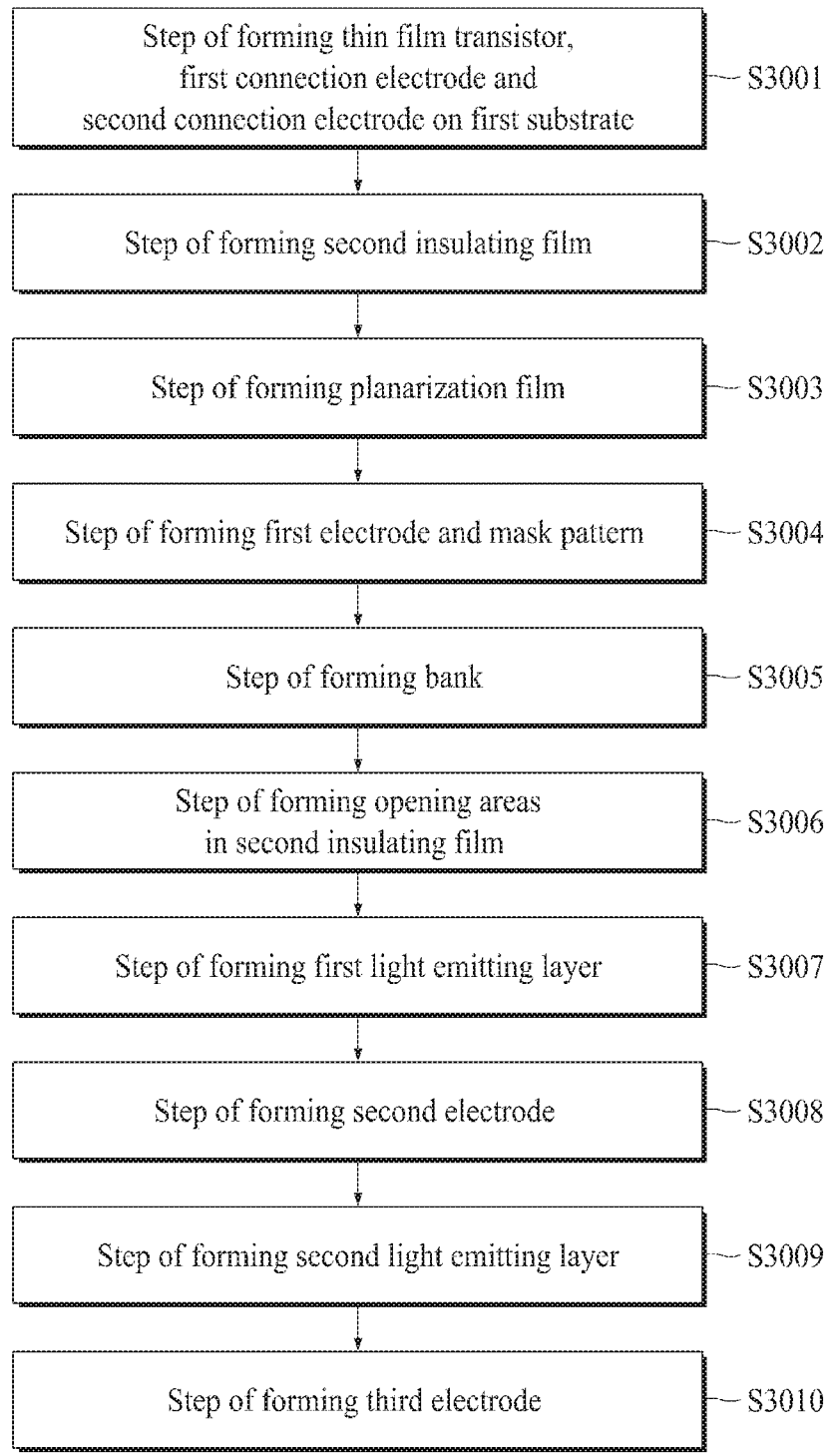
FIG. 30 is a flow chart illustrating a method for manufacturing a display device according to the first embodiment of the present disclosure.

FIG. 30 is a flow chart illustrating a method for manufacturing a display device according to the first embodiment of the present disclosure, and FIGS. 31A to 31J are cross-sectional views illustrating a method for manufacturing a display device according to the first embodiment of the present disclosure.

Figure 31A:
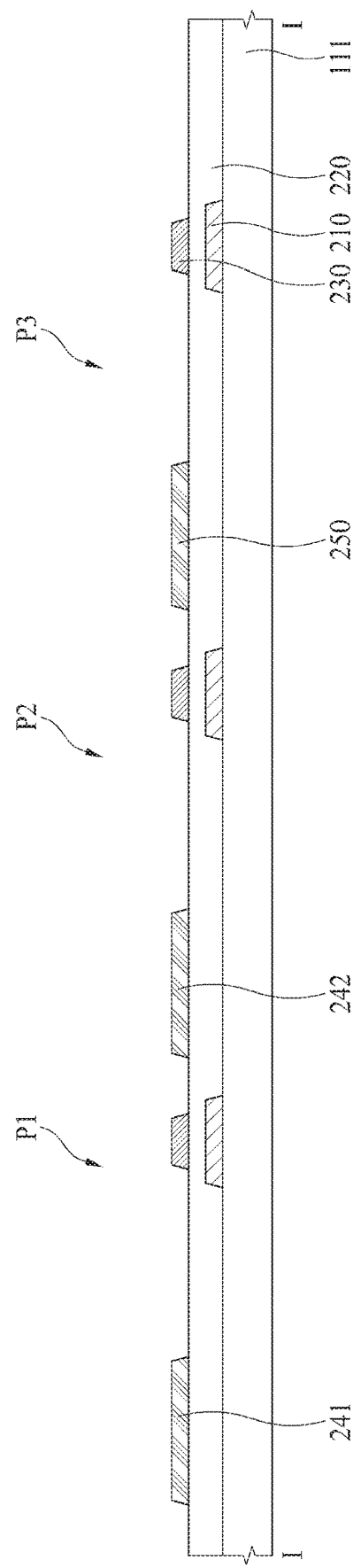
FIGS. 31A to 31J are cross-sectional views illustrating a method for manufacturing a display device according to the first embodiment of the present disclosure.

First of all, as shown in FIG. 31A, the driving transistor 230, the first connection electrodes 241, 242 and 360 and the second connection electrode 250 are formed on the first substrate 111 (S3001).

In more detail, the light-shielding layer 210 is formed on the first substrate 111. The light-shielding layer 210 is to shield external light entering the active layer of the driving transistor 230 to be arranged for each of the subpixels P1, P2 and P3, and is formed in a position corresponding to the active layer of the driving transistor 230. The light-shielding layer 210 can be formed of a metal material. If the light-shielding layer 210 is formed of a metal material, the auxiliary power line 360 can be formed of the same material as that of the light-shielding layer 210 on the same layer as the light-shielding layer 210 on the first substrate 111.

Then, the first insulating film 220 is formed on the light-shield layer 210. The first insulating film 220 can be formed of an inorganic film, for example, a silicon oxide (SiOx) film, a silicon nitride (SiNx) film or a multi-layered film of the silicon oxide film and the silicon nitride film.

Then, the driving transistor 230, the first power line 241, the second power line 242 and the second connection electrode 250 are formed on the first insulating film 220.

The active layer is formed on the first insulating film 220. The active layer can be formed of a silicon based semiconductor material or an oxide based semiconductor material.

The gate insulating film can be formed on the active layer. The gate insulating film can be formed of an inorganic film, for example, a silicon oxide film, a silicon nitride film or a multi-layered film of the silicon oxide film and the silicon nitride film.

The gate electrode can be formed on the gate insulating film. The gate electrode can be, but not limited to, a single layer or multi-layer comprised of any one of Mo, Al, Cr, Au, Ti, Ni, Nd and Cu or their alloy.

The inter-layer dielectric film can be formed on the gate electrode. The inter-layer dielectric film can be formed of an inorganic film, for example, a silicon oxide film, a silicon nitride film, or a multi-layered film of the silicon oxide film and the silicon nitride film.

The source electrode and the drain electrode can be formed on the inter-layer dielectric film. Each of the source electrode and the drain electrode can be connected to the active layer through the contact hole that passes through the gate insulating film and the inter-layer dielectric film. Each of the source electrode and the drain electrode can be, but not limited to, a single layer or multi-layer comprised of any one of Mo, Al, Cr, Au, Ti, Ni, Nd and Cu or their alloy.

Meanwhile, the first power line 241, the second power line 242 and the second connection electrode 250 can be formed of the same material as that of the source electrode and the drain electrode on the same layer as the source electrode and the drain electrode.

Figure 31B:
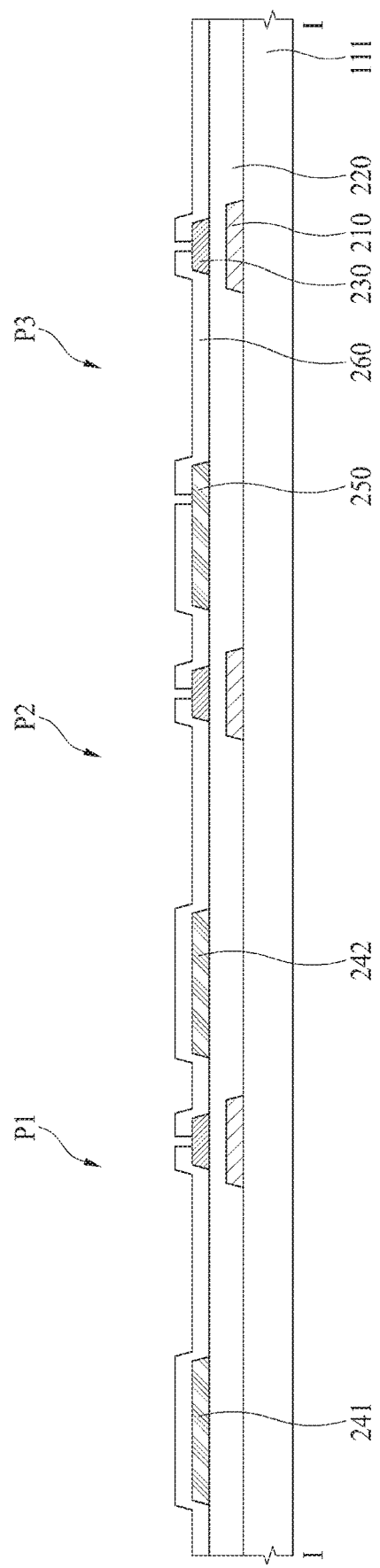

Next, the second insulating film 260 is formed as shown in FIG. 31B (S3002).

In more detail, the second insulating film 260 is formed on the driving transistor 230, the first connection electrodes 241, 242 and 360, and the second connection electrode 250

Although the contact hole which partially exposes the source electrode or the drain electrode of the driving transistor 230 can be formed in the second insulating film 260, formation of the contact hole is not limited to this case. The contact hole can be formed through a later process.

The second insulating film 260 can be formed of an inorganic film, for example, a silicon oxide film, a silicon nitride film or a multi-layered film of the silicon oxide film and the silicon nitride film.

Figure 31C:
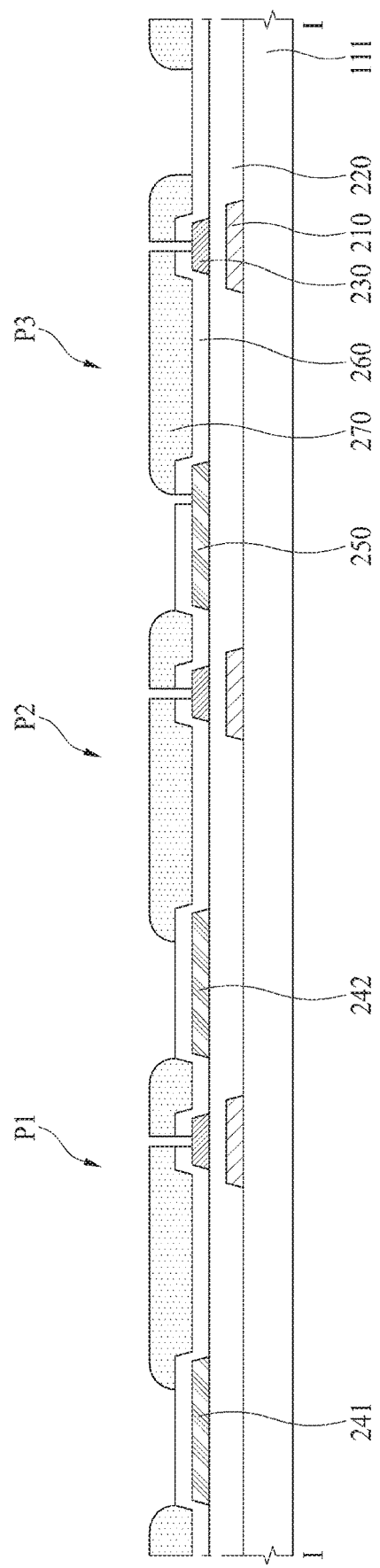

Next, the planarization film 270 is formed as shown in FIG. 31C (S3003).

In more detail, the planarization film 270 is formed on the second insulating film 260. The planarization film 270 planarizes the step difference due to the driving transistor 230. The planarization film 270 can be patterned to partially expose the second insulating film 260 arranged in the area where the first power line 241, the second power line 242 and the second connection electrode 250 are formed.

Although the contact hole which partially exposes the source electrode or the drain electrode of the driving transistor 230 can be formed in the planarization film 270, formation of the contact hole is not limited to this case. The contact hole can be formed through a later process.

The planarization film 270 can be formed of an organic film such as acrylic resin, epoxy resin, phenolic resin, polyamide resin, and polyimide resin.

Figure 31D:
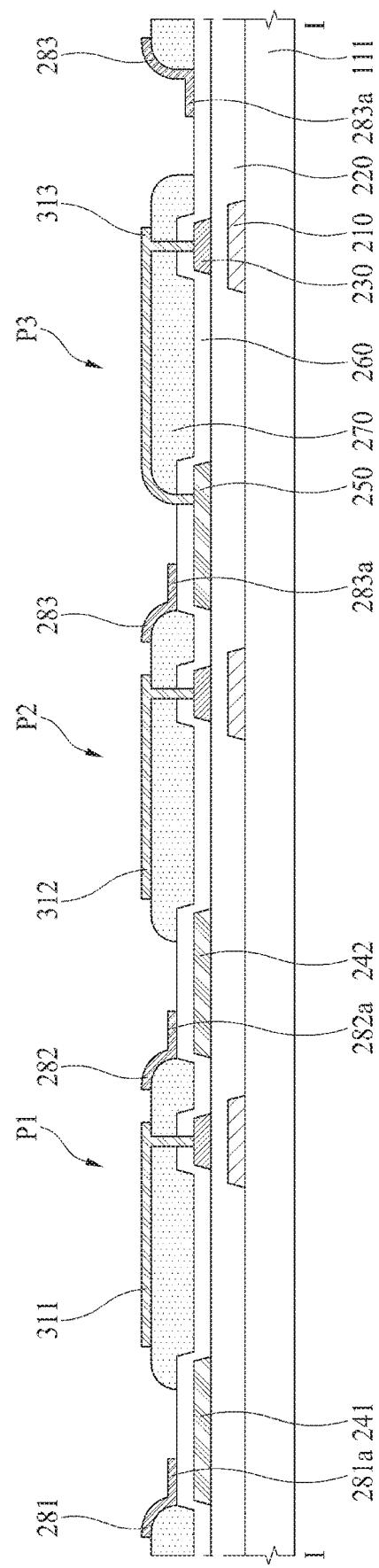

Next, the first electrodes 311, 312 and 313 and the mask patterns 281, 282 and 283 are formed as shown in FIG. 31D (S3004).

In more detail, the first electrodes 311, 312 and 313 are formed on the planarization film 270 for each of the sub-pixels P1, P2 and P3. The first electrodes 311, 312 and 313 are connected to the source electrode or the drain electrode of the driving transistor 230 through the contact hole.

The first electrodes 311, 312 and 313 can be formed of a transparent metal material, a semi-transmissive metal material, or a metal material with high reflexibility. If the display device 100 is formed in a bottom emission type, the first electrodes 311, 312 and 313 can be formed of a transparent conductive material (TCO) such as ITO and IZO, which can transmit light, or a semi-transmissive conductive material such as Mg, Ag, or an alloy of Mg and Ag. If the display device 100 is formed in a top emission type, the first electrodes 311, 312 and 313 can be formed of a metal material with high reflexibility such as a deposited structure (Ti/Al/Ti) of Al and Ti, a deposited structure (ITO/Al/ITO) of Al and ITO, an Ag alloy, and a deposited structure (ITO/Ag alloy/ITO) of Ag alloy and ITO. The Ag alloy can be an alloy of Ag, Pd and Cu. The first electrodes 311, 312 and 313 can be anode electrodes.

The mask patterns 281, 282 and 283 are formed on the planarization film 270 to be spaced apart from the first electrodes 311, 312 and 313. The mask patterns 281, 282 and 283 are also formed on a partial portion of the second insulating film 260 exposed without being covered by the planarization film 270.

The mask patterns 281, 282 and 283 can be formed of the same material as that of the first electrodes 311, 312 and 313 simultaneously with the first electrodes 311, 312 and 313.

Figure 31E:
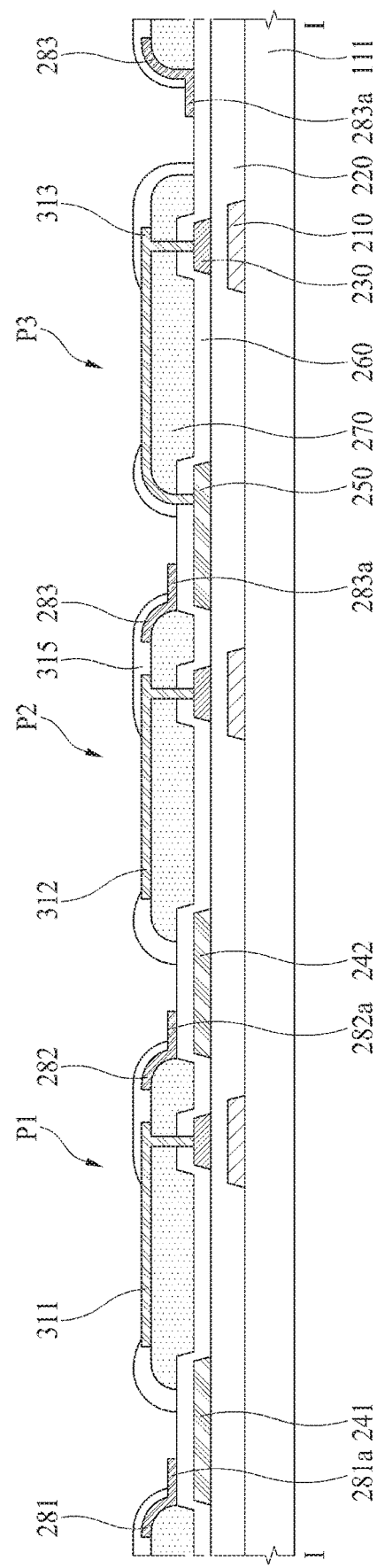

Next, the bank 315 is formed as shown in FIG. 31E (S3005).

In more detail, the bank 315 is formed to cover ends of each of the first electrodes 311, 312 and 313. The bank 315 can be patterned to expose a partial portion of the second insulating film 260 and the mask patterns 281, 282 and 283, which are arranged in the area where the first power line 241, the second power line 242 and the second connection electrode 250 are formed.

Figure 31F:
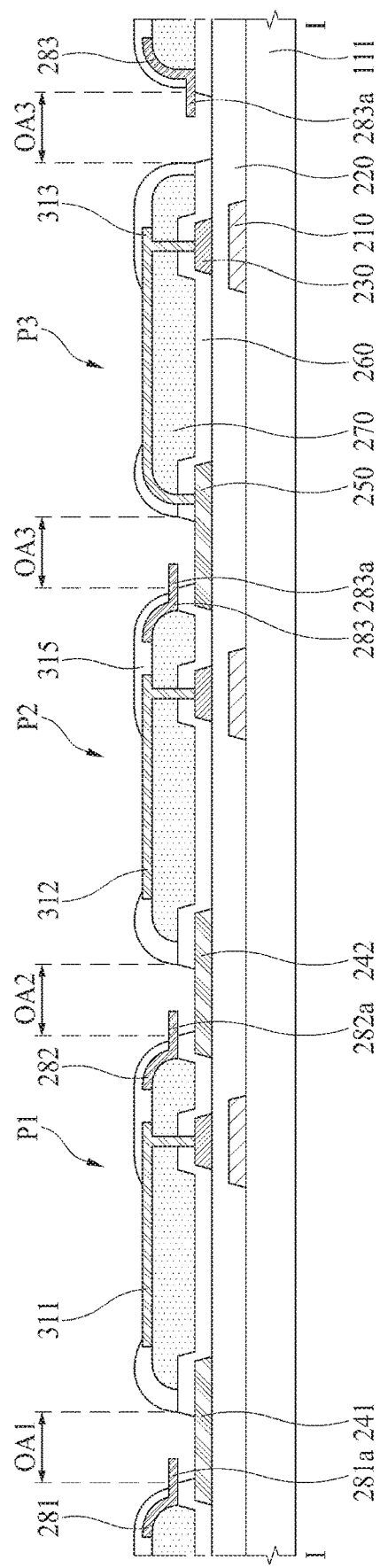

Next, the opening areas OA1, OA2 and OA3 are formed in the second insulating film 260 as shown in FIG. 31F (S1106).

In more detail, the opening area OA1, OA2 and OA3 are formed in the second insulating film 260 by an etching process. At this time, the etching process can be a wet etching process, and an etching solution which can etch the second insulating film 260 but cannot etch the mask patterns 281, 282 and 283 can be applied to the etching process. Therefore, an undercut structure can be formed in which the mask patterns 281, 282 and 283 are not etched and the exposed second insulating film 260 is only etched.

The first opening area OA1 for partially exposing the first power line 241, the second opening area OA2 for partially exposing the second power line 242, and the third opening area OA3 for partially exposing the second connection electrode 250 can be formed in the second insulating film 260 through the etching process.

Figure 31G:
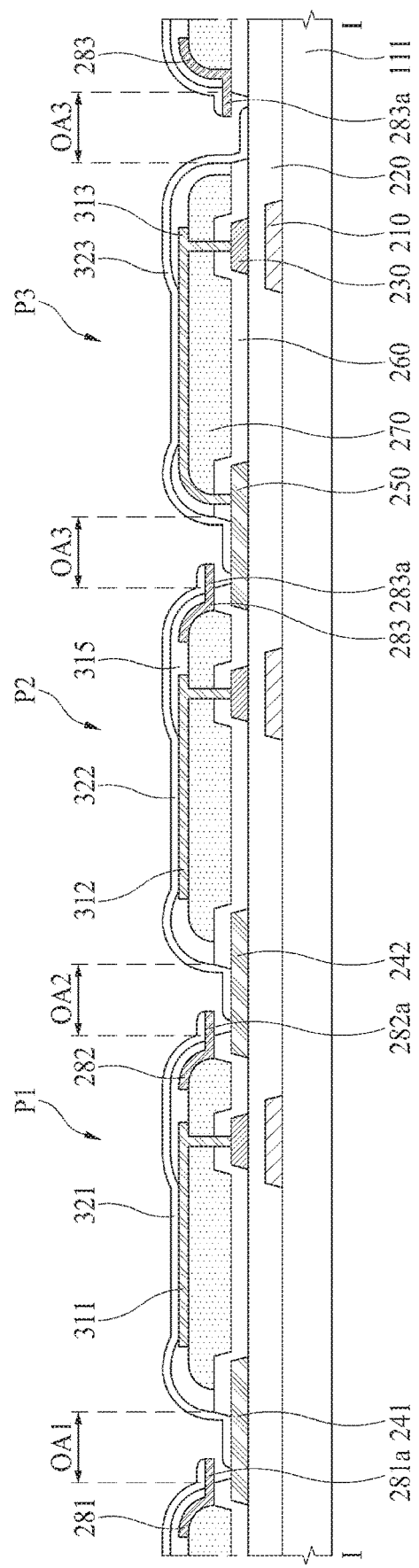

Next, the first light emitting layers 321, 322 and 323 are formed as shown in FIG. 31G (S3007).

In more detail, the first light emitting layers 321, 322 and 323 are formed on the first electrodes 311, 312 and 313 and the mask patterns 281, 282 and 283. The first light emitting layers 321, 322 and 323 can be formed by a deposition process or a solution process. If the first light emitting layers 321, 322 and 323 are formed by the deposition process, the first light emitting layers 321, 322 and 323 can be formed using an evaporation method.

The first light emitting layers 321, 322 and 323 are disconnected among the first subpixel P1, the second subpixel P2 and the third subpixel P3 by the mask patterns 281, 282 and 283. The first light emitting layers 321, 322 and 323 can be disconnected on the mask patterns 281, 282 and 283. Also, the first light emitting layers 321, 322 and 323 can enter a space formed below the mask patterns 281, 282 and 283 and then can be formed below the mask patterns 281, 282 and 283.

Each of the first light emitting layers 321, 322 and 323 can be any one of, but not limited to, a red light emitting layer for emitting red light, a green light emitting layer for emitting green light, a blue light emitting layer for emitting blue light, and a yellow light emitting layer for emitting yellow light.

Figure 31H:
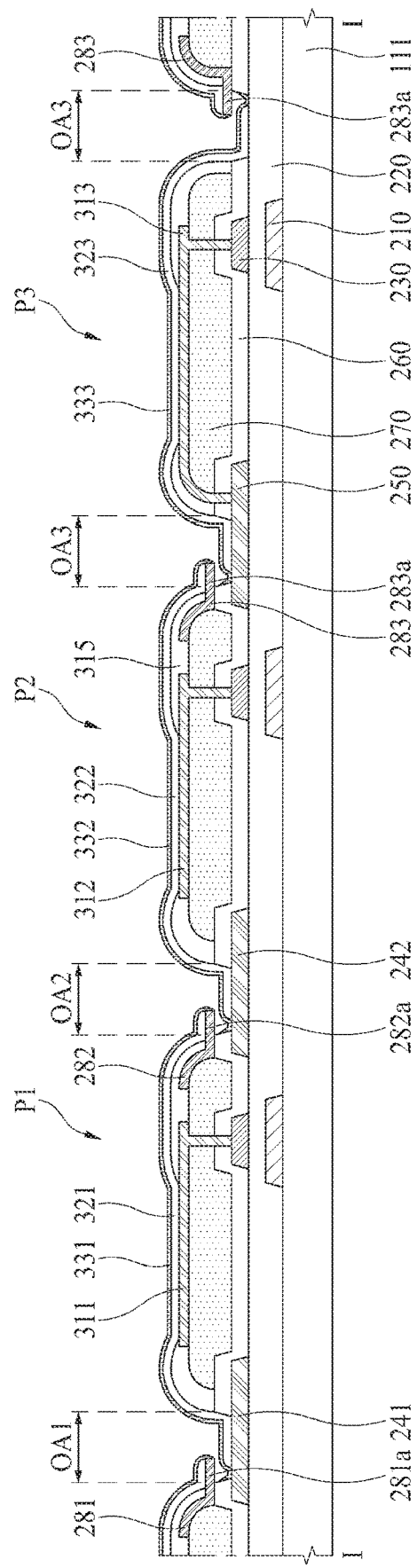

Next, the second electrodes 331, 332 and 333 are formed as shown in FIG. 31H (S3008).

In more detail, the second electrodes 331, 332 and 333 are formed on the first light emitting layers 321, 322 and 323. The second electrodes 331, 332 and 333 are disconnected among the first subpixel P1, the second subpixel P2 and the third subpixel P3 by the mask patterns 281, 282 and 283. The second electrodes 331, 332 and 333 can be disconnected on the mask patterns 281, 282 and 283. Also, the second electrodes 331, 332 and 333 can enter a space formed below the mask patterns 281, 282 and 283 and then can be formed below the mask patterns 281, 282 and 283.

The second electrodes 331, 332 and 333 can be formed using a physics vapor deposition such as sputtering. A film formed by the physics vapor deposition such as sputtering has excellent step coverage characteristics. Therefore, the second electrodes 331, 332 and 333 can be formed at an area wider than the first light emitting layers 321, 322 and 333 formed using evaporation. As a result, the second electrodes 331, 332 and 333 can be connected to any one of the first power line 241, the second power line 242 and the second connection electrode 250 below the mask patterns 281, 282 and 283.

The second electrodes 331, 332 and 333 can be formed of a transparent conductive material (TCO) such as ITO and IZO, which can transmit light, or a semi-transmissive conductive material such as Mg, Ag, or an alloy of Mg and Ag.

Figure 31I:
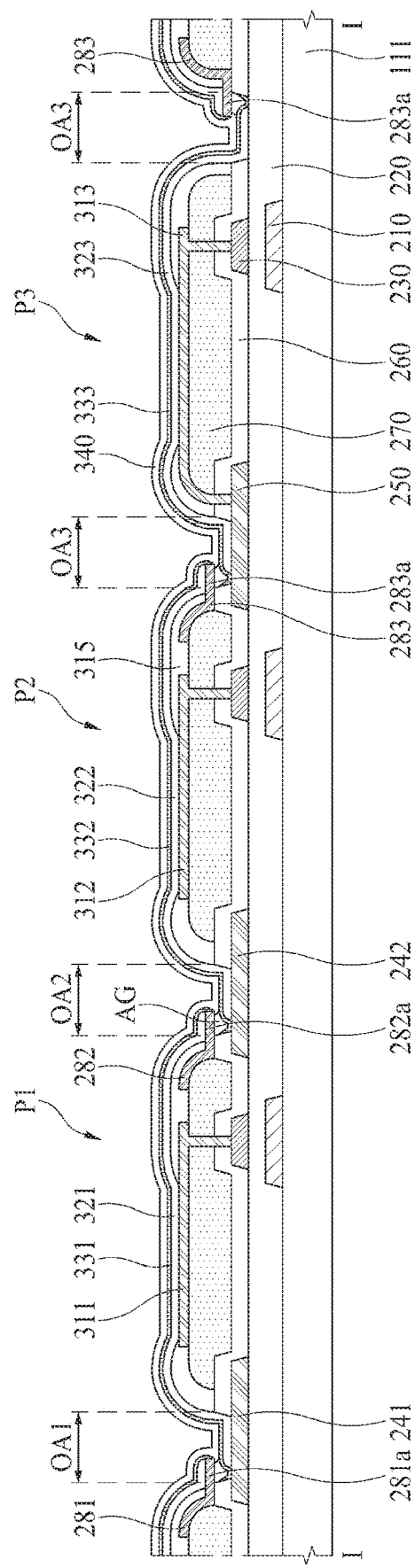

Next, the second light emitting layer 340 is formed as shown in FIG. 31I (S3009).

In more detail, the second light emitting layer 340 is formed on the second electrodes 331, 332 and 333. The second light emitting layer 340 can be formed by a deposition process or a solution process. If the second light emitting layer 340 is formed by the deposition process, the second light emitting layer 340 can be formed using an evaporation method.

The second light emitting layer 340 is connected among the first subpixel P1, the second subpixel P2 and the third subpixel P3. The second light emitting layer 340 can be formed to partially fill the space between the mask patterns 281, 282 and 283 and the second electrodes 331, 332 and 333. At this time, an air gap AG can be formed in a space where the second light emitting layer 340 is not filled between the mask patterns 281, 282 and 283 and the second electrodes 331, 332 and 333.

The second light emitting layer 340 can be any one of, but not limited to, a red light emitting layer for emitting red light, a green light emitting layer for emitting green light, a blue light emitting layer for emitting blue light, and a yellow light emitting layer for emitting yellow light.

However, the second light emitting layer 340 can emit light of a color different from that of the first light emitting layers 321, 322 and 323. If the first light emitting layers 321, 322 and 323 are light emitting layers for emitting light of a first color, the second light emitting layer 340 can be a light emitting layer for emitting light of a second color different from the first color. For example, the first light emitting layers 321, 322 and 323 can be yellow light emitting layers for emitting yellow light, and the second light emitting layer 340 can be a blue light emitting layer for emitting blue light.

Figure 31J:
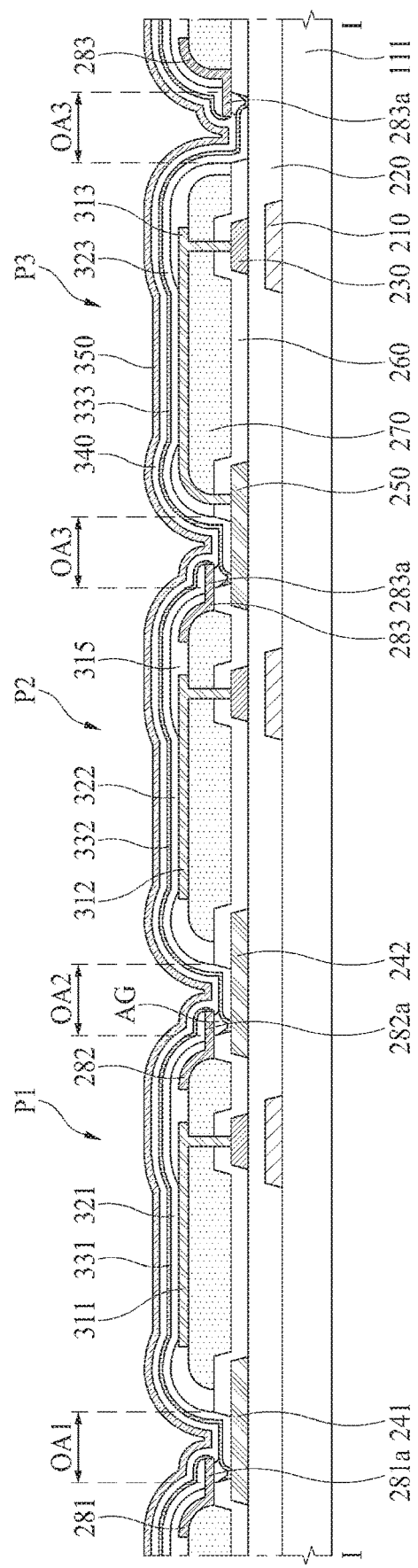

Next, the third electrode 350 is formed as shown in FIG. 31J (S3010).

In more detail, the third electrode 350 is formed on the second light emitting layer 340. The third electrode 350 can be formed by a physics vapor deposition such as sputtering. Alternatively, the third electrode 350 can be formed by evaporation.

The third electrode 350 can be formed of a transparent metal material, a semi-transmissive metal material, or a metal material with high reflexibility. If the display device 100 is formed in a bottom emission type, the third electrode 350 can be formed of a metal material with high reflexibility such as a deposited structure (Ti/Al/Ti) of Al and Ti, a deposited structure (ITO/Al/ITO) of Al and ITO, an Ag alloy, and a deposited structure (ITO/Ag alloy/ITO) of Ag alloy and ITO. The Ag alloy can be an alloy of Ag, Pd and Cu. If the display device 100 is formed in a top emission type, the third electrode 350 can be formed of a transparent conductive material (TCO) such as ITO and IZO, which can transmit light, or a semi-transmissive conductive material such as Mg, Ag, or an alloy of Mg and Ag. The third electrode 350 can be a cathode electrode.

Figure 32:
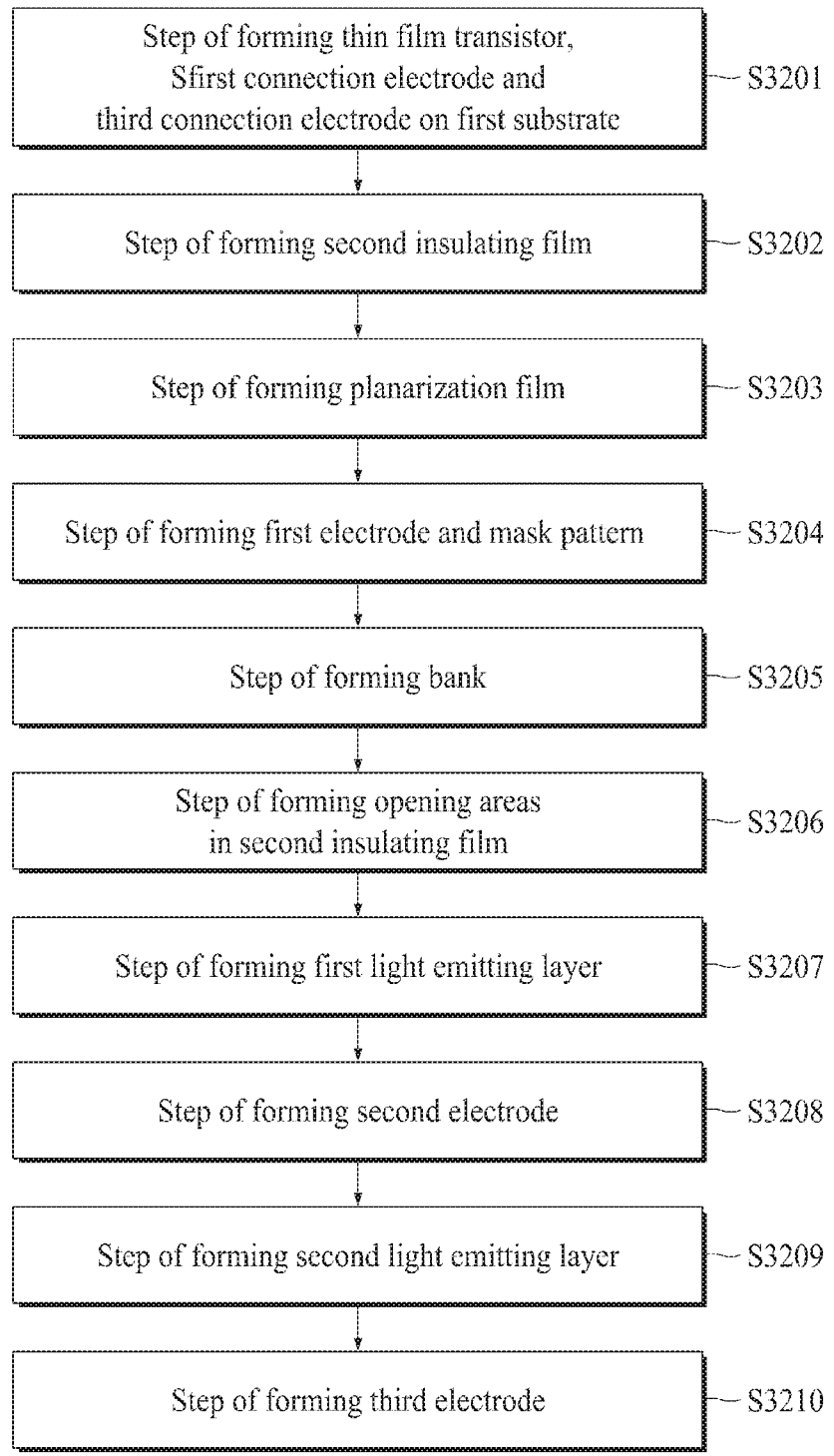
FIG. 32 is a flow chart illustrating a method for manufacturing a display device according to the third embodiment of the present disclosure.

FIG. 32 is a flow chart illustrating a method for manufacturing a display device according to the third embodiment of the present disclosure, and FIGS. 33A to 33J are cross-sectional views illustrating a method for manufacturing a display device according to the third embodiment of the present disclosure.

Figure 33A:
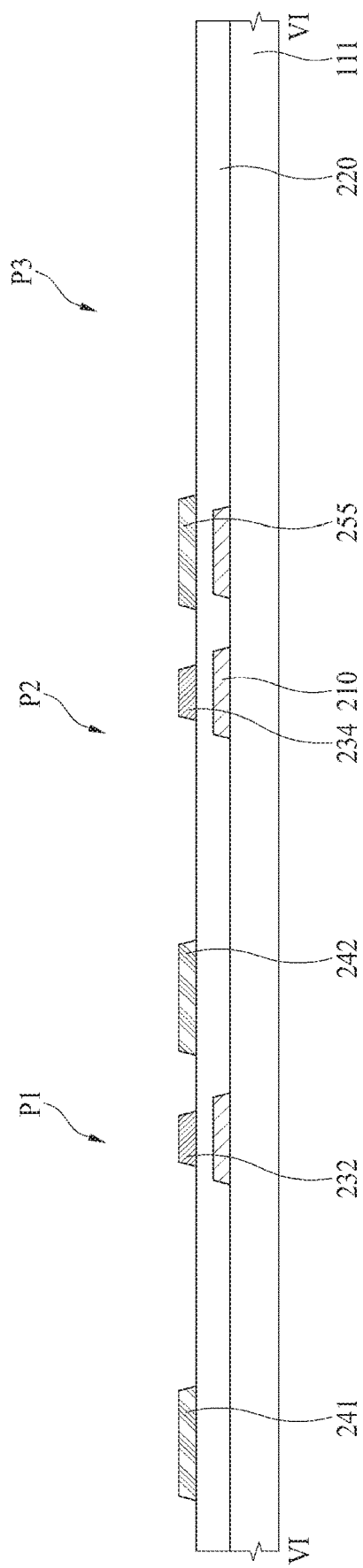
FIGS. 33A to 33J are cross-sectional views illustrating a method for manufacturing a display device according to the third embodiment of the present disclosure.

First of all, as shown in FIG. 33A, the first to third driving transistors 230, the first connection electrodes 241, 242 and 360 and the third connection electrode 255 are formed on the first substrate 111 (S3201).

In more detail, the light-shielding layer 210 is formed on the first substrate 111. The light-shielding layer 210 is to shield external light entering the active layer of the first to third driving transistors 230 respectively corresponding to the first to third subpixels P1, P2 and P3, and is formed in a position corresponding to the active layer of the first to third driving transistors 230. The light-shielding layer 210 can be formed of a metal material. If the light-shielding layer 210 is formed of a metal material, the auxiliary power line 360 can be formed of the same material as that of the light-shielding layer 210 on the same layer as the light-shielding layer 210 on the first substrate 111.

Then, the first insulating film 220 is formed on the light-shield layer 210. The first insulating film 220 can be formed of an inorganic film, for example, a silicon oxide (SiOx) film, a silicon nitride (SiNx) film or a multi-layered film of the silicon oxide film and the silicon nitride film.

Then, the first to third driving transistors 230, the first power line 241, the second power line 242 and the third connection electrode 255 are formed on the first insulating film 220.

The active layer is formed on the first insulating film 220. The active layer can be formed of a silicon based semiconductor material or an oxide based semiconductor material.

The gate insulating film can be formed on the active layer. The gate insulating film can be formed of an inorganic film, for example, a silicon oxide film, a silicon nitride film or a multi-layered film of the silicon oxide film and the silicon nitride film.

The gate electrode can be formed on the gate insulating film. The gate electrode can be, but not limited to, a single layer or multi-layer comprised of any one of Mo, Al, Cr, Au, Ti, Ni, Nd and Cu or their alloy.

The inter-layer dielectric film can be formed on the gate electrode. The inter-layer dielectric film can be formed of an inorganic film, for example, a silicon oxide film, a silicon nitride film, or a multi-layered film of the silicon oxide film and the silicon nitride film.

The source electrode and the drain electrode can be formed on the inter-layer dielectric film. Each of the source electrode and the drain electrode can be connected to the active layer through the contact hole that passes through the gate insulating film and the inter-layer dielectric film. Each of the source electrode and the drain electrode can be, but not limited to, a single layer or multi-layer comprised of any one of Mo, Al, Cr, Au, Ti, Ni, Nd and Cu or their alloy.

Meanwhile, the first power line 241 and the second power line 242 can be formed of the same material as that of the source electrode and the drain electrode on the same layer as the source electrode and the drain electrode.

Also, the third connection electrode 255 can be a source electrode or a drain electrode of the third driving transistor 230.

Figure 33B:
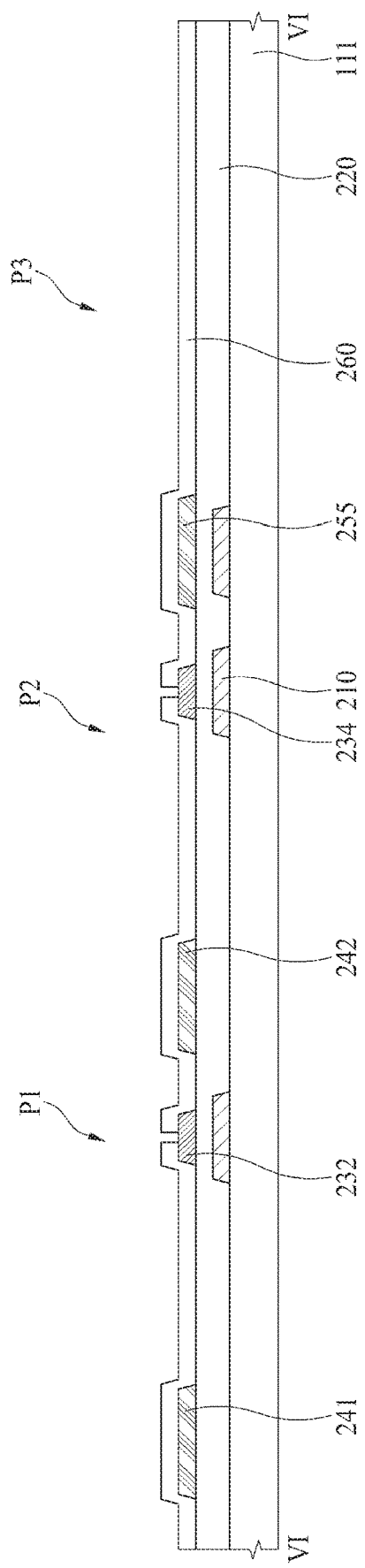

Next, the second insulating film 260 is formed as shown in FIG. 33B (S3202).

In more detail, the second insulating film 260 is formed on the first to third driving transistors 230, the first connection electrodes 241, 242 and 360, and the third connection electrode 255

Although the contact hole which partially exposes the source electrode or the drain electrode of the first and second driving transistors 230 can be formed in the second insulating film 260, formation of the contact hole is not limited to this case. The contact hole can be formed through a later process.

The second insulating film 260 can be formed of an inorganic film, for example, a silicon oxide film, a silicon nitride film or a multi-layered film of the silicon oxide film and the silicon nitride film.

Figure 33C:
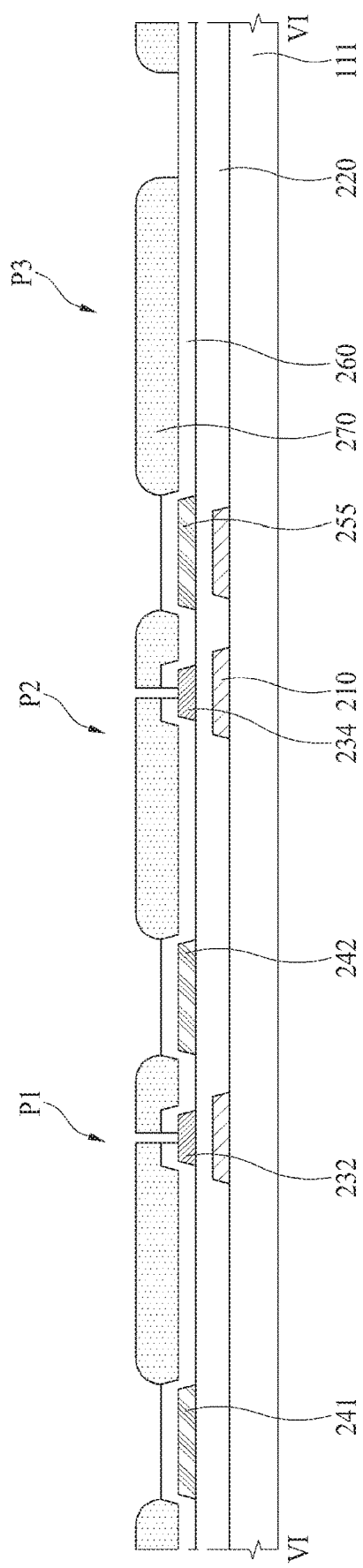

Next, the planarization film 270 is formed as shown in FIG. 33C (S3203).

In more detail, the planarization film 270 is formed on the second insulating film 260. The planarization film 270 planarizes the step difference due to the first to third driving transistors 230. The planarization film 270 can be patterned to partially expose the second insulating film 260 arranged in the area where the first power line 241, the second power line 242 and the third connection electrode 255 are formed.

Although the contact hole which partially exposes the source electrode or the drain electrode of the first and second driving transistors 230 can be formed in the planarization film 270, formation of the contact hole is not limited to this case. The contact hole can be formed through a later process.

The planarization film 270 can be formed of an organic film such as acrylic resin, epoxy resin, phenolic resin, polyamide resin, and polyimide resin.

Figure 33D:
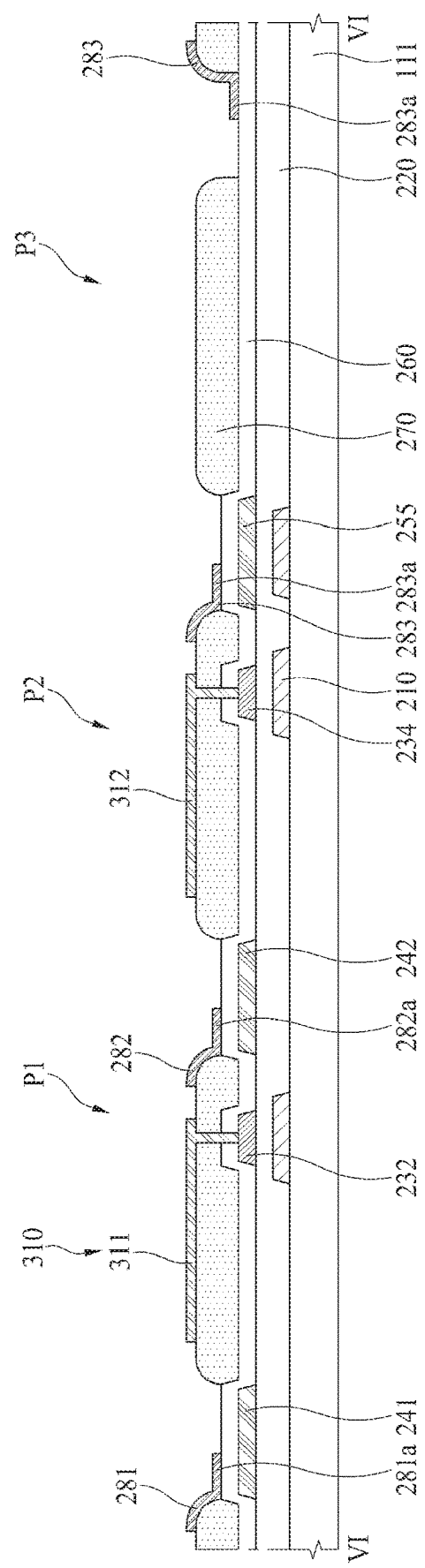

Next, the first electrodes 311 and 312 and the mask patterns 281, 282 and 283 are formed as shown in FIG. 33D (S3204).

In more detail, the first electrodes 311 and 312 are formed on the planarization film 270 for each of the first subpixel P1 and the second subpixel P2. The first electrodes 311 and 312 are connected to the source electrode or the drain electrode of the first and second driving transistors 230 through the contact hole.

The first electrodes 311 and 312 can be formed of a transparent metal material, a semi-transmissive metal material, or a metal material with high reflexibility. If the display device 100 is formed in a bottom emission type, the first electrodes 311 and 312 can be formed of a transparent conductive material (TCO) such as ITO and IZO, which can transmit light, or a semi-transmissive conductive material such as Mg, Ag, or an alloy of Mg and Ag. If the display device 100 is formed in a top emission type, the first electrodes 311 and 312 can be formed of a metal material with high reflexibility such as a deposited structure (Ti/Al/Ti) of Al and Ti, a deposited structure (ITO/Al/ITO) of Al and ITO, an Ag alloy, and a deposited structure (ITO/Ag alloy/ITO) of Ag alloy and ITO. The Ag alloy can be an alloy of Ag, Pd and Cu. The first electrodes 311 and 312 can be anode electrodes.

The mask patterns 281, 282 and 283 are formed on the planarization film 270 to be spaced apart from the first electrodes 311 and 312. The mask patterns 281, 282 and 283 are also formed on a partial portion of the second insulating film 260 exposed without being covered by the planarization film 270.

The mask patterns 281, 282 and 283 can be formed of the same material as that of the first electrodes 311 and 312 simultaneously with the first electrodes 311 and 312.

Figure 33E:
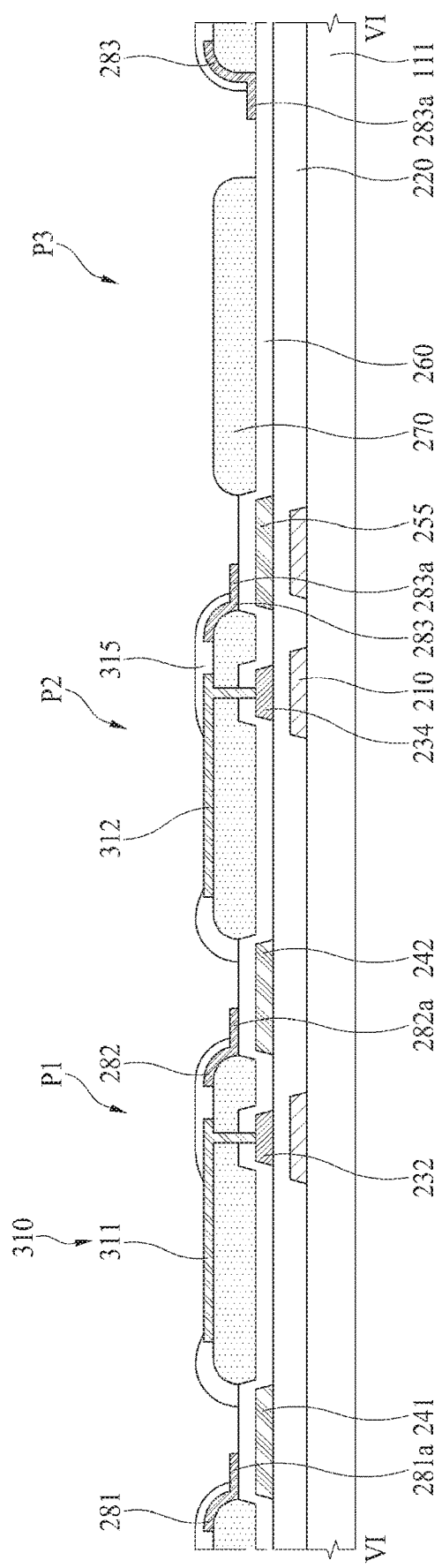

Next, the bank 315 is formed as shown in FIG. 33E (S3205).

In more detail, the bank 315 is formed to cover ends of each of the first electrodes 311 and 312. The bank 315 can be patterned to expose a partial portion of the second insulating film 260 and the mask patterns 281, 282 and 283, which are arranged in the area where the first power line 241, the second power line 242 and the third connection electrode 255 are formed.

Figure 33F:
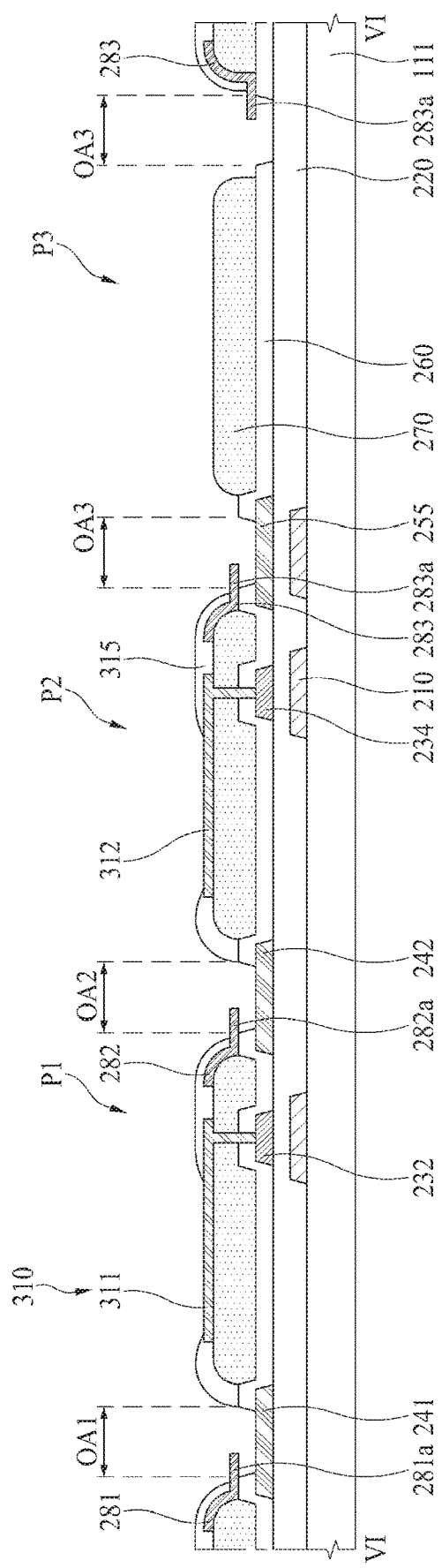

Next, the opening areas OA1, OA2 and OA3 are formed in the second insulating film 260 as shown in FIG. 33F (S3206).

In more detail, the opening area OA1, OA2 and OA3 are formed in the second insulating film 260 by an etching process. At this time, the etching process can be a wet etching process, and an etching solution which can etch the second insulating film 260 but cannot etch the mask patterns 281, 282 and 283 can be applied to the etching process. Therefore, an undercut structure can be formed in which the mask patterns 281, 282 and 283 are not etched and the exposed second insulating film 260 is only etched.

The first opening area OA1 for partially exposing the first power line 241, the second opening area OA2 for partially exposing the second power line 242, and the third opening area OA3 for partially exposing the third connection electrode 255 can be formed in the second insulating film 260 through the etching process.

Figure 33G:
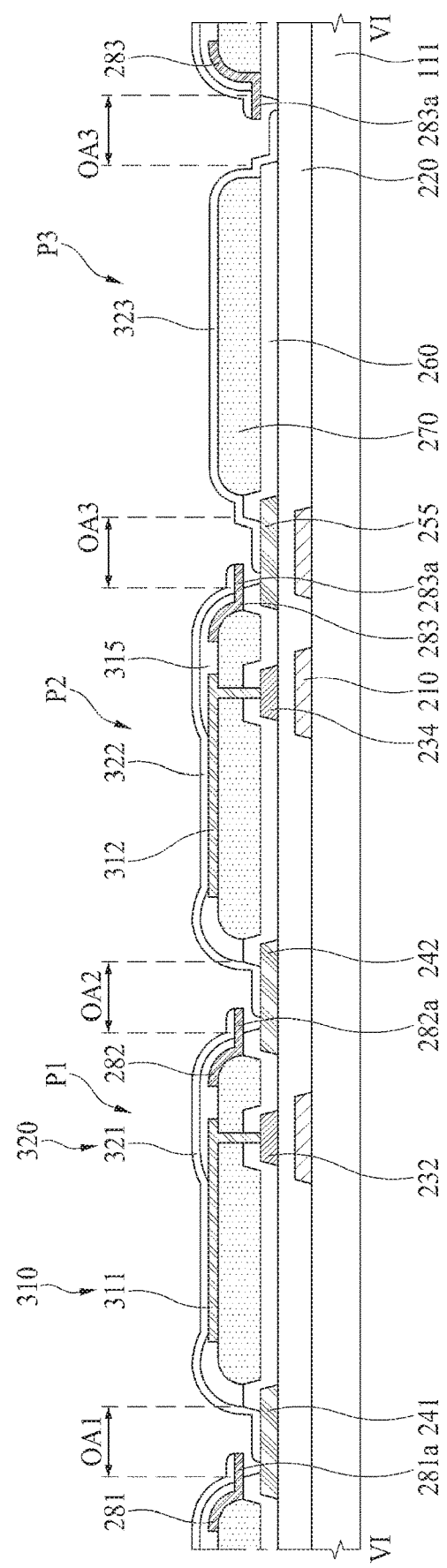

Next, the first light emitting layers 321, 322 and 323 are formed as shown in FIG. 33G (S3207).

In more detail, the first light emitting layers 321, 322 and 323 are formed on the first electrodes 311, 312 and 313 and the mask patterns 281, 282 and 283. The first light emitting layers 321, 322 and 323 can be formed by a deposition process or a solution process. If the first light emitting layers 321, 322 and 323 are formed by the deposition process, the first light emitting layers 321, 322 and 323 can be formed using an evaporation method.

The first light emitting layers 321, 322 and 323 are disconnected among the first subpixel P1, the second subpixel P2 and the third subpixel P3 by the mask patterns 281, 282 and 283. The first light emitting layers 321, 322 and 323 can be disconnected on the mask patterns 281, 282 and 283. Also, the first light emitting layers 321, 322 and 323 can enter a space formed below the mask patterns 281, 282 and 283 and then can be formed below the mask patterns 281, 282 and 283.

Each of the first light emitting layers 321, 322 and 323 can be any one of, but not limited to, a red light emitting layer for emitting red light, a green light emitting layer for emitting green light, a blue light emitting layer for emitting blue light, and a yellow light emitting layer for emitting yellow light.

Figure 33H:
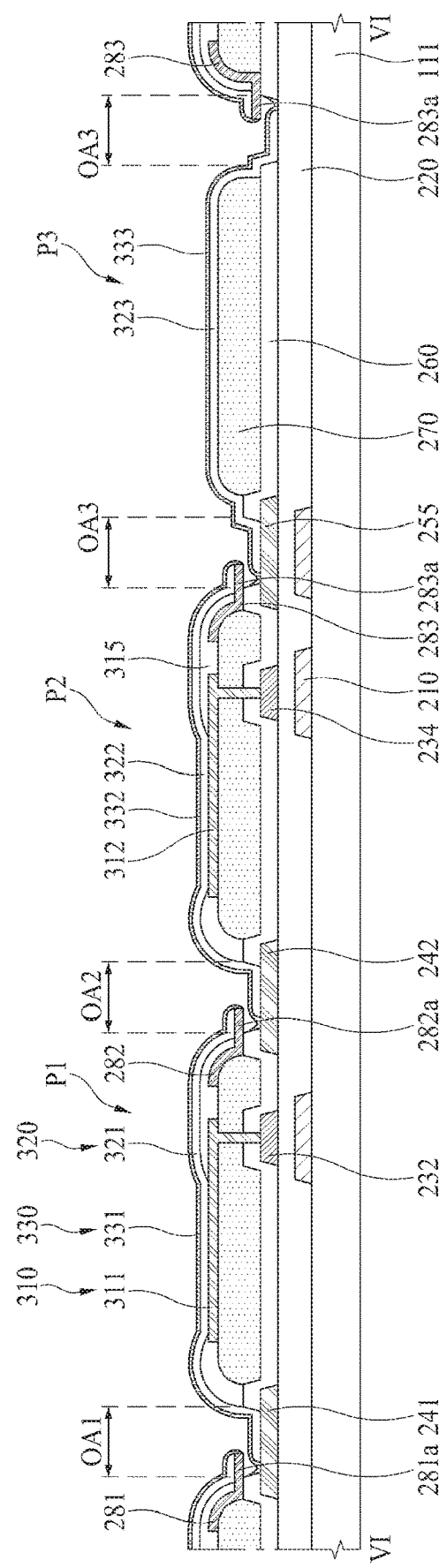

Next, the second electrodes 331, 332 and 333 are formed as shown in FIG. 33H (S3208).

In more detail, the second electrodes 331, 332 and 333 are formed on the first light emitting layers 321, 322 and 323. The second electrodes 331, 332 and 333 are disconnected among the first subpixel P1, the second subpixel P2 and the third subpixel P3 by the mask patterns 281, 282 and 283. The second electrodes 331, 332 and 333 can be disconnected on the mask patterns 281, 282 and 283. Also, the second electrodes 331, 332 and 333 can enter a space formed below the mask patterns 281, 282 and 283 and then can be formed below the mask patterns 281, 282 and 283.

The second electrodes 331, 332 and 333 can be formed using a physics vapor deposition such as sputtering. A film formed by the physics vapor deposition such as sputtering has excellent step coverage characteristics. Therefore, the second electrodes 331, 332 and 333 can be formed at an area wider than the first light emitting layers 321, 322 and 333 formed using evaporation. As a result, the second electrodes 331, 332 and 333 can be connected to any one of the first power line 241, the second power line 242 and third connection electrode 255 below the mask patterns 281, 282 and 283.

The second electrodes 331, 332 and 333 can be formed of a transparent conductive material (TCO) such as ITO and IZO, which can transmit light, or a semi-transmissive conductive material such as Mg, Ag, or an alloy of Mg and Ag.

Figure 33I:
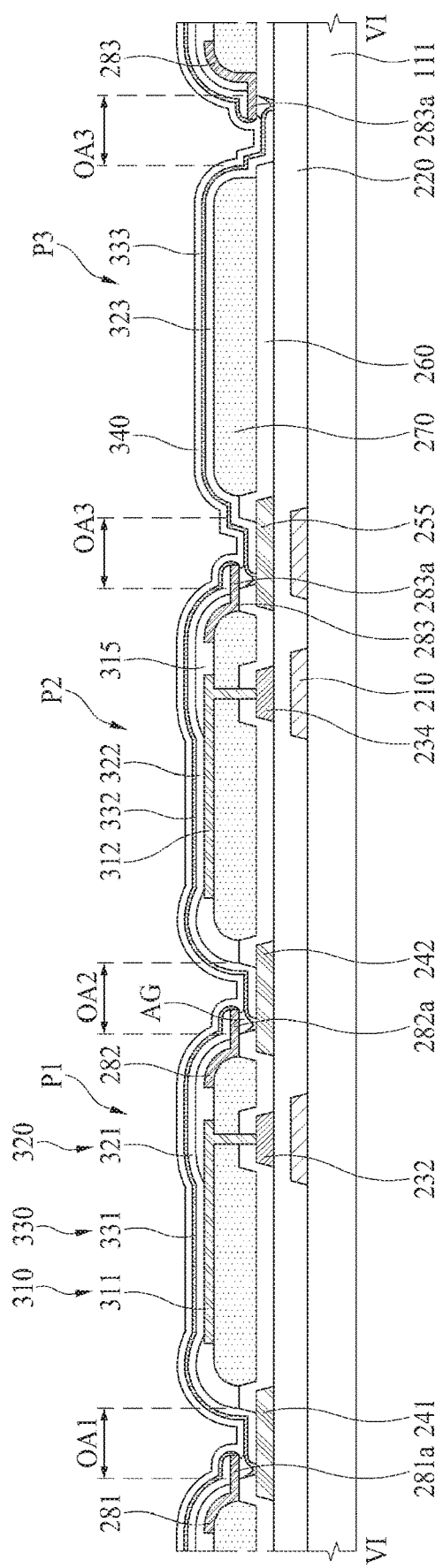

Next, the second light emitting layer 340 is formed as shown in FIG. 33I (S3209).

In more detail, the second light emitting layer 340 is formed on the second electrodes 331, 332 and 333. The second light emitting layer 340 can be formed by a deposition process or a solution process. If the second light emitting layer 340 is formed by the deposition process, the second light emitting layer 340 can be formed using an evaporation method.

The second light emitting layer 340 is connected among the first subpixel P1, the second subpixel P2 and the third subpixel P3. The second light emitting layer 340 can be formed to partially fill the space between the mask patterns 281, 282 and 283 and the second electrodes 331, 332 and 333. At this time, an air gap AG can be formed in a space where the second light emitting layer 340 is not filled between the mask patterns 281, 282 and 283 and the second electrodes 331, 332 and 333.

The second light emitting layer 340 can be any one of, but not limited to, a red light emitting layer for emitting red light, a green light emitting layer for emitting green light, a blue light emitting layer for emitting blue light, and a yellow light emitting layer for emitting yellow light.

However, the second light emitting layer 340 can emit light of a color different from that of the first light emitting layers 321, 322 and 323. If the first light emitting layers 321, 322 and 323 are light emitting layers for emitting light of a first color, the second light emitting layer 340 can be a light emitting layer for emitting light of a second color different from the first color. For example, the first light emitting layers 321, 322 and 323 can be yellow light emitting layers for emitting yellow light, and the second light emitting layer 340 can be a blue light emitting layer for emitting blue light.

Figure 33J:
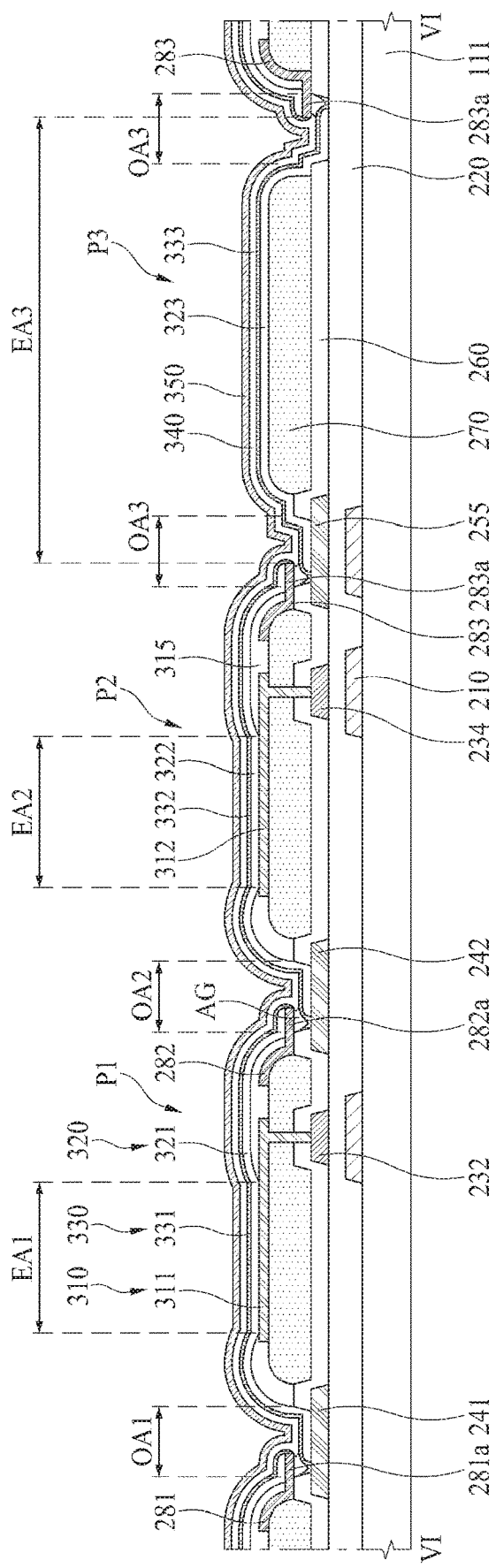

Next, the third electrode 350 is formed as shown in FIG. 33J (S3210).

In more detail, the third electrode 350 is formed on the second light emitting layer 340. The third electrode 350 can be formed by a physics vapor deposition such as sputtering. Alternatively, the third electrode 350 can be formed by evaporation.

The third electrode 350 can be formed of a transparent metal material, a semi-transmissive metal material, or a metal material with high reflexibility. If the display device 100 is formed in a bottom emission type, the third electrode 350 can be formed of a metal material with high reflexibility such as a deposited structure (Ti/Al/Ti) of Al and Ti, a deposited structure (ITO/Al/ITO) of Al and ITO, an Ag alloy, and a deposited structure (ITO/Ag alloy/ITO) of Ag alloy and ITO. The Ag alloy can be an alloy of Ag, Pd and Cu. If the display device 100 is formed in a top emission type, the third electrode 350 can be formed of a transparent conductive material (TCO) such as ITO and IZO, which can transmit light, or a semi-transmissive conductive material such as Mg, Ag, or an alloy of Mg and Ag. The third electrode 350 can be a cathode electrode.

Figure 34A:
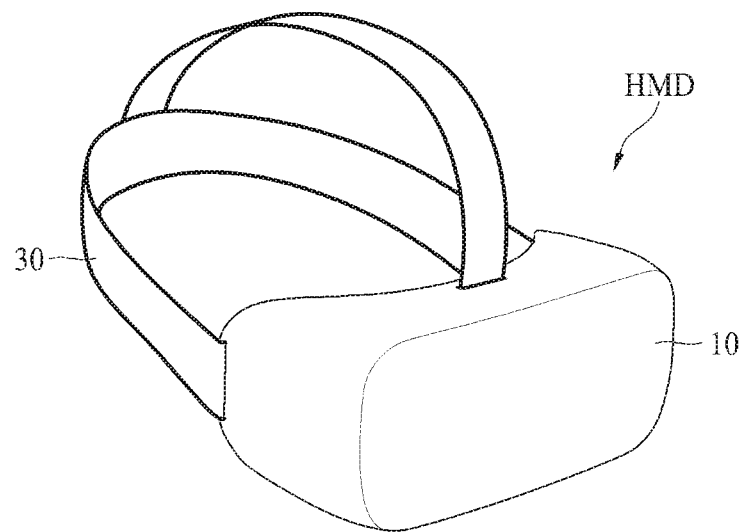
FIGS. 34A to 34C are views illustrating a display device according to another embodiment of the present disclosure, and relate to a head-mounted display (HMD) device.
Figure 34B:
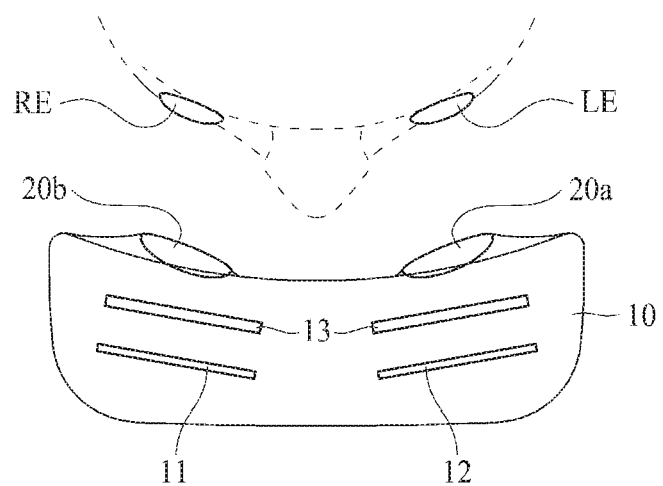
Figure 34C:
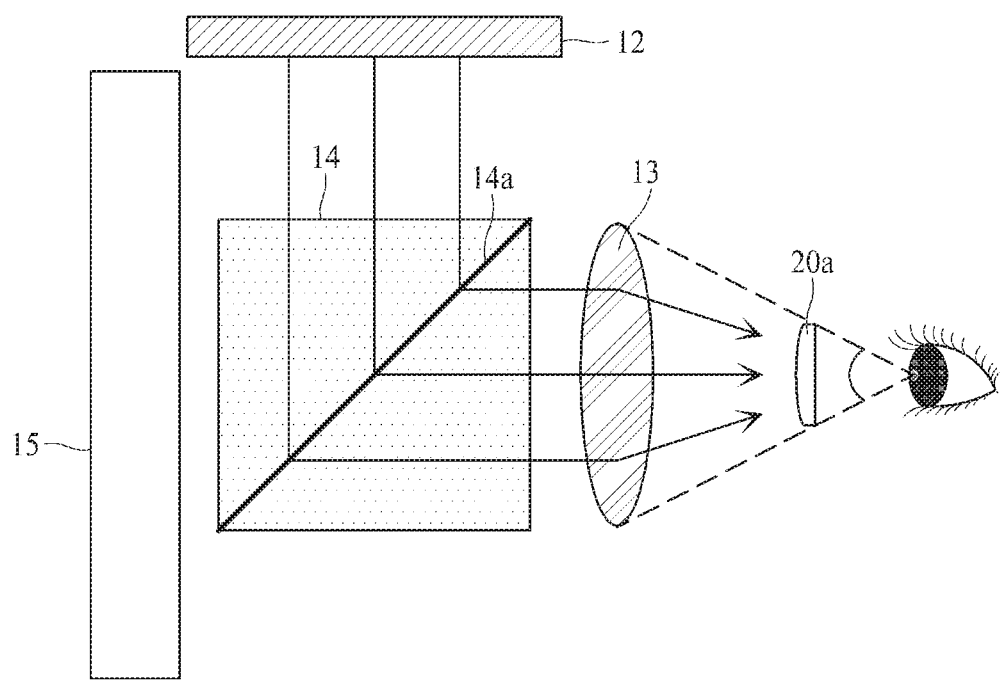

FIGS. 34A to 34C are views illustrating a display device according to another embodiment of the present disclosure, and relate to a head-mounted display (HMD) device. FIG. 34A is brief perspective view, FIG. 34B is a brief plane view of a virtual reality (VR) structure, and FIG. 34C is a brief cross-sectional view of an augmented reality (AR) structure. All the components of the HMD device and the VR structure according to all embodiments of the present disclosure are operatively coupled and configured.

Referring to FIG. 34A, a head mounted display device according to the present disclosure comprises a storage case 10, and a head mounted band 30.

The storage case 10 stores the display device, a lens array and an ocular lens therein.

The head mounted band 30 is fixed to the storage case 10. The head mounted band 30 is formed to surround a top surface and both sides of a user's head, but is not limited to this example. The head mounted band 30 is to fix a head mounted display to a user's head and can be replaced with a structure formed in a shape of a glasses frame or a helmet shape.

Referring to FIG. 34B, a head mounted display device of a virtual reality (VR) structure according to the present disclosure includes a left eye display device 12, a right eye display device 11, a lens array 13, a left eye ocular lens 20a, and a right eye ocular lens 20b.

The left eye display device 12, the right eye display device 11, the lens array 13, the left eye ocular lens 20a, and the right eye ocular lens 20b are stored in the aforementioned storage case 10.

The left eye display device 12 and the right eye display device 11 can display the same image, and in this case, a user can view 2D image. Alternatively, the left eye display device 12 can display a left eye image and the right eye display device 11 can display a right eye image, and in this case, a user can view a 3D image. Each of the left eye display device 12 and the right eye display device 11 can be comprised of a display device according to FIGS. 1 to 29 described above. At this time, a top portion corresponding to a surface where an image is displayed in FIGS. 1 to 29, for example, a color filter layer faces the lens array 13.

The lens array 13 can be provided between the left eye ocular lens 20a and the left eye display device 12 by being spaced apart from each of the left eye ocular lens 20a and the left eye display device 12. That is, the lens array 13 can be arranged in front of the left eye ocular lens 20a and behind the left eye display device 12. Also, the lens array 13 can be provided between the right eye ocular lens 20b and the right eye display device 11 by being spaced apparat from each of the right eye ocular lens 20b and the right eye display device 11. That is, the lens array 13 can be arranged in front of the right eye ocular lens 20b and behind the right eye display device 11.

The lens array 13 can be a micro lens array. The lens array 13 can be replaced with a pin hole array. Due to the lens array 13, images displayed on the left eye display device 12 or the right eye display device 11 can be viewed to be magnified to a user.

A left eye LE of a user can be arranged in the left eye ocular lens 20a, and a right eye RE of a user can be arranged in the right eye ocular lens 20b.

Referring to FIG. 34C, a head mounted display device of an AR structure according to the present disclosure includes a left eye display device 12, a lens array 13, a left eye ocular lens 20a, a transmissive reflection portion 14, and a transmissive window 15. Although only a structure for a left eye is shown in FIG. 34c for convenience, a structure for a right eye is the same as the structure for the left eye.

The left eye display device 12, the lens array 13, the left eye ocular lens 20a, the transmissive reflection portion 14, and the transmissive window 15 are stored in the aforementioned storage case 10.

The left eye display device 12 can be arranged at one side of the transmissive reflection portion 14, for example, at an upper side, without covering the transmissive window 15. Therefore, the left eye display device 12 can provide the transmissive reflection portion 14 with an image without covering an outer background viewed through the transmissive window 15.

The left eye display device 12 can be comprised of the display device according to FIGS. 1 to 29 described above. In this case, the top portion corresponding to the surface where an image is displayed in FIGS. 1 to 29, for example, a color filter faces the transmissive reflection portion 14.

The lens array 13 can be provided between the left eye ocular lens 20a and the transmissive reflection portion 14.

A left eye of a user is arranged in the left eye ocular lens 20a.

The transmissive reflection portion 14 is arranged between the lens array 13 and the transmissive window 15. The transmissive reflection portion 14 can include a reflective surface 14a which transmits a portion of light and reflects the other portion of light. The reflective surface 14a is formed to allow an image displayed on the left eye display device 12 to proceed to the lens array 13. Therefore, the user can view all of images displayed on the left eye display device 12 and an outer background through the transmissive window 15. That is, since the user can view one image by overlapping background in reality with virtual images, augmented reality (AR) can be embodied.

The transmissive window 15 is arranged in front of the transmissive reflection portion 14.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A display device comprising:
   a substrate including a first subpixel and a second subpixel;
   a first electrode on the substrate;
   a first light emitting layer on the first electrode, and configured to emit light of a first color;
   a second electrode on the first light emitting layer, wherein the second electrode is disconnected between the first subpixel and the second subpixel;
   a second light emitting layer on the second electrode, and configured to emit light of a second color;
   a third electrode on the second light emitting layer, wherein the third electrode is electrically connected with the second electrode of the first subpixel; and
   a first connection electrode for electrically connecting the second electrode of the first subpixel with the third electrode of the first subpixel,
   wherein the first connection electrode includes:
   a first power line connected to the second electrode of the first subpixel; and
   an auxiliary power line connected to each of the first power line and the third electrode of the first subpixel.

2. The display device of claim 1, wherein the first subpixel allows the first light emitting layer to emit light, and the second subpixel allows the second light emitting layer to emit light.

3. The display device of claim 2, wherein the second light emitting layer emits light of a blue color.

4. The display device of claim 1, wherein the first light emitting layer is disconnected between the first subpixel and the second subpixel.

5. The display device of claim 1, wherein the second light emitting layer is connected between the first subpixel and the second subpixel.

6. The display device of claim 1, wherein the third electrode is connected between the first subpixel and the second subpixel.

7. The display device of claim 1, wherein the substrate includes a display area in which the first subpixel and the second subpixel are arranged and a non-display area surrounding the display area,
   the auxiliary power line is arranged in the non-display area, and
   the first power line is arranged in the display area and connected with the second electrode of the first subpixel, and is extended from the display area to the auxiliary power line arranged in the non-display area and thus its one end is connected to the auxiliary power line.

8. The display device of claim 1, further comprising a driving transistor provided in at least one of the first subpixel and the second subpixel,
the driving transistor including an active layer, a gate electrode, a source electrode and a drain electrode,
wherein the first power line is spaced apart from one of the active layer, the gate electrode, the source electrode and the drain electrode on the same layer as any one of them.

9. The display device of claim 8, further comprising a first insulating film provided on the driving transistor and the first power line and provided with a first opening area for partially exposing the first power line,
wherein the second electrode of the first subpixel is connected to the first power line in the first opening area.

10. The display device of claim 9, further comprising a first mask pattern provided on the first insulating film and provided with a protrusion protruded to partially cover the first opening area.

11. The display device of claim 10, wherein the first mask pattern is formed of the same material as that of the first electrode simultaneously with the first electrode.

12. The display device of claim 10, wherein the first mask pattern is spaced apart from the first electrode.

13. The display device of claim 10, wherein the first mask pattern is formed in the display area along the first power line.

14. The display device of claim 10, wherein the second electrode of the first subpixel is connected to the first power line below the first mask pattern.

15. The display device of claim 1, wherein the first electrode is provided in each of the first subpixel and the second subpixel, and the second electrode of the second subpixel is electrically connected with the first electrode.

16. The display device of claim 1, further comprising a second connection electrode for electrically connecting the first electrode of the second subpixel with the second electrode of the second subpixel.

17. The display device of claim 16, wherein the second connection electrode is provided between the first subpixel and the second subpixel.

18. The display device of claim 17, further comprising a first insulating film provided on the second connection electrode and provided with a second opening area for partially exposing the second connection electrode,
wherein the second electrode of the second subpixel is connected with the second connection electrode in the second opening area, and the first electrode of the second subpixel is connected to the second connection electrode through a contact hole that passes through the first insulating film.

19. The display device of claim 18, further comprising a second mask pattern provided on the first insulating film and provided with a protrusion protruded to partially cover the second opening area,
wherein the second electrode of the second subpixel is connected to the second connection electrode below the second mask pattern.

20. The display device of claim 19, wherein the second mask pattern is formed of a same material as that of the first electrode simultaneously with the first electrode.

21. The display device of claim 19, wherein the second mask pattern is spaced apart from the first electrode.

22. The display device of claim 19, wherein the second mask pattern is formed to surround the second subpixel.

23. The display device of claim 1, wherein the first electrode is formed in only the first subpixel among the first and second subpixels.

24. The display device of claim 23, further comprising:
a first driving transistor provided in the first subpixel on the substrate; and
a second driving transistor provided in the second subpixel on the substrate,
wherein the first electrode provided in the first subpixel is connected to the first driving transistor and thus supplied with a first voltage, and the second electrode provided in the second subpixel is connected to the second driving transistor and thus supplied with a second voltage.

25. The display device of claim 23, further comprising a bank provided in only the first subpixel among the first and second subpixels and patterned to cover ends of the first electrode.

26. The display device of claim 23, further comprising a third connection electrode electrically connected with the second electrode of the second subpixel.

27. The display device of claim 26, wherein the third connection electrode is provided between the first subpixel and the second subpixel.

28. The display device of claim 26, further comprising a first insulating film provided on the third connection electrode and provided with a third opening area for partially exposing the third connection electrode, wherein the second electrode of the second subpixel is connected with the third connection electrode in the third opening area.

29. The display device of claim 28, further comprising a third mask pattern provided on the first insulating film and provided with a protrusion protruded to partially cover the third opening area, wherein the second electrode of the second subpixel is connected to the second connection electrode below the third mask pattern.

30. The display device of claim 29, wherein the third mask pattern is formed of a same material as that of the first electrode simultaneously with the first electrode.

31. The display device of claim 29, wherein the third mask pattern is formed to surround the second subpixel.

32. The display device of claim 26, wherein the first subpixel and the second subpixel have their respective light emitting areas different from each other.

33. The display device of claim 26, wherein the second subpixel has a light emitting area greater than that of the first subpixel.

* * * * *